United States Patent
Iwasaki et al.

(10) Patent No.: US 10,276,244 B2
(45) Date of Patent: *Apr. 30, 2019

(54) MEMORY SYSTEM

(71) Applicant: Toshiba Memory Corporation, Minato-ku (JP)

(72) Inventors: Kiyotaka Iwasaki, Yokohama (JP); Yoshihisa Kojima, Kawasaki (JP); Masanobu Shirakawa, Chigasaki (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/896,629

(22) Filed: Feb. 14, 2018

(65) Prior Publication Data

US 2018/0268908 A1 Sep. 20, 2018

(30) Foreign Application Priority Data

Mar. 15, 2017 (JP) ................. 2017-050316

(51) Int. Cl.
| | | |
|---|---|---|
| G11C 16/10 | (2006.01) | |
| G11C 11/56 | (2006.01) | |
| G11C 7/06 | (2006.01) | |
| G11C 16/34 | (2006.01) | |
| G11C 7/10 | (2006.01) | |
| G11C 16/04 | (2006.01) | |
| G11C 16/32 | (2006.01) | |
| G11C 29/04 | (2006.01) | |

(52) U.S. Cl.
CPC ................ G11C 16/10 (2013.01); G11C 7/06 (2013.01); G11C 7/1087 (2013.01); G11C 11/5628 (2013.01); G11C 11/5642 (2013.01); G11C 16/0483 (2013.01); G11C 16/32 (2013.01); G11C 16/34 (2013.01); *G11C 2029/0411* (2013.01)

(58) Field of Classification Search
CPC ................................ G11C 16/10; G11C 16/32
See application file for complete search history.

(56) References Cited

U.S. PATENT DOCUMENTS

| | | | |
|---|---|---|---|
| 7,961,512 B2 | 6/2011 | Li et al. | |
| 2005/0157560 A1* | 7/2005 | Hosono | G11C 16/10 365/185.22 |
| 2007/0171721 A1* | 7/2007 | Shibata | G11C 11/5628 365/185.17 |

(Continued)

FOREIGN PATENT DOCUMENTS

| | | |
|---|---|---|
| JP | 2006-351146 | 12/2006 |
| JP | 4447636 | 4/2010 |

*Primary Examiner* — Hoai V Ho
*Assistant Examiner* — Jay Radke
(74) *Attorney, Agent, or Firm* — Oblon, McClelland, Maier & Neustadt, L.L.P.

(57) ABSTRACT

According to one embodiment, a memory system includes a storage medium including a first cell transistor, a first data latch, and a second data latch; and a first controller. The first controller is configured to instruct to the storage medium to, after instructing the storage medium to write data into the first cell transistor and before completion of the writing of the data into the first cell transistor, suspend a process being performed to the first cell transistor, read data from the first data latch, read data from the second data latch, and read data from the first cell transistor.

17 Claims, 41 Drawing Sheets

(56) References Cited

U.S. PATENT DOCUMENTS

| | | | |
|---|---|---|---|
| 2011/0055453 A1* | 3/2011 | Bennett | G11C 16/10 711/103 |
| 2016/0035428 A1* | 2/2016 | Jung | G11C 16/16 365/185.11 |
| 2016/0329082 A1* | 11/2016 | Chun | G11C 16/10 |
| 2017/0221569 A1* | 8/2017 | Akamine | G11C 16/26 |
| 2018/0197610 A1* | 7/2018 | Lee | G11C 16/10 |

* cited by examiner

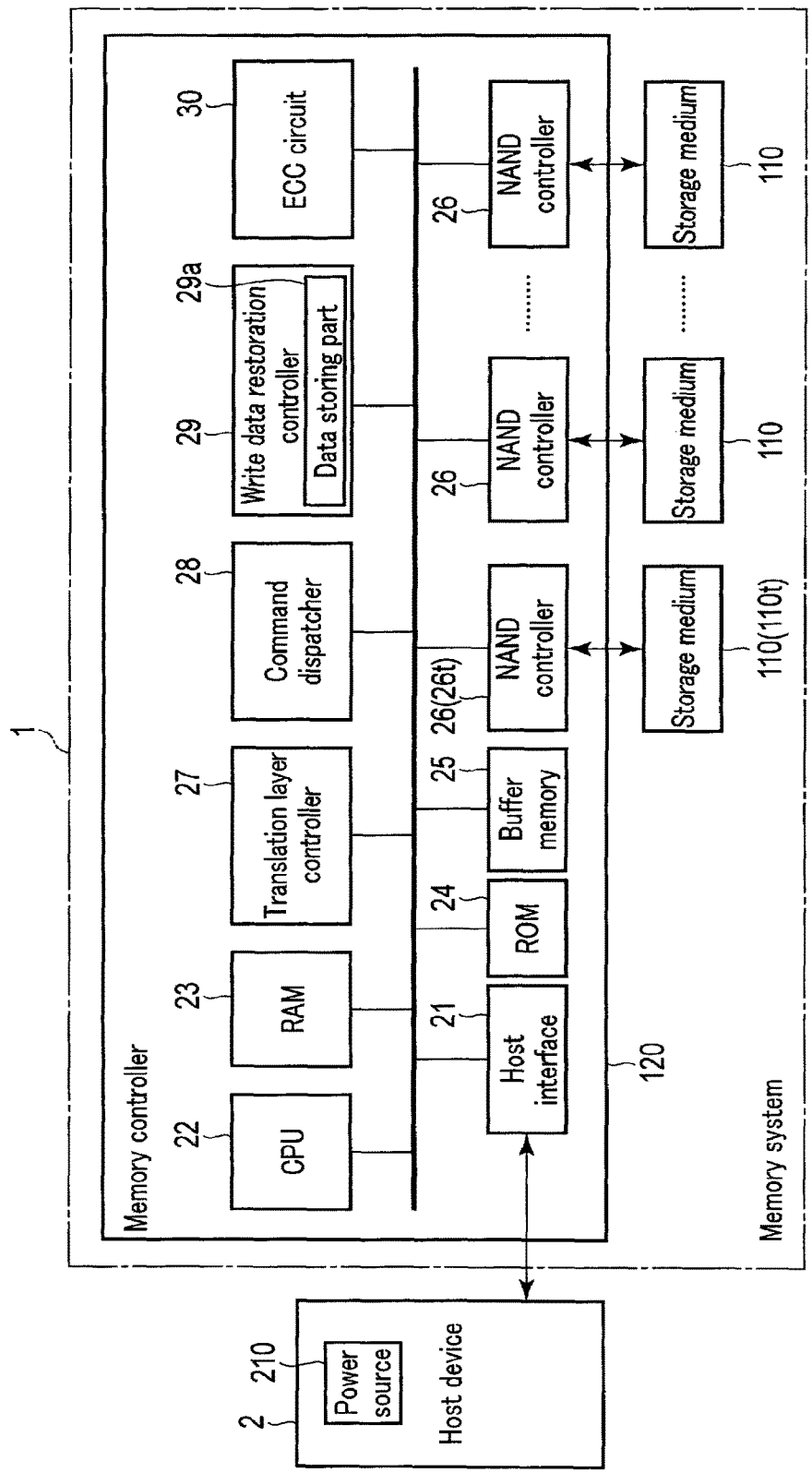
F I G. 1

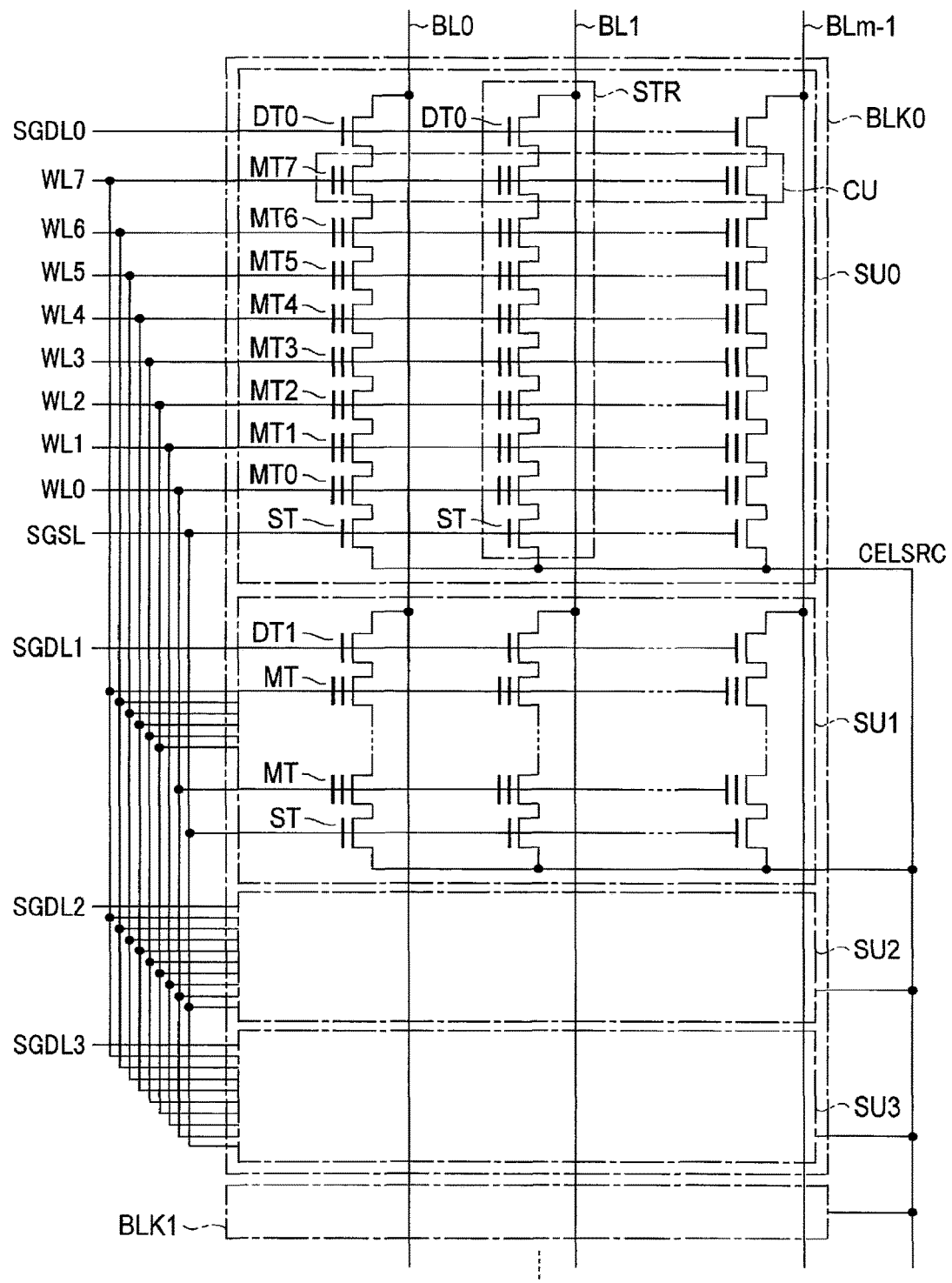
F I G. 3

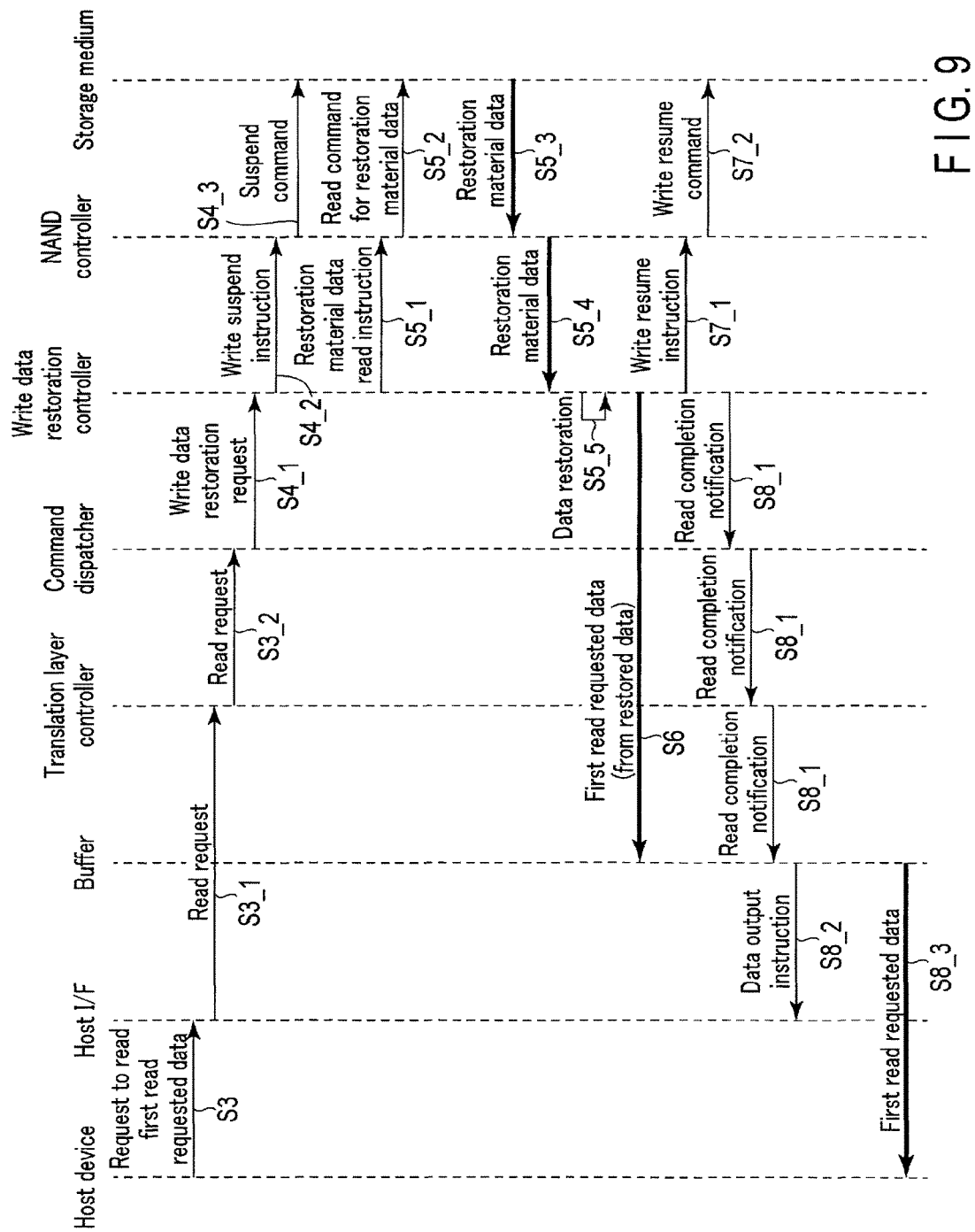
F I G. 9

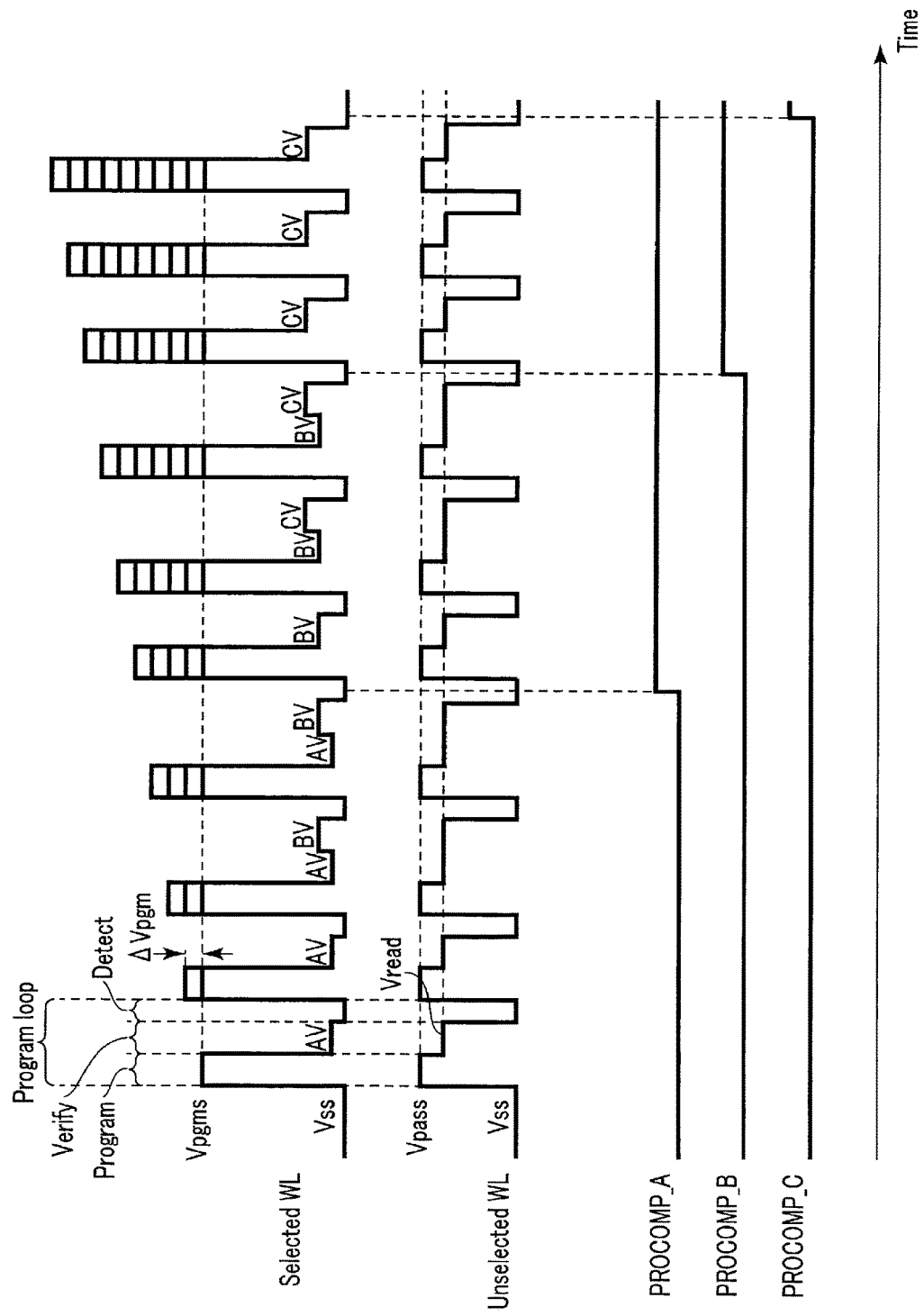
F I G. 11

(a)

| Target state | Er | A | B | C |
|---|---|---|---|---|
| UDL | 1 | 1 | 0 | 0 |
| LDL | – | – | – | – |
| SA | – | – | – | – |

Lower page write data input (b)

| Target state | Er | A | B | C |
|---|---|---|---|---|
| UDL | 1 | 1 | 0 | 0 |
| LDL | 1 | 0 | 0 | 1 |
| SA | – | – | – | – |

Upper page write data input (c)

| Target state | Er | A | B | C |
|---|---|---|---|---|
| UDL | 1 | 1 | 0 | 0 |
| LDL | 1 | 0 | 0 | 1 |
| SA | 1 | 0 | 0 | 0 |

Program inhibit state formed
UDL&LDL→SA (d)

| Target state | Er | A | B | C |
|---|---|---|---|---|
| UDL | 1 | 1 | 0 | 0 |
| LDL | 1 | 1/0 | 0 | 1 |
| SA | 1 | 1/0 | 1/0 | 1/0 |

Verification for A-state
(SA&UDL) | LDL→LDL (e)

| Target state | Er | A | B | C |
|---|---|---|---|---|
| UDL | 1 | 1 | 0 | 0 |
| LDL | 1 | 1 | 0 | 1 |
| SA | – | – | – | – |

A-state verification completed
Sets bits targeted to A-state to 1 in LDL

F I G. 12

(a)

| Target state | Er | A | B | C |
|---|---|---|---|---|
| UDL | 1 | 1 | 1/0 | 0 |
| LDL | 1 | 1 | 1/0 | 1 |
| SA | 1 | 1 | 1/0 | 1/0 |

Verification for B-state
(SA&¬LDL) | UDL→UDL
(SA&¬UDL) | LDL→LDL (b)

| Target state | Er | A | B | C |
|---|---|---|---|---|
| UDL | 1 | 1 | 1 | 0 |
| LDL | 1 | 1 | 1 | 1 |
| SA | - | - | - | - |

B-state verification completed
Sets bits targeted to B-state to 0 in LDL
Sets bits targeted to B-state to 0 in UDL (c)

| Target state | Er | A | B | C |
|---|---|---|---|---|
| UDL | 1 | 1 | 1 | 1/0 |
| LDL | 1 | 1 | 1 | 1 |
| SA | 1 | 1 | 1 | 1/0 |

Verification for C-state
SA | UDL→UDL (d)

| Target state | Er | A | B | C |
|---|---|---|---|---|
| UDL | 1 | 1 | 1 | 1 |
| LDL | 1 | 1 | 1 | 1 |
| SA | - | - | - | - |

C-state verification completed
Sets bits targeted to C-state to 0 in UDL

F I G. 13

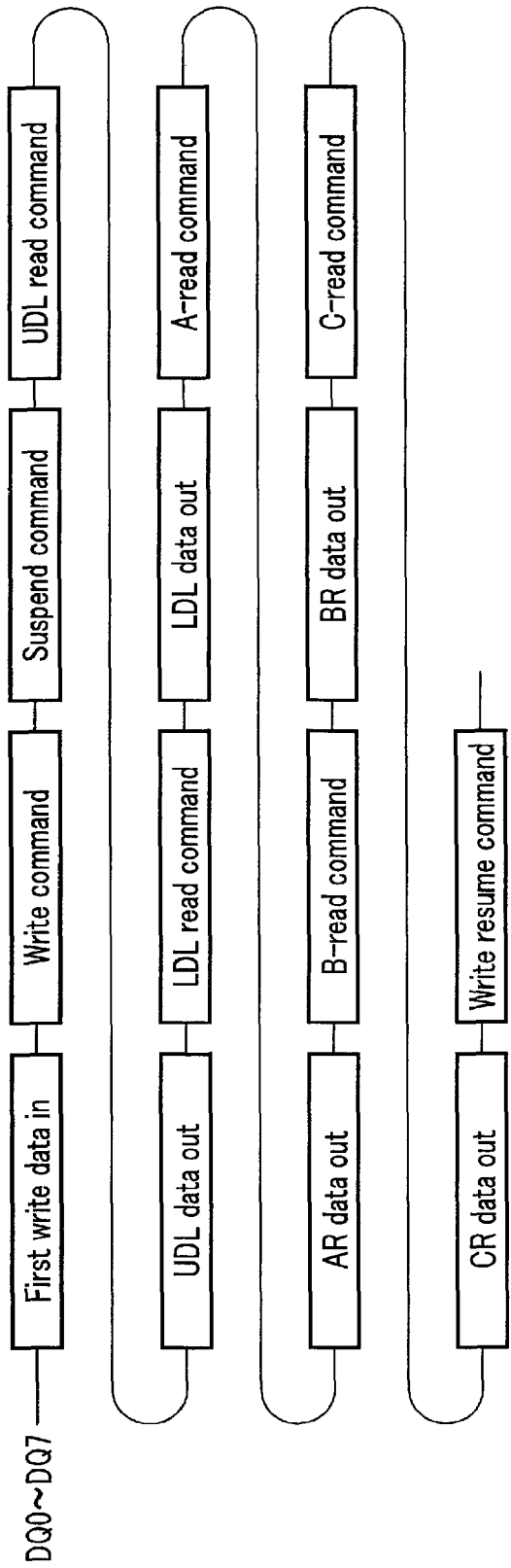
F I G. 15

Substep SS4

Stores BR data in DL3

(a)

| Target state | Er | A | | B | | C | |
|---|---|---|---|---|---|---|---|
| | | Pass | Fail | Pass | Fail | Pass | Fail |
| DL0 | 1 | 1 | 1 | 1 | 0 | 1 | 0 |
| DL1 | 1 | 1 | 0 | 1 | 0 | 1 | 1 |
| DL2 | 0 | 1 | 0 | 1 | 1/0 | 1 | 1/0 |
| DL3 | 0 | 0 | 0 | 1 | 0 | 1 | 1/0 |
| DL4 | - | - | - | - | - | - | - |
| DL5 | - | - | - | - | - | - | - |
| SA | 0 | 0 | 0 | 1 | 0 | 1 | 0 |

Substep SS5

Stores CR data in DL4

(b)

| Target state | Er | A | | B | | C | |
|---|---|---|---|---|---|---|---|
| | | Pass | Fail | Pass | Fail | Pass | Fail |
| DL0 | 1 | 1 | 1 | 1 | 0 | 1 | 0 |
| DL1 | 1 | 1 | 0 | 1 | 0 | 1 | 1 |
| DL2 | 0 | 1 | 0 | 1 | 1/0 | 1 | 1/0 |
| DL3 | 0 | 0 | 0 | 1 | 0 | 1 | 1/0 |
| DL4 | 0 | 0 | 0 | 0 | 0 | 1 | 0 |
| DL5 | - | - | - | - | - | - | - |
| SA | 0 | 0 | 0 | 0 | 0 | 1 | 0 |

F I G. 17

(a)

| Target state | Er | A Pass | A Fail | B Pass | B Fail | C Pass | C Fail |
|---|---|---|---|---|---|---|---|
| DL0 | 1 | 1 | 1 | 1 | 0 | 1 | 0 |
| DL1 | 1 | 1 | 0 | 1 | 0 | 1 | 1 |
| DL2 | 0 | 1 | 0 | 1 | 1/0 | 1 | 1/0 |
| DL3 | 0 | 0 | 0 | 1 | 0 | 1 | 1/0 |
| DL4 | 0 | 0 | 0 | 0 | 0 | 1 | 0 |
| DL5 | 0 | 1 | 0 | 0 | 0 | 0 | 0 |
| SA | - | - | - | - | - | - | - |

Substep SS11

Finds associated bit strings which passed A-state verification and has threshold voltage higher than VA and lower than or equal to VB $\overline{DL0} \& DL1 \& DL2 \& \overline{DL3} \& \overline{DL4} \rightarrow DL5 \quad ...(1a)$ ▨ : Bit indicating found associated bit string (b)

| Target state | Er | A Pass | A Fail | B Pass | B Fail | C Pass | C Fail |
|---|---|---|---|---|---|---|---|
| DL0 | 1 | 1 | 1 | 1 | 0 | 1 | 0 |
| DL1 | 1 | 0 | 0 | 1 | 0 | 1 | 1 |
| DL2 | 0 | 1 | 0 | 1 | 1/0 | 1 | 1/0 |
| DL3 | 0 | 0 | 0 | 1 | 0 | 1 | 1/0 |
| DL4 | 0 | 0 | 0 | 0 | 0 | 1 | 0 |
| DL5 | 0 | 1 | 0 | 0 | 0 | 0 | 0 |
| SA | - | - | - | - | - | - | - |

Substep SS12

Sets data 1 back to data 0 in DL1 of associated bit string which has passed A-state verification $\overline{DL5 \& DL1} \rightarrow DL1 \quad ...(1b)$ Data in DL1 remain same other than strings with DL5=1

▨ : Restored bit

FIG. 18

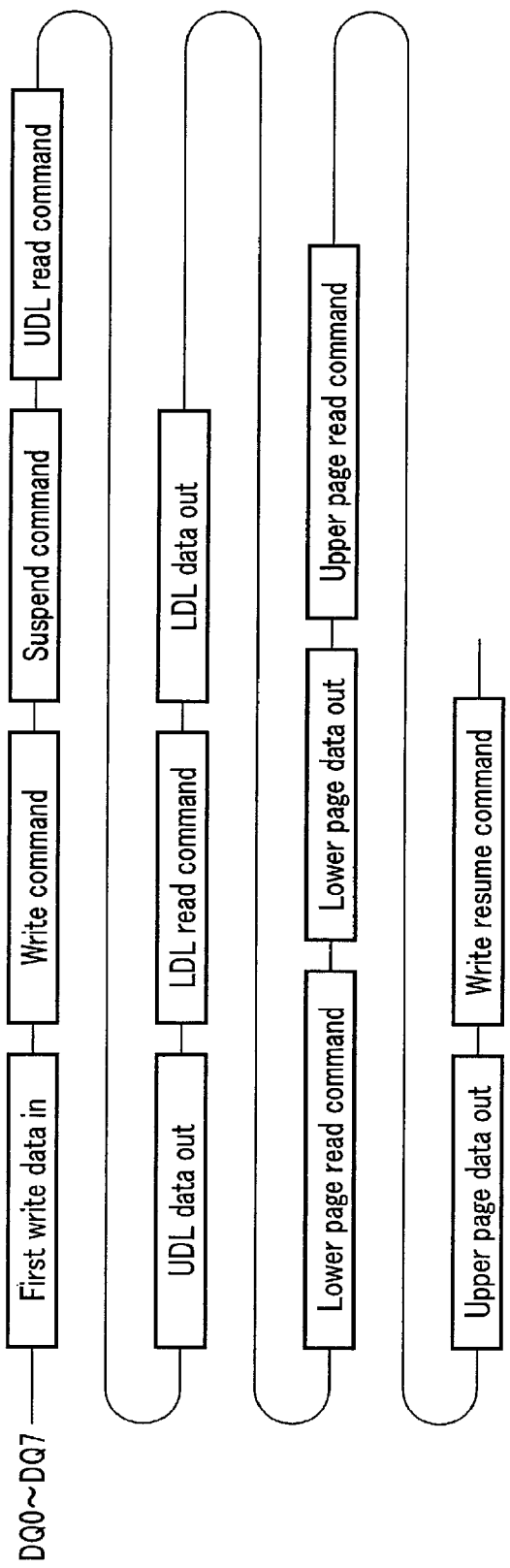
F I G. 23

(a) Substep SS21 — Reads lower page into DL2

| Target state | Er | A Pass | A Fail | B Pass | B Fail | C Pass | C Fail |
|---|---|---|---|---|---|---|---|
| DL0 | 1 | 1 | 1 | *1* | 0 | *1* | 0 |
| DL1 | 1 | *1* | 0 | *1* | 0 | 1 | 1 |
| DL2 | 1 | 1 | 1 | 0 | 1 | 0 | 1/0 |
| DL3 | – | – | – | – | – | – | – |
| DL4 | – | – | – | – | – | – | – |
| SA(VB) | 0 | 0 | 0 | 1 | 0 | 1 | 1/0 |

▨ : Changed bit

(b) Substep SS22 — Reads upper page into DL3

| Target state | Er | A Pass | A Fail | B Pass | B Fail | C Pass | C Fail |
|---|---|---|---|---|---|---|---|
| DL0 | 1 | 1 | 1 | 1 | 0 | 1 | 0 |
| DL1 | 1 | 1 | 0 | 1 | 0 | 1 | 1 |
| DL2 | 1 | 1 | 1 | 0 | 1 | 0 | 1/0 |
| DL3 | 1 | 0 | 1 | 0 | 1/0 | 1 | 1/0 |
| DL4 | – | – | – | – | – | – | – |
| SA(VA) | 0 | 1 | 0 | 1 | 1/0 | 1 | 1/0 |
| SA(VC) | 0 | 0 | 0 | 0 | 0 | 1 | 1/0 |

F I G. 24

FIG. 27

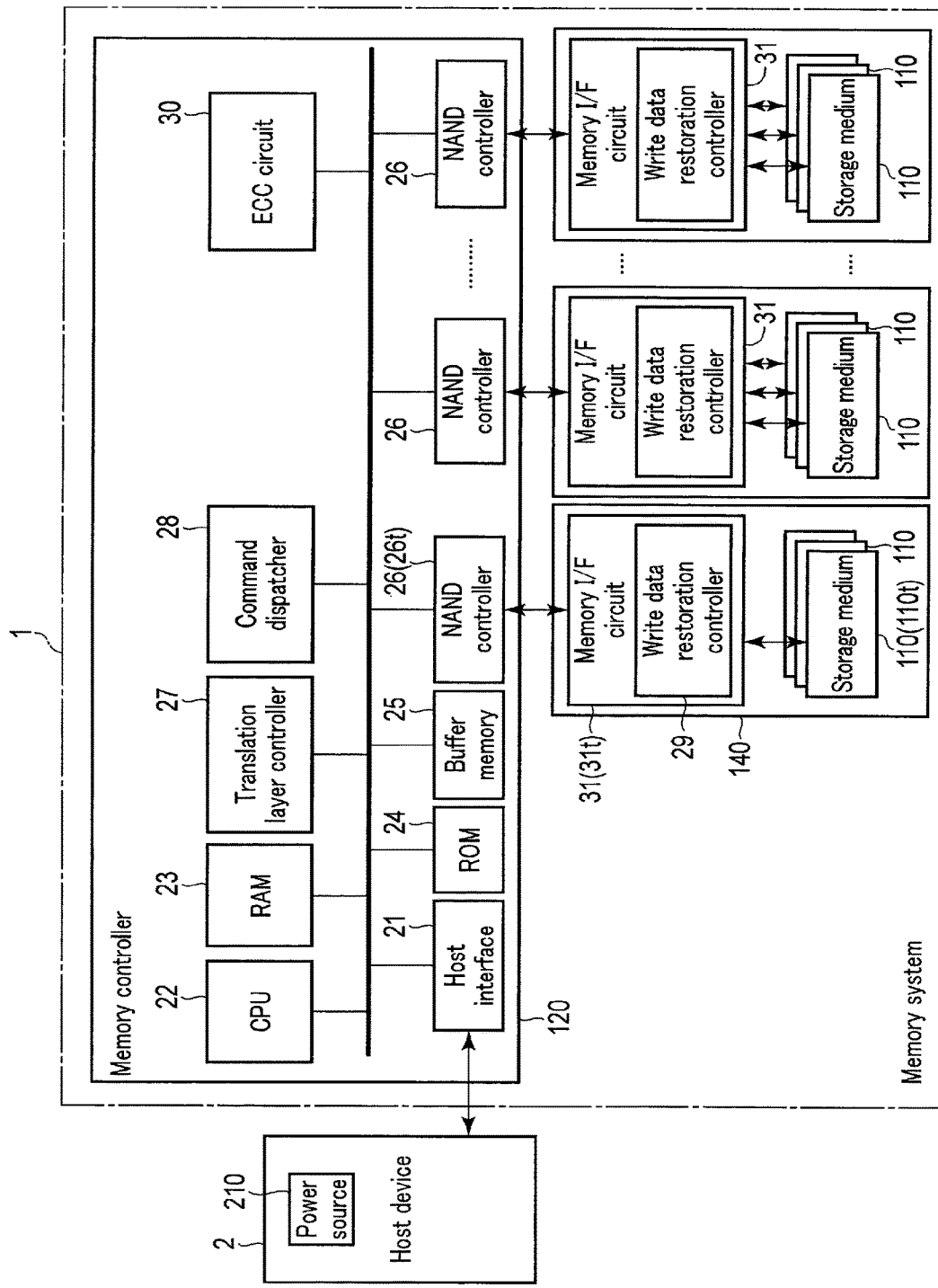
F I G. 29

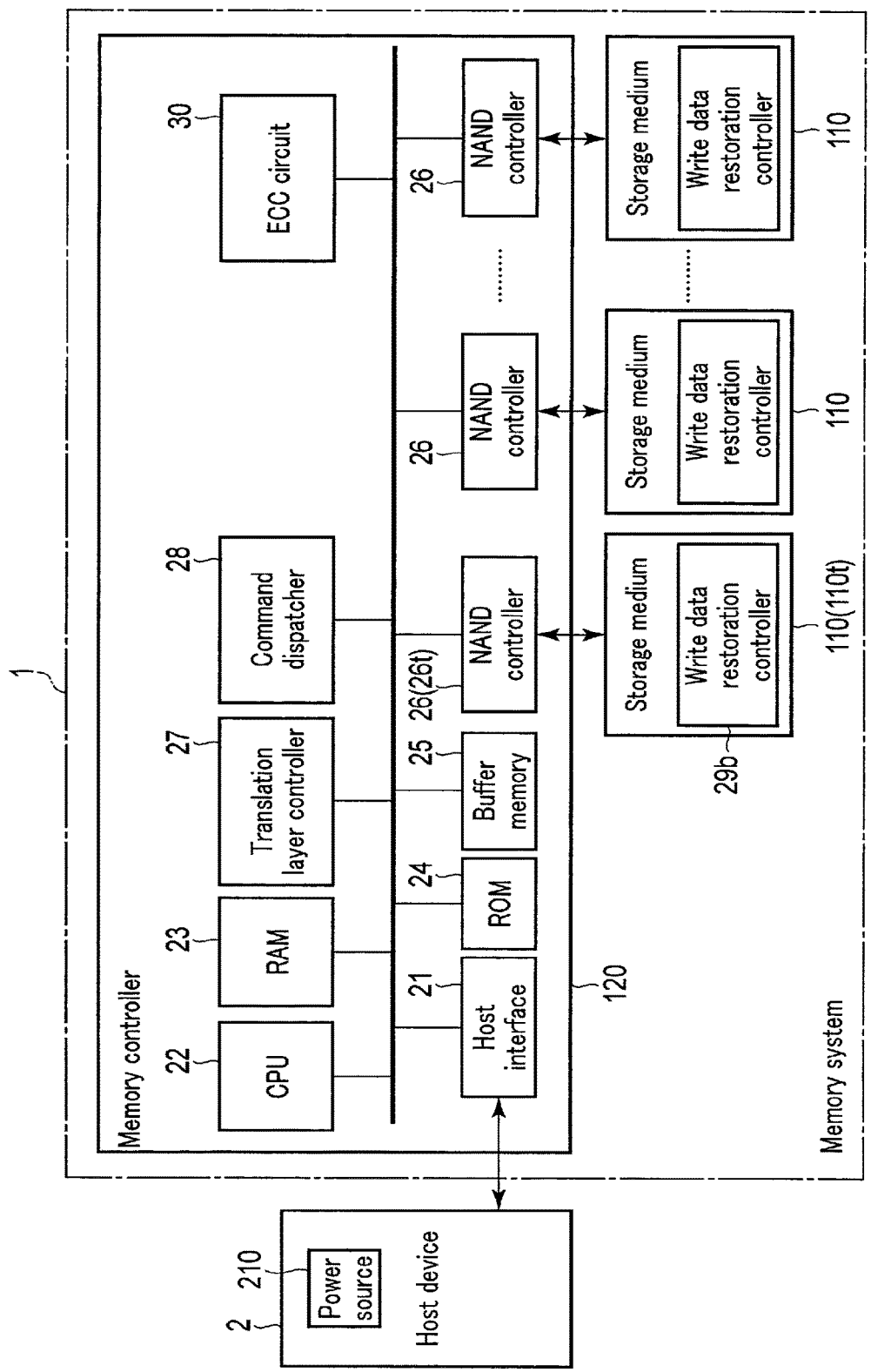
F I G. 30

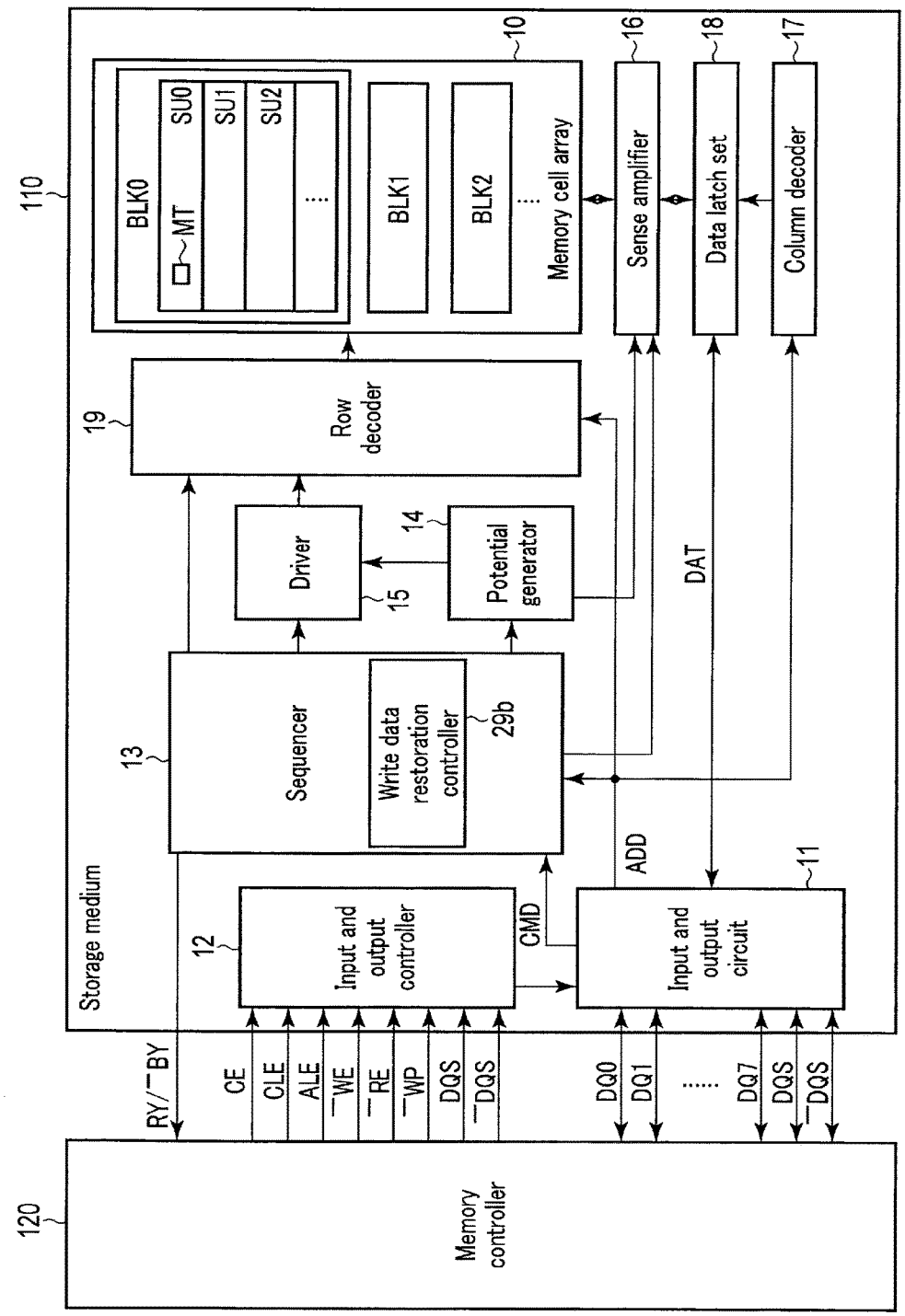
F I G. 31

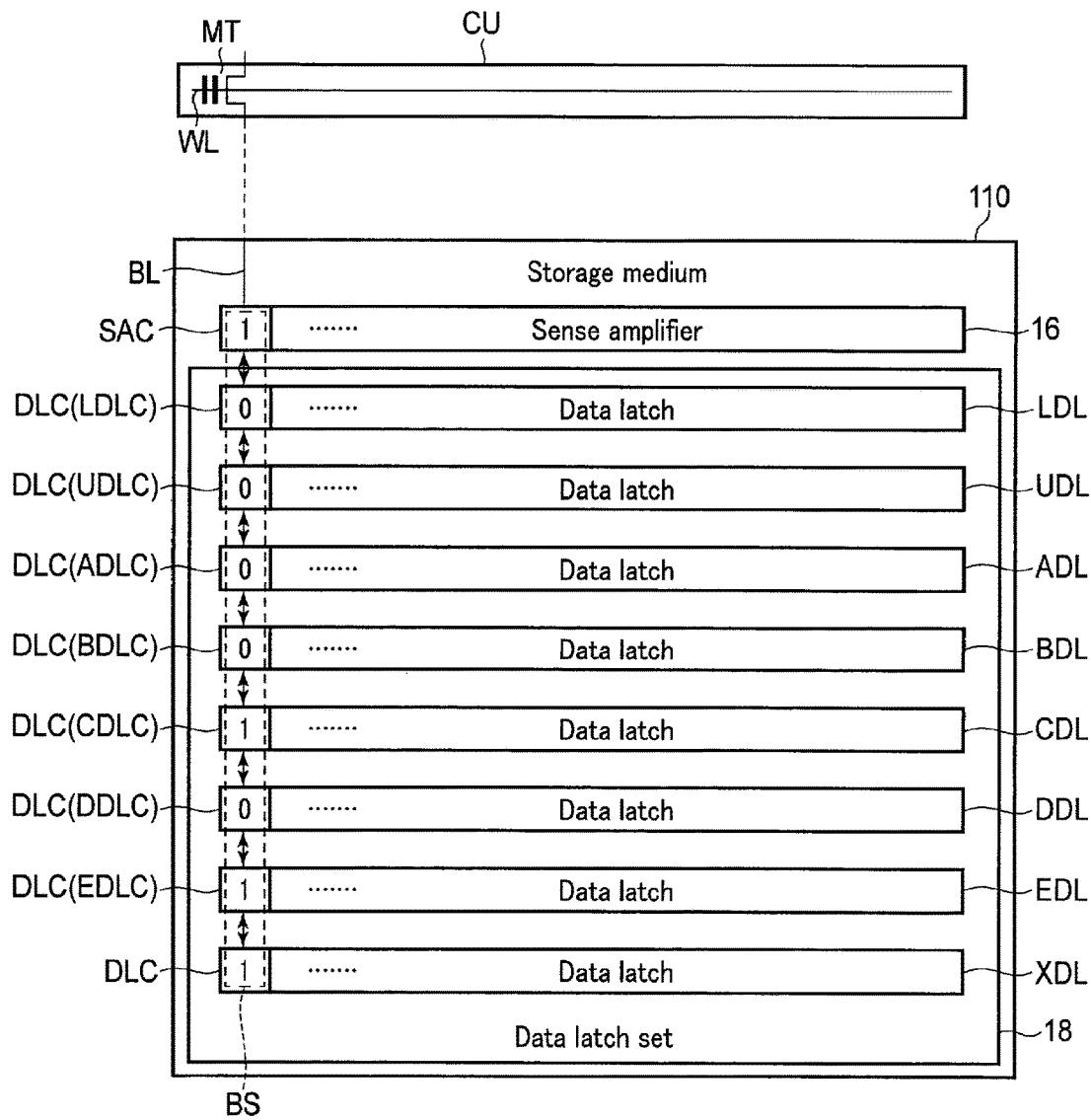
F I G. 32

FIG. 33

UDL&LDL→XDL

▨ : Changed bit (a)

| Target state | Er | A Pass | A Fail | B Pass | B Fail | C Pass | C Fail |
|---|---|---|---|---|---|---|---|
| UDL | 1 | 1 | 1 | 1 | 0 | 1 | 0 |
| LDL | 1 | 1 | 0 | 1 | 0 | 1 | 1 |
| XDL | 1 | 1 | 0 | 1 | 0 | 1 | 0 |
| SA  | - | - | - | 1 | - | - | - |

Performs B-read in SA (b)

| Target state | Er | A Pass | A Fail | B Pass | B Fail | C Pass | C Fail |
|---|---|---|---|---|---|---|---|
| UDL | 1 | 1 | 1 | 1 | 0 | 1 | 0 |
| LDL | 1 | 1 | 0 | 1 | 0 | 1 | 1 |
| XDL | 1 | 1 | 0 | 1 | 0 | 1 | 0 |
| SA  | 0 | 0 | 0 | 1 | 0 | 1 | 1/0 |

(a) SA&XDL→XDL

| Target state | Er | A | | B | | C | |
|---|---|---|---|---|---|---|---|
| | | Pass | Fail | Pass | Fail | Pass | Fail |
| UDL | 1 | 1 | 1 | 1 | 0 | 1 | 0 |
| LDL | 1 | 1 | 0 | 1 | 0 | 1 | 1 |
| XDL | 0 | 0 | 0 | 1 | 0 | 1 | 0 |
| SA | 0 | 0 | 0 | 1 | 0 | 1 | 1/0 |

(b) XDL&UDL→XDL

| Target state | Er | A | | B | | C | |
|---|---|---|---|---|---|---|---|
| | | Pass | Fail | Pass | Fail | Pass | Fail |
| UDL | 1 | 1 | 1 | 1 | 0 | 1 | 0 |
| LDL | 1 | 1 | 0 | 1 | 0 | 1 | 1 |
| XDL | 1 | 1 | 1 | 0 | 0 | 0 | 0 |
| SA | 0 | 0 | 0 | 1 | 0 | 1 | 1/0 |

FIG. 34

(a) UDL&LDL→XDL

| Target state | Er | A Pass | A Fail | B Pass | B Fail | C Pass | C Fail |
|---|---|---|---|---|---|---|---|
| UDL | 1 | 1 | 1 | 1 | 0 | 1 | 0 |
| LDL | 1 | 1 | 0 | 1 | 0 | 1 | 1 |
| XDL | 1 | 1 | 0 | 1 | 0 | 1 | 0 |
| SA | - | - | - | - | - | - | - |

▨ : Changed bit (b) Performs A-read in SA

| Target state | Er | A Pass | A Fail | B Pass | B Fail | C Pass | C Fail |
|---|---|---|---|---|---|---|---|
| UDL | 1 | 1 | 1 | 1 | 0 | 1 | 0 |
| LDL | 1 | 1 | 0 | 1 | 0 | 1 | 1 |
| XDL | 1 | 1 | 0 | 1 | 0 | 1 | 0 |
| SA | 0 | 1 | 0 | 1 | 1/0 | 1 | 1/0 |

(c) SA&XDL→XDL

| Target state | Er | A Pass | A Fail | B Pass | B Fail | C Pass | C Fail |
|---|---|---|---|---|---|---|---|
| UDL | 1 | 1 | 1 | 1 | 0 | 1 | 0 |
| LDL | 1 | 1 | 0 | 1 | 0 | 1 | 1 |
| XDL | 0 | 1 | 0 | 1 | 0 | 1 | 0 |
| SA | 0 | 1 | 0 | 1 | 1/0 | 1 | 1/0 |

F I G. 35

(a) Performs C-read in SA
| Target state | Er | A Pass | A Fail | B Pass | B Fail | C Pass | C Fail |
|---|---|---|---|---|---|---|---|
| UDL | 1 | 1 | 1 | 1 | 0 | 1 | 0 |
| LDL | 1 | 1 | 0 | 1 | 0 | 1 | 1 |
| XDL | 0 | 1 | 0 | 1 | 0 | 1 | 0 |
| SA | 0 | 0 | 0 | 0 | 0 | 1 | 0 |
(b) ⎯SA & XDL → XDL
| Target state | Er | A Pass | A Fail | B Pass | B Fail | C Pass | C Fail |
|---|---|---|---|---|---|---|---|
| UDL | 1 | 1 | 1 | 1 | 0 | 1 | 0 |
| LDL | 1 | 1 | 0 | 1 | 0 | 1 | 1 |
| XDL | 0 | 1 | 0 | 0 | 0 | 0 | 0 |
| SA | 0 | 0 | 0 | 0 | 0 | 1 | 0 |
(c) ⎯XDL & LDL → XDL
| Target state | Er | A Pass | A Fail | B Pass | B Fail | C Pass | C Fail |
|---|---|---|---|---|---|---|---|
| UDL | 1 | 1 | 1 | 1 | 0 | 1 | 0 |
| LDL | 1 | 1 | 0 | 1 | 0 | 1 | 1 |
| XDL | 1 | 0 | 0 | 0 | 0 | 1 | 1 |
| SA | 0 | 1 | 0 | 0 | 0 | 1 | 0 |
 : Restored bit
F I G. 36

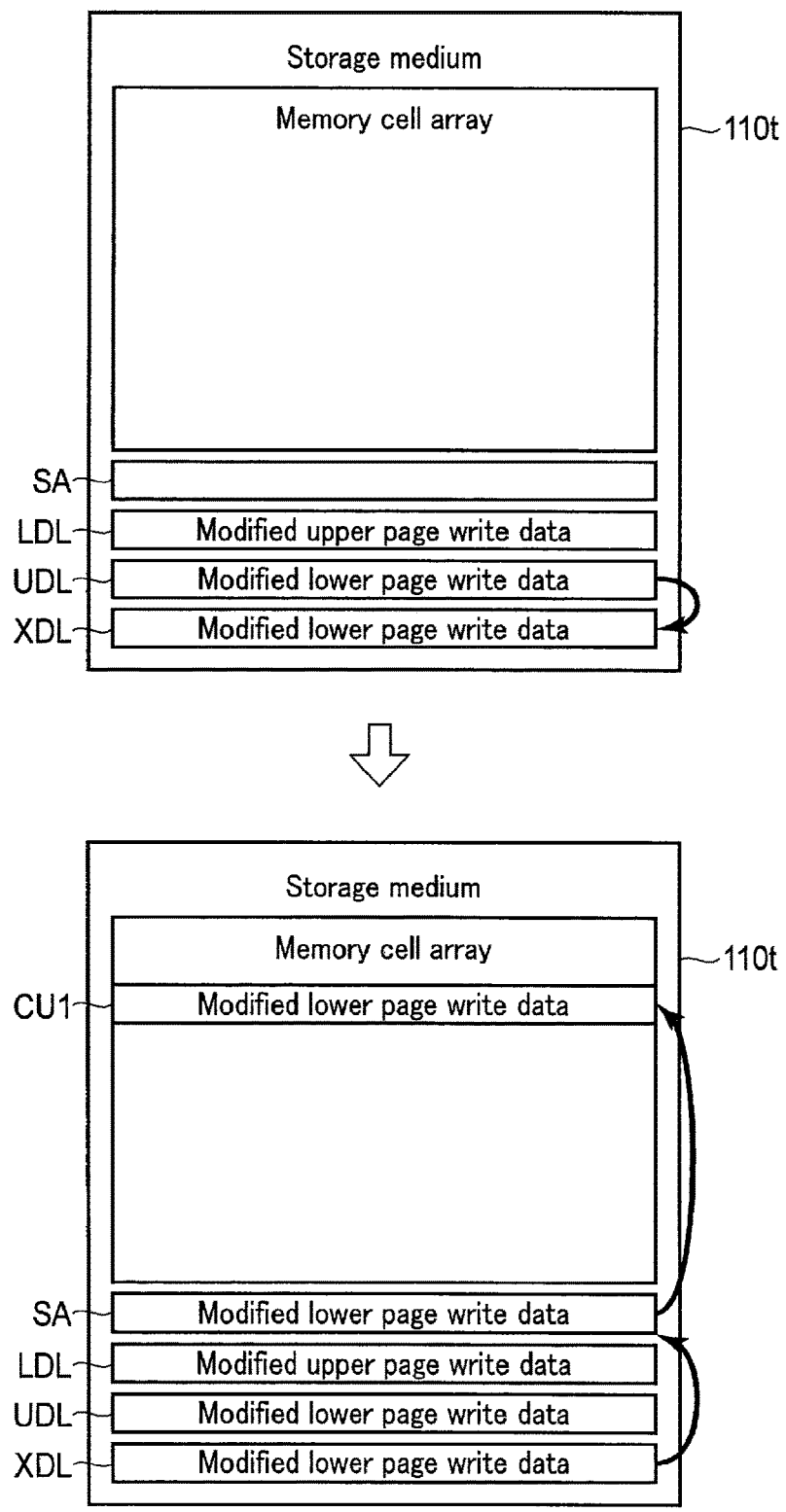
F I G. 39

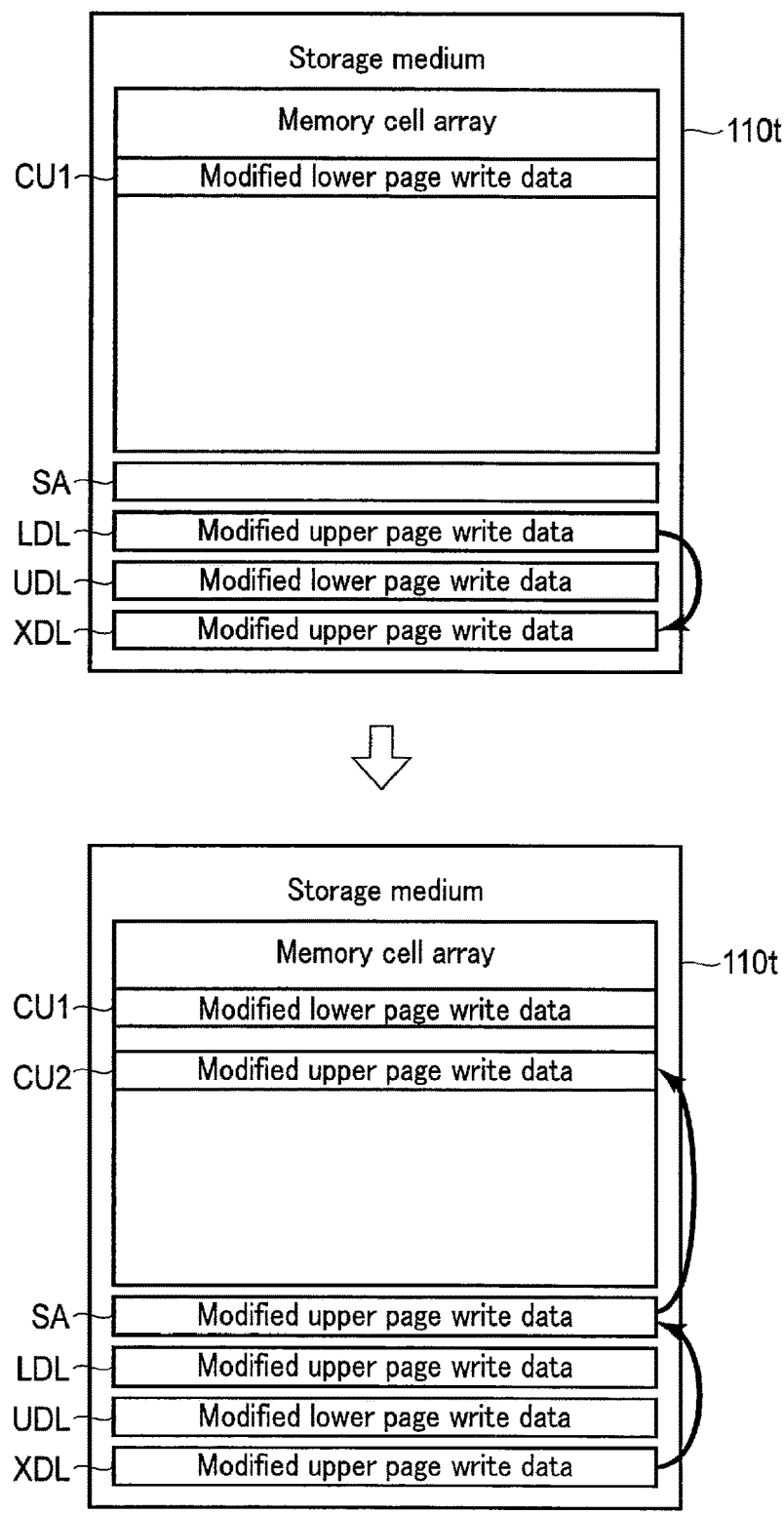
F I G. 40

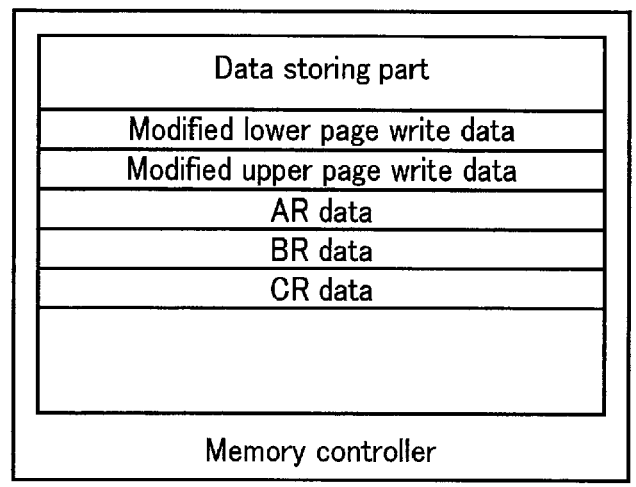
F I G. 41
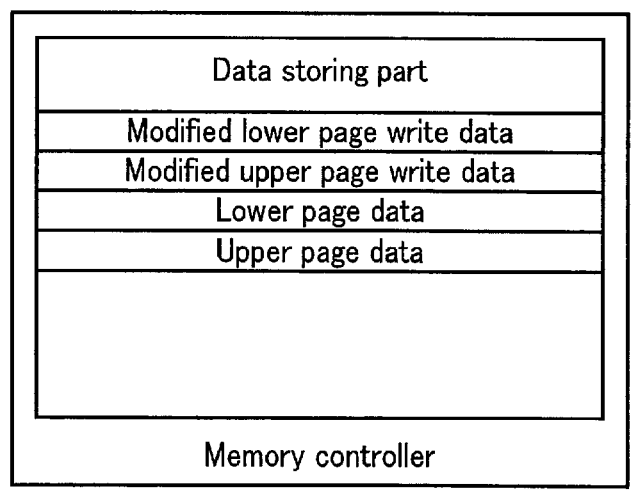
F I G. 42

MEMORY SYSTEM

CROSS-REFERENCE TO RELATED APPLICATIONS

This application is based upon and claims the benefit of priority from Japanese Patent Application No. 2017-50316, filed Mar. 15, 2017, the entire contents of which are incorporated herein by reference.

FIELD

Embodiments described herein relate generally to a memory system.

BACKGROUND

A memory system including a storage medium and a memory controller to control the storage medium is known. The memory system stores data instructed to be written from the host device, and transmits to the host device data read from the storage medium through an instruction from the host device. The memory system may be instructed to write particular data and instructed to read that particular to-be-written data before the write process into the storage medium is completed. Such data read process needs to be performed while satisfying various requirements imposed on the memory system.

BRIEF DESCRIPTION OF THE DRAWINGS

FIG. 1 illustrates functional blocks of a memory system of a first embodiment;

FIG. 3 illustrates components and connections of a memory block of the first embodiment;

FIG. 9 illustrates an overview of some operations of the memory system of the first embodiment;

FIG. 11 illustrates transitions of voltages applied to word lines during the write process in the memory system of the first embodiment over time;

FIG. 12 illustrates states of the data latches and the sense amplifier during the write process in the memory system of the first embodiment;

FIG. 13 illustrates states of the data latches and the sense amplifier during the write process in the memory system of the first embodiment;

FIG. 15 illustrates an example of signals DQ flowing between the memory controller and the storage medium of the first embodiment;

FIG. 17 illustrates states of some associated bit strings during the write data restoration in the memory system of the first embodiment;

FIG. 18 illustrates states of some associated bit strings during the write data restoration in the memory system of the first embodiment;

FIG. 23 illustrates an example of signals DQ flowing between a memory controller and a storage medium of the second embodiment;

FIG. 24 illustrates states of some associated bit strings during write data restoration in the memory system of the second embodiment;

FIG. 27 illustrates states of some associated bit strings during the write data restoration in the memory system of the second embodiment;

FIG. 29 illustrates functional blocks of a memory system of a third embodiment;

FIG. 30 illustrates functional blocks of a memory system of a fourth embodiment;

FIG. 31 illustrates functional blocks of a storage medium of the fourth embodiment;

FIG. 32 illustrates details of a sense amplifier and a data latch set of the fourth embodiment;

FIG. 33 illustrates states of some associated bit strings during write data restoration in a memory system of a fifth embodiment;

FIG. 34 illustrates states of some associated bit strings during the write data restoration in the memory system of the fifth embodiment;

FIG. 35 illustrates states of some associated bit strings during the write data restoration in the memory system of the fifth embodiment;

FIG. 36 illustrates states of some associated bit strings during the write data restoration in the memory system of the fifth embodiment;

FIG. 39 illustrates transfer of data during a write process of modified write data in the memory system and write data restoration of the sixth embodiment;

FIG. 40 illustrates transfer of data during a write process of modified write data in the memory system and the write data restoration of the sixth embodiment;

FIG. 41 illustrates states of a data storing area during the write data restoration in the memory system of the sixth embodiment;

FIG. 42 illustrates states of the data storing area during the write data restoration in the memory system of the sixth embodiment.

DETAILED DESCRIPTION

Figure 2:
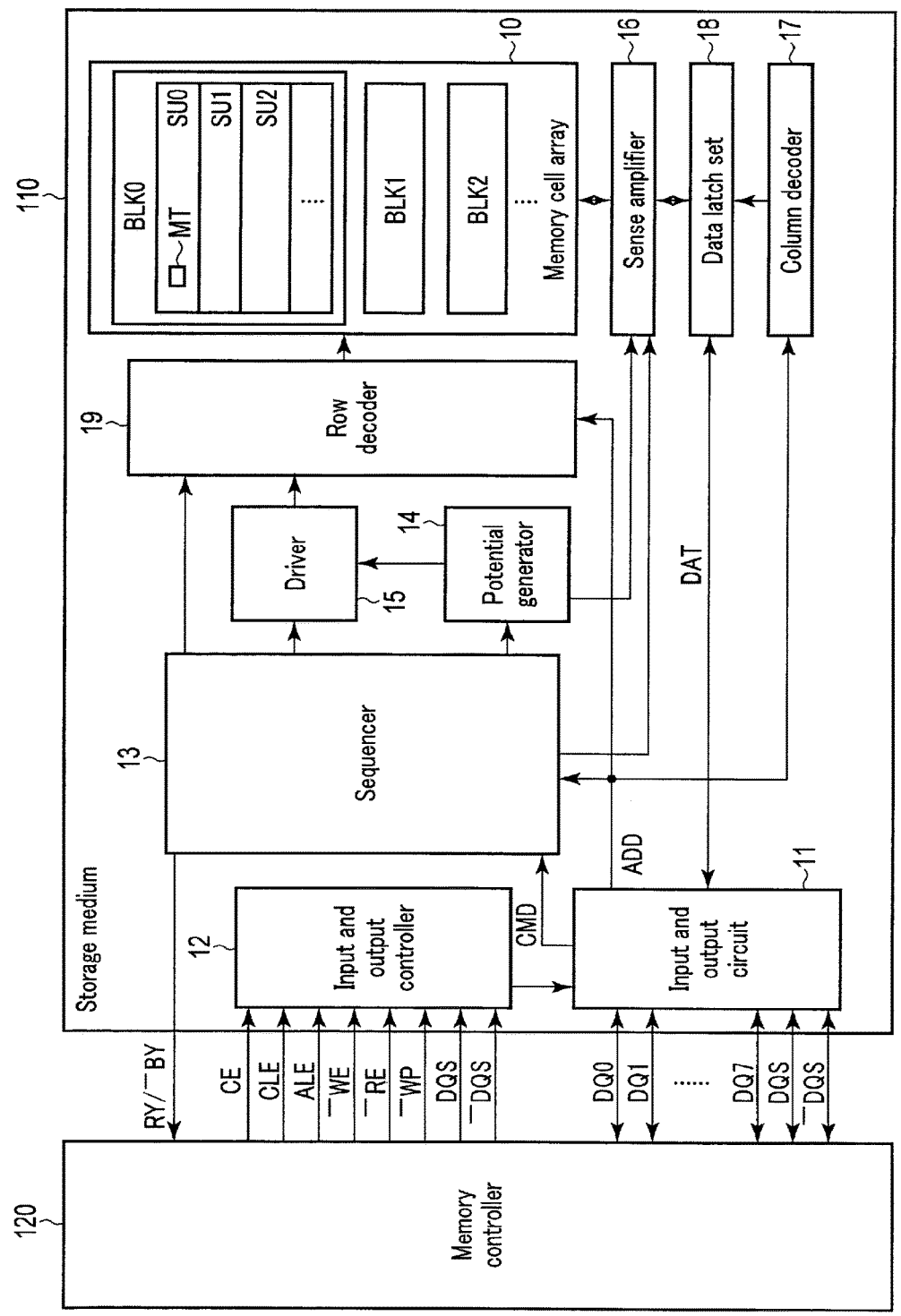
FIG. 2 illustrates functional blocks of a storage medium of the first embodiment.

In general, according to one embodiment, a memory system includes a storage medium including a first cell transistor, a first data latch, and a second data latch; and a first controller. The first controller is configured to instruct to the storage medium to, after instructing the storage medium to write data into the first cell transistor and before completion of the writing of the data into the first cell transistor, suspend a process being performed to the first cell transistor, read data from the first data latch, read data from the second data latch, and read data from the first cell transistor.

Embodiments will now be described with reference to the figures. In the following description, components with substantially the same functionalities and configurations will be referred to with the same reference numerals, and repeated descriptions may be omitted. All descriptions for a particular embodiment also apply to another embodiment unless it is explicitly mentioned otherwise or obviously eliminated.

Each functional block can be implemented as hardware, software, or the combination of the both. For this reason, in order to clearly illustrate that each block can be any of hardware, computer software or combination, descriptions will be made in terms of their functionalities in general. It is not necessary that functional blocks are distinguished as in the following examples. For example, some of the functions may be implemented by functional blocks different from those illustrated below.

Any step in a flow of a method of an embodiment is not limited to any illustrated order, and can occur in an order different from an illustrated order and/or can occur concurrently with another step.

In the specification and the claims, a phrase of a particular first component being "coupled" to another second component includes the first component being coupled to the second component either directly or via one or more components which are always or selectively conductive.

First Embodiment

<1-1. Configuration (Structure)>
<1-1-1. Memory System>

FIG. 1 illustrates functional blocks of a memory system 1 of the first embodiment. The memory system 1 may be a solid state device (SSD), or a memory card, such as an SD™ card, for example.

As illustrated in FIG. 1, the memory system 1 can be coupled to and communicate with a host device 2. The host device 2 includes a power source 210, which supplies a power voltage (or, electric power) to the memory system 1. The power source 210 may be provided outside the memory system 1 separately from the host device 2.

The memory system 1 includes one or more storage media 110, and a memory controller 120. A reference number 110*t* will be described below. Each of the storage media 110 and the memory controller 120 may be in a form of one independent chip, for example.

The memory controller 120 receives commands from the host device 2, and controls the storage media 110 based on the received commands. Specifically, the memory controller 120 writes (or, programs) data which the host device 2 requests to be written (write requested data) in the storage media 110, reads data which the host device 2 requests to be read (read requested data) from the storage media 110 and transmits the read data to the host device 2.

The storage media 110 are nonvolatile semiconductor storage media, or are NAND flash memory chips, for example.

The memory controller 120 includes a host interface 21, a central processing unit (CPU) 22, a random access memory (RAM) 23, a read only memory (ROM) 24, a buffer memory 25, a NAND controller 26, a translation layer controller 27, a command dispatcher 28, a write data restoration controller 29, and an error correction code (ECC) circuit 30.

The memory controller 120 performs some or all of functions of each of the host interface 21, the NAND controller 26, the translation layer controller 27, the command dispatcher 28, the write data restoration controller 29, and the ECC circuit 30 realized by the CPU 22 executing firmware (or, program), which is stored in the ROM 24 and loaded on the RAM 23. Some or all of the functions of each of the host interface 21, the NAND controller 26, the translation layer controller 27, the command dispatcher 28, the write data restoration controller 29, and the ECC circuit 30 may be implemented by hardware. A reference number 26*t* will be described below.

The host interface 21 is coupled to the host device 2 via a bus, and manages communications between the memory controller 120 and the host device 2. Examples of the bus between the host interface 21 and the host device 2 include serial advanced technology attachment (SATA), serial attached small computer system interface (SAS), peripheral component interconnect express (PCIe™), or other types of bus. The host interface 21 transmits requests received from the host device 2 to the translation layer controller 27, and transmits read requested data to the host device 2 in accordance with instructions of the translation layer controller 27.

The RAM 23 temporarily stores data and serves as a work area for the memory controller 120. The buffer memory stores data, such as write requested data, data to be written in the storage media 110 (or, (original) write data), and data read from the storage media 110 (or, read data). The buffer memory 25 includes a dynamic RAM (DRAM) and a DRAM controller, and/or a static RAM (SRAM), for example.

The translation layer controller 27 mutually converts a logical address and a physical address storing the data of that logical address. A logical address is associated with data to which the host device 2 requests to access (read, write, or erase, etc.). A physical address identifies a particular section of the memory space of one storage medium 110. The translation layer controller 27 receives a request from the host device 2 (a host request) and a logical address associated with that host request from the host interface 21, converts the received logical address into a physical address, and transmits the host request and the physical address to the command dispatcher 28. The translation layer controller 27 also instructs the host interface 21 to transmit read requested data requested by the host device 2.

The command dispatcher 28 receives a host request and the converted physical address from the translation layer controller 27. The command dispatcher 28 instructs a NAND controller 26 corresponding to a storage medium 110 including the received physical address to transmit a command corresponding to the host request and an associated physical address. In a write process, the command dispatcher 28 instructs one of the NAND controllers 26 to transmit write data to the storage media 110.

The write data restoration controller 29 reads particular data (restoration material data) from the storage media 110, and controls, based on the read restoration material data, restoration of original write data lost in the storage media 110. The write data restoration controller 29 includes a data storing part 29a, which is implemented by part of the memory space of the RAM 23.

Each NAND controller 26 is coupled to one or more corresponding storage medium 110 via a bus, and manages communications with the corresponding storage medium 110. The bus is a NAND bus when the storage medium 110 is a NAND flash memory. When each NAND controller 26 is instructed to transmit a command by the command dispatcher 28, it transmits the instructed command to the corresponding storage medium 100. In a write process, each NAND controller 26 also transmits write data to the storage medium 110.

The ECC circuit 30 converts substantial (payload) data to be written in the storage medium 110 into an error correction codeword (ECC codeword). The substantial data includes data, such as write requested data from the host device 2, and management data which the memory controller 120 needs to write in the storage medium 110. In general, the error correction codeword includes substantial data and data for error correction. The data for error correction includes parity data, for example. The ECC circuit 30 also performs an operation to read data and attempts to obtain correct (or, error-corrected) substantial data included in the read data.

<1-1-2. Storage Medium>

FIG. 2 illustrates functional blocks of the storage medium 110 of the first embodiment. As illustrated in FIG. 2, the storage medium 110 includes components such as a memory cell array (cell array) 10, an input and output circuit 11, an input and output controller 12, a sequencer (or, controller) 13, a potential generator 14, a driver 15, a sense amplifier 16, a column decoder 17, a data latch set 18, and a row decoder 19.

The cell array 10 includes plural memory blocks BLK (BLK0, BLK1, . . . ). A block BLK is a unit for data erase and data in each block is erased together, for example. Data may be erased in a unit smaller than one block BLK, such as a half of a block BLK.

Each block BLK is a set of plural string units SU (SU0, SU1, . . . ). Each string unit SU is a set of plural NAND strings (strings) STR (STR0, STR1, . . . ). A string STR includes plural memory cell transistors (cell transistors) MT.

The input and output circuit 11 and the input and output controller 12 are coupled to the memory controller 2 via a NAND bus. The NAND bus propagates signals ⁻CE, CLE, ALE, ⁻WE, ⁻RE, and ⁻WP, signals DQ (DQ0 to DQ7), and data strobe signals DQS and ⁻DQS. The sign "⁻" preceding the name of a signal indicates the inverted logic of the signal with the same name without the sign "⁻", and means that the signal is asserted when it is low.

The input and output circuit 11 receives and transmits the signals DQ. The input and output circuit 11 also receives and transmits the data strobe signals DQS and ⁻DQS. The input and output controller 12 receives various control signals from the memory controller 12, and controls the input and output circuit 11 based on the control signals. The control signals include the signals ⁻CE, CLE, ALE, ⁻WE, ⁻RE, and ⁻WP, and the data strobe signals DQS, and ⁻DQS.

The signals DQ (DQ0 to DQ7) have a width of, for example, eight bits, indicate the substance of data, which include commands (CMD), write or read data (DAT), address signals (ADD), status data (STA), etc.

An asserted signal ⁻CE enables the storage medium 110 to operate. An asserted signal CLE notifies the storage medium 110 that the signals DQ input into the storage medium 110 in parallel to that signal CLE indicate a command CMD. An asserted signal ALE notifies the storage medium 110 that the signals DQ input into the storage medium 110 in parallel to that signal ALE indicate an address signal ADD. An asserted signal ⁻WE instructs the storage medium 110 to store the signals DQ input into the storage medium 110 in parallel to that signal ⁻WE. An asserted signal ⁻RE instructs the storage medium 110 to output the signals DQ. An asserted signal ⁻WP instructs prohibition of data write and erase to the storage medium 110. The signal RY/⁻BY indicates whether the storage medium 110 is in a ready state or in a busy state, and indicates the busy state with the low level. The storage medium 110 accepts commands from the memory controller 120 in the ready state, and does not accept commands from the memory controller 120 in the busy state.

The signals DQS and ⁻DQS flowing from the memory controller 120 to the storage medium 110 instruct when the memory medium 110 should capture the signals DQ. The signals DQS and ⁻DQS flowing from the storage medium 110 to the memory controller 120 notify when the memory controller 120 should capture the signals DQ.

The sequencer 13 receives the commands CMD and address signals ADD from the input and output circuit 11, and controls the potential generator 14, the driver 15, the sense amplifier 16, and the column decoder 17 based on the commands CMD and address signals ADD.

The potential generator 14 receives power potentials from outside the memory medium 110, and generates various potentials (voltages) from the power potentials. The generated potentials are supplied to components, such as the driver 15 and the sense amplifier 16. Application of various potentials applies voltages to various components and interconnects in the storage medium 110. The driver 15 receives the potentials generated by the potential generator 14, and supplies selected ones of the received potentials to the row decoder 19.

The row decoder 19 receives various potentials from the driver 15, receives the address signals ADD from the input and output circuit 11, and selects one block BLK based on the received address signal ADD, and transfers the potentials from the driver 15 to the selected block ELK.

The sense amplifier 16 senses states of the cell transistors MT, generates read data based on the sensed states. Moreover, the sense amplifier 16 transfers write data to the cell transistors MT.

The data latch set 18 stores write data DAT received from the input and output circuit 11, and supplies the write data DAT to the sense amplifier 16. Moreover, the data latch set 18 receives read data DAT from the sense amplifier 16, and supplies the read data DAT to the input and output circuit 11 in accordance with the control of the column decoder 17. The column decoder 17 controls the data latch set 18 based on the address signals ADD.

<1-1-3. Block>

FIG. 3 illustrates an example, of some components and connections of the cell array 10, and illustrates components and connections of one block BLK0 and associated components. Plural (for example, all) blocks BLK all include the components and connections illustrated in FIG. 3.

One block BLK includes string units SU0 to SU3. One block BLK may also include only one string unit SU.

Each of m (m being a natural number) bit lines BL0 to BLm−1 is coupled to string STRs respectively from the string units SU0 to SU3 in each block BLK.

Each string STR includes one source-side select gate transistor ST, plural (for example, eight) memory cell transistors MT, and one drain-side select gate transistor DT (DT0, DT1, DT2, or DT3). The transistors ST, MT, and DT are serially coupled in this order between a source line CELSRC and one bit line BL. A cell transistor MT includes a control gate electrode (word line WL) and a charge storage layer insulated from the surroundings, and can store data in a non-volatile manner based on the quantity of the electric charge in the charge storage layer.

Strings STR respectively coupled to different bit lines BL form one string unit SU. In each string unit SU, the control gate electrodes (gates) of the cell transistors MT0 to MT7 are coupled to the word lines WL0 to WL7, respectively. Furthermore, in each block BLK, word lines WL with the same address in the different string units SU are also coupled to each other. A set of cell transistors MT which share one word line WL in one string unit SU is referred to as a cell unit CU.

The transistors DT0 to DT3 belong to the string units SU0 to SU3, respectively. For each case of $\alpha$=0, 1, 2, and 3, the gate of each transistor DT$\alpha$ of each of strings STR of a string unit SU$\alpha$ is coupled to a select gate line SGDL$\alpha$. The gates of the transistors ST are coupled to a select gate line SGSL.

Figure 4:
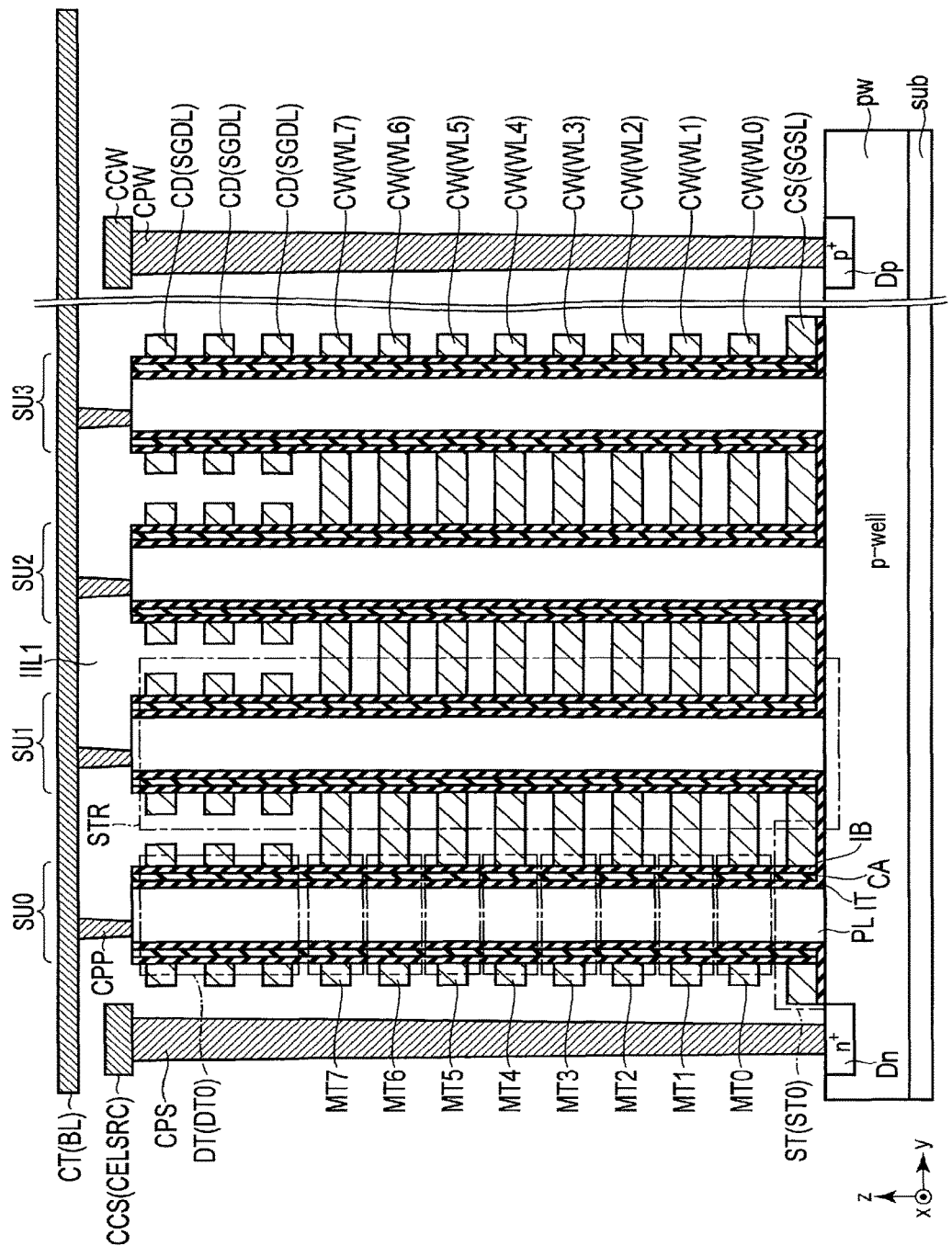
FIG. 4 illustrates an example of a cross section of the structure of a memory block of the first embodiment.

Each block BLK can have the structure illustrated in FIG. 4. As illustrated in FIG. 4, string units SU are provided on a substrate sub. The substrate sub extends along the xy-plane and includes a p-type well pw in its surface area. Each string unit SU includes strings STR lined up along the x-axis. Each string STR includes a semiconductor pillar PL. Each pillar PL extends along the z-axis, is in contact with the well pw at its bottom, and serves as a channel region in which channels of the transistors MT, DT, and ST are formed and a body. The top of each pillar PL is coupled to a conductor CT via a conductive plug CPP. The conductor CT extends along the y-axis, serves as one bit line BL, and has an interval with another conductor CT located at another coordinate on the x-axis. The side of the pillar PL is covered with a tunnel insulator (layer) IT. The tunnel insulator IT is also located on the well pw. The side of the tunnel insulator IT is covered with a charge storage layer CA. The charge storage layer CA is insulative or conductive, and has its side covered with a block insulator (layer) IB.

In each string unit SU, one conductor CS, plural (for example, eight) conductors CW, and plural (for example, three) conductors CD are provided above the well pw. Plural conductors CS may be provided. The conductors CS, CW, and CD are lined up in this order along the z-axis at intervals, extend along the x-axis, and are in contact with the block insulator IB. The conductor CS also sandwiches the tunnel insulator IT with the surface of the well pw. The conductors CS, CW, and CD serves as a select gate line SGSL, word lines WL0 to WL7, and a select gate line SGDL, respectively. In each string unit SU, the conductors CS, CW, and CD are at their insides in contact with the block insulators IB on the sides of all the pillars PL in that string unit SU.

A pillar PL, a tunnel insulator IT, a charge storage layer CA, and sections of a block insulators IB at crossings with the conductors CS, CW, or CD serve as a select gate transistor ST, a cell transistor MT, or a select gate transistor DT, respectively. The transistors ST, MT, and DT which share a pillar PL and are lined up along the z-axis form one string STR.

A diffusion layer of $p^+$-type impurities Dp is provided in an area in the surface of the well pw. The diffusion layer Dp is coupled to a conductor CCW via a conductive plug CPW. The plug CPW extends along the xz-plane.

In an area in the surface of the well pw, a diffusion layer of $n^+$-type impurities Dn is further provided. The diffusion layer Dn is coupled to a conductor CCS via a conductive plug CPS. The conductor CCS serves as the source line CELSRC.

An area above the substrate sub and free from the conductors CS, CW, CD, CCS, and CCW, and the plugs CPS and CPW is provided with an insulator IIL1.

<1-1-4. Cell Transistors>

Figure 5:
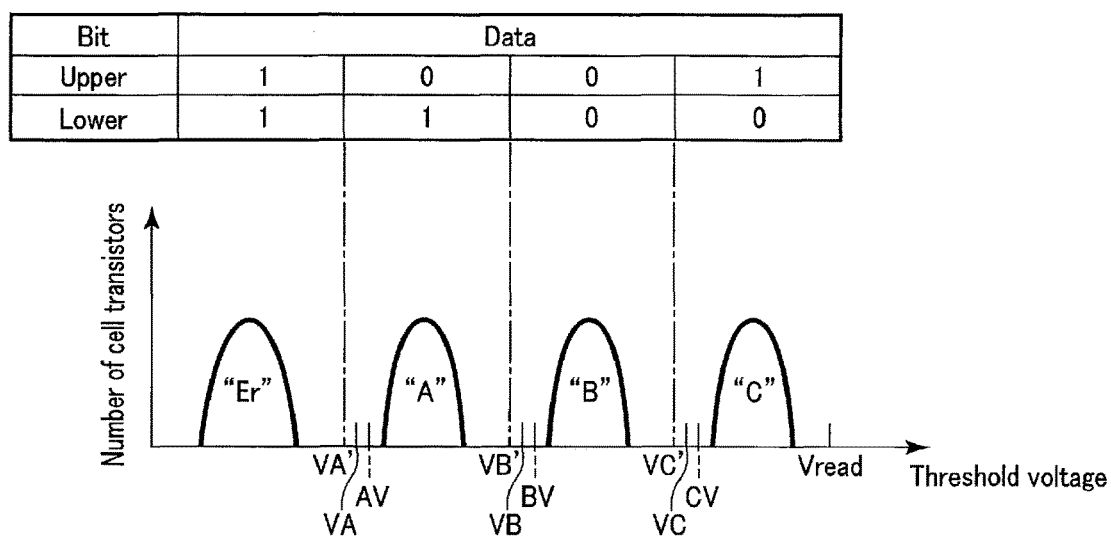
FIG. 5 illustrates an example of storing data in the storage medium of the first embodiment.

The storage medium 110 can store data of one or more bits in one cell transistor MT. FIG. 5 illustrates distributions of threshold voltages of the cell transistors MT each storing two-bit data as a result of a write process. The threshold voltage of each cell transistor MT has a magnitude according to stored data. In a case of storing two-bit data per cell transistor MT, each cell transistor MT can have one of four threshold voltages.

A plurality of cell transistors MT, even when they are storing the same two-bit data (i.e. the same state), may have different threshold voltages, and therefore the threshold voltages of the plurality of cell transistors MT storing the same data form a distribution. The cell transistors MT which belong to four distributions are in Er-state, A-state, B-state, and C-state in order from the lowest voltage, respectively. Erased-state cell transistors MT are in the Er-state, and written-state (programmed-state) cell transistors MT are in the A, B, or C-state. The storage medium 110 can write data in an erased cell unit CU which includes erased-state cell transistors MT only.

The Er, A, B, and C-states are treated as states storing, for example, data 11, data 01, data 00, and data 10, respectively. Another correspondence between a state and stored data may also be used.

Threshold voltages of the cell transistors of the A, B, and C-states are higher than threshold voltages of the cell transistors of Er, A, and B-states, respectively. A cell transistor MT with a threshold voltage lower than or equal to a read voltage VA' is determined to be in the Er-state. A cell transistor MT with a threshold voltage higher than the read voltage VA' and lower than or equal to a read voltage VB' is determined to be in the A-state. A cell transistor MT with a threshold voltage higher than the read voltage VB' and lower than or equal to a read voltage VC' is determined to be in the B-state. A cell transistor MT with a threshold voltage higher than the read voltage VC' is determined to be in the C-state. Cell transistors MT with threshold voltages higher than the read voltage VA', VB', or VC' remain off even while they are applied the read voltage VA', VB', or VC' at their control gate electrodes, respectively. In contrast, cell transistors MT with threshold voltages lower than or equal to the read voltage VA', VB', or VC' turn on while they are applied the read voltage VA', VB', or VC' at their control gate electrodes, respectively. A voltage Vread is higher than the threshold voltage of any cell transistor MT.

In a case of storing multi-bit data in one cell transistor MT, a set of data in same-positioned bits of the respective cell transistors MT of one cell unit CU forms one page. In a case of storing data of two bits per cell transistor MT, a set of data in the upper bits of the respective cell transistors MT of one cell unit CU forms an upper page. A set of data in the lower bits of the respective cell transistors MT of one cell unit CU forms a lower page.

For verification of write process to the A, B, or C state, verification voltages AV, BV, or CV are used, respectively. When a cell transistor MT selected to be written in the A, B, or C state has a threshold voltage higher than or equal to the verification voltage AV, BV, or CV, respectively, it is determined that the program of the cell transistor MT to each state is completed. The verification voltage BV and CV are higher than the verification voltage AV and BV, respectively.

A voltage VA is higher than the read voltage VA' and lower than the verification voltage AV. A voltage VB is higher than the read voltage VB' and lower than the verification voltage BV. A voltage VC is higher than the read voltage VC' and lower than the verification voltage CV. Use of the voltages VA, VB, and VC will be described below. Hereinafter, the voltages VA, VB, and VC, which are used to obtain the restoration material data, may also be referred to as the restoration read voltages.

Data of three bits or more can be stored in one cell transistor by extending the principal described above.

<1-1-5. Data Latch>

Figure 6:
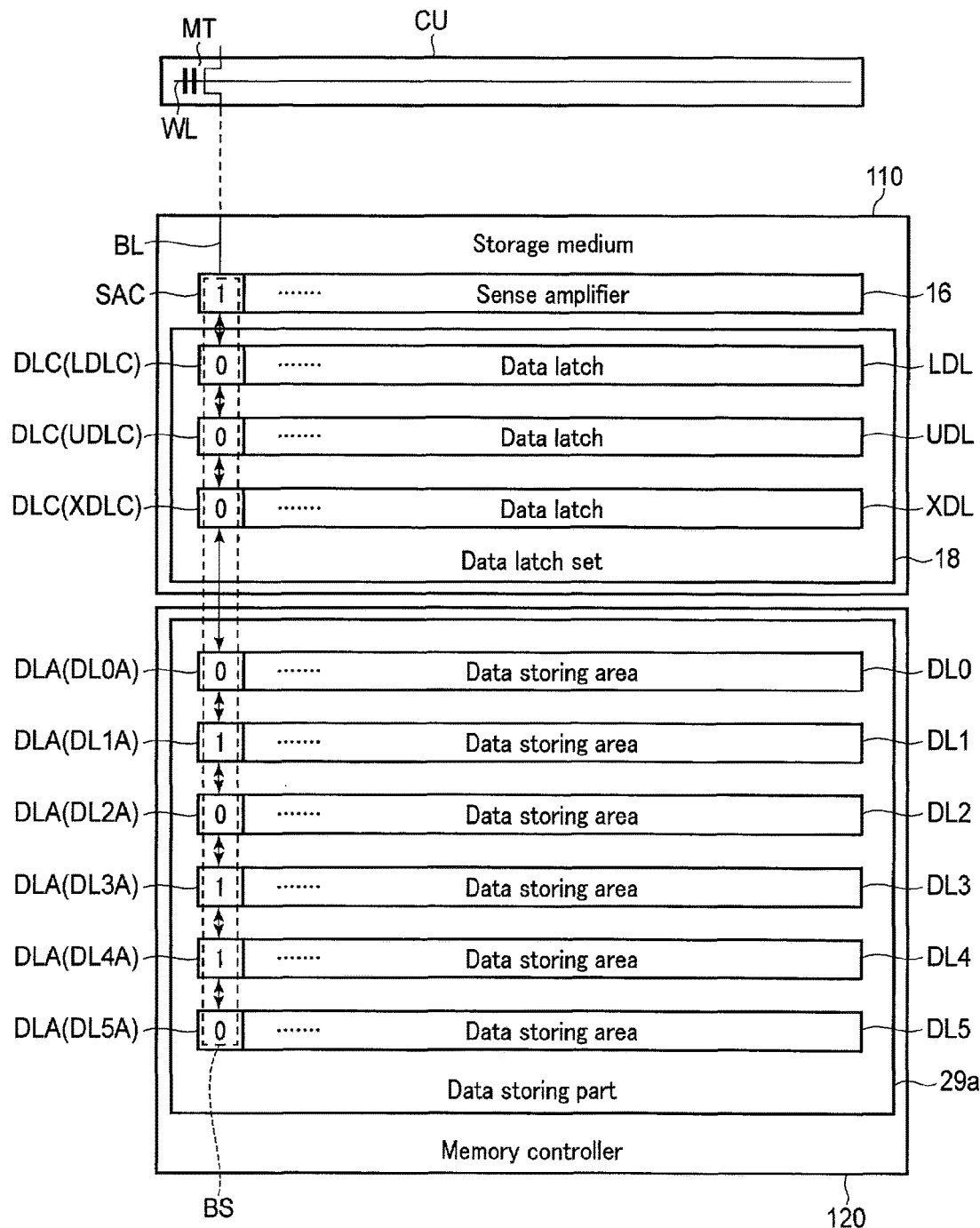
FIG. 6 illustrates details of a sense amplifier, a data latch set, and a data storing area of the first embodiment.

FIG. 6 illustrates details of the sense amplifier 16, the data latch set 18 in the storage medium 110, and the data storing part 29a in the memory controller 120. The sense amplifier 16 includes as many sense amplifier circuits SAC as bits in one page. Each sense amplifier circuit SAC senses the potential read to one bit line BL upon a read process and a verification phase in a write process, and transfers data to one bit line BL upon a program phase in a write process.

The data latch set 18 includes data latches XDL, UDL, and LDL. Each of the data latches XDL, UDL, and LDL includes as many data latch circuits DLC as the bits in one page, and can store data of the size of one page. Each data latch circuit DLC can store one-bit data. Hereinafter, a data latch circuit DLC included in the data latches LDL, UDL, or XDL may be referred to as a data latch circuit LDLC, UDLC, or XDLC, respectively.

The data storing part 29a in the memory controller 120 includes data storing areas DL0, DL1, DL2, DL3, DL4, and DL5. Each of the data storing areas DL0 to DL5 can store data of as many bits as the bits in one page. A part storing one-bit data in each of the data storing areas DL0 to DL5 is referred to as a data storing part DLA. Hereinafter, a data storing part DLA in each of the data storing area DL0, DL1, DL2, DL3, DL4 or DL5 may be referred to as a data storing part DL0A, DL1A, DL2A, DL3A, DL4A, or DL5A, respectively.

The data latch circuits XDLC, LDLC and UDLC, data storing areas DL0A, DL1A, DL2A, DL3A, DL4A, and DL5A, and a sense amplifier circuit SAC which handle a bit at the same position in one-page size data (i.e., corresponding to a same cell transistor MT, or a same bit line BL) are associated with each other. The set of data latch circuits XDLC, LDLC and UDLC, the data storing areas DL0A to DL5A, and the sense amplifier circuit SAC which are associated with each other handle data read from each selected cell transistor MT in one read-target cell unit CU via a corresponding bit line BL. The set of bits in the data latch circuits XDLC, LDLC and UDLC, the data storing areas DL0A to DL5A, and the sense amplifier circuit SAC which are associated with each other is referred to as an associated bit string BS.

<1-2. Operations>

Referring to FIGS. 7 to 21, operations of the memory system 1 are described.

Figure 7:
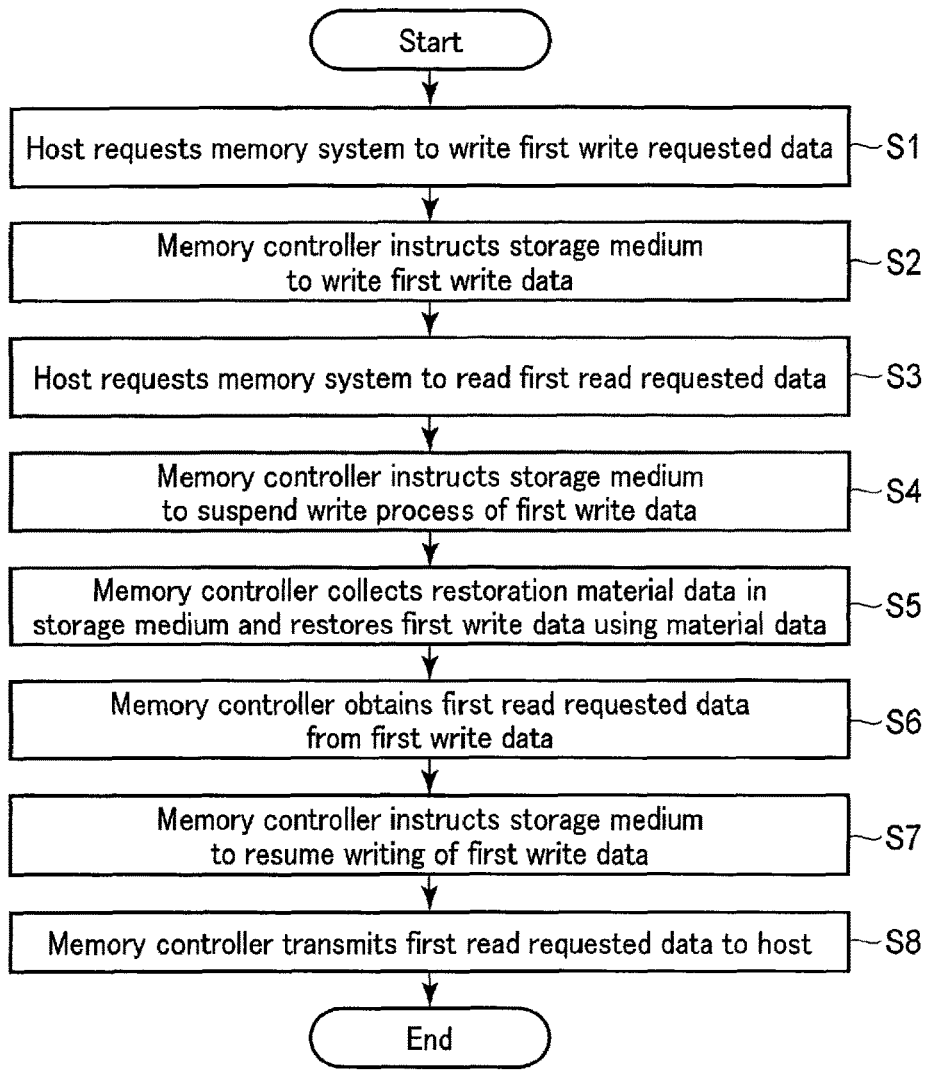
FIG. 7 illustrates the flow of schematic operations of the memory system of the first embodiment.

FIG. 7 illustrates a flow of schematic operations of the memory system of the first embodiment. As illustrated in FIG. 7, the host device 2 requests the memory system 1 to write particular first write requested data (step S1). Upon reception of the request, the memory controller 120 assigns a physical address and generates first write data from the first write requested data by appending data for correcting errors. The memory controller 120 then instructs a storage medium 110 in which the first write data will be written (selected memory medium 110t) to write the first write data (step S2). Upon reception of the instruction, the selected storage medium 110t writes the first write data in the specified physical address in its memory space. The selected storage medium 110t keeps asserting the busy signal to the memory controller 120 during the instructed write process.

In step S3, the host device 2 requests the memory system 1 to read first read requested data, which is the first write requested data requested in step S1, and in other words it has the same logical address as that of the first write requested data. The write process of the first write data may have not been completed when the memory system 1 receives the read request for the first read requested data. The following description is based on such an assumption. The memory controller 120 recognizes the reception of the read request for the first read requested data before the completion of the write process of the first write data on the basis of, for example, the asserted busy signal of the selected storage medium 110t. Specifically, the busy signal from the selected storage medium 110t is maintained asserted in response to the write instruction performed in step S2. This allows the memory controller 120 to recognize that the write process of the first write data is still in progress.

When the memory controller 120 recognizes the read request for the first read request data is received prior to the completion of the write process of the first write data, it instructs the selected storage medium 110t to suspend the write process of the first write data (step S4).

In step S5, the memory controller 120 reads particular types of data (restoration material data; will be described later in detail) from the selected storage medium 110t, and uses the read data and restores the first write data. In step S6, the memory controller 120 corrects errors in the first write data to obtain the first read requested data.

In step S7, the memory controller 120 instructs the selected storage medium 110t to resume the write process of the first write data. In step S8, the memory controller 120 transmits the first read requested data to the host device 2. Step S8 may precede the step S7.

Details of the flow of FIG. 7 will now be described.

Figure 8:
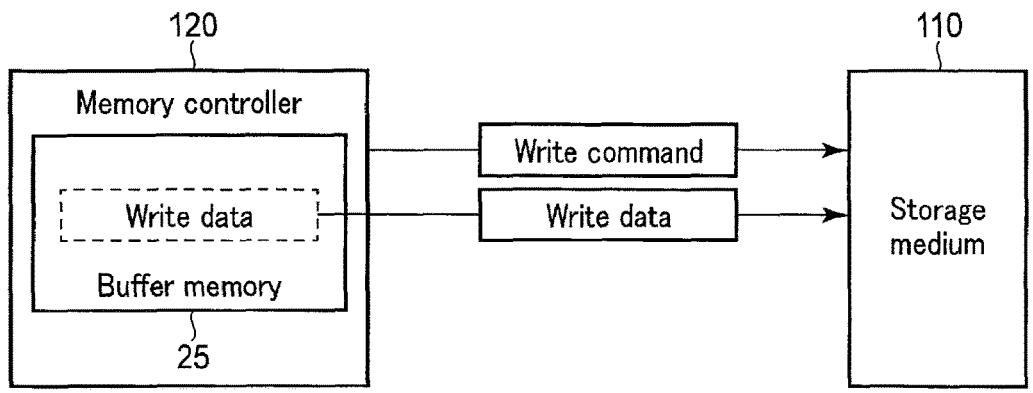
FIG. 8 illustrates an example of signals flowing between a memory controller and the storage medium during a write process in the memory system of the first embodiment.

FIG. 8 illustrates an example of signals flowing between the memory controller 120 and the storage medium 110 during a write process in the memory system 1 of the first embodiment, and illustrates the signals flowing in step S1 of FIG. 7. As illustrated in FIG. 8, the memory controller 120 transmits a write command to the selected storage medium 110t. A write command specifies a cell unit CU to be written in, i.e., a selected cell unit CU, and a page to be written in, i.e., an upper or lower page, in the selected storage medium 110t.

Following the write command, the memory controller 120 transmits write data to the selected storage medium 110t from the buffer memory 25. Once the write data is transmitted to the selected storage medium 110t, the area of the buffer memory 25 having stored the transmitted write data may be released. In this case, the write data is lost from the memory controller 120. Note that the releasing may be performed before completing the write process in the storage medium.

FIG. 9 illustrates an overview of some operations of the memory system of the first embodiment. Specifically, FIG. 9 illustrates operations when, while the memory system 1 is writing the write requested data in the storage medium 110, it is instructed from the host device 2 to read the write requested data, and details of some parts of the flow of the FIG. 7. In FIG. 9, thin arrows indicate transmission of control signals and thick arrows indicate transmission of data.

As illustrated in FIG. 9, in step S3, the host device requests the memory system 1 to read the first read requested data. The read request is received by the translation layer controller 27 (step S3_1). The translation layer controller 27 obtains the physical address storing the first read requested data via address translation, and instructs the command dispatcher 28 to issue a command to perform a read process from the obtained physical address (step S3_2). The physical address specifies a memory space in the selected storage medium 110*t*. Steps S3_1 and S3_2 are part of step S3.

The command dispatcher 28 recognizes, on the basis of the received physical address, that the first read requested data is in the physical address in which the write process of the first write data is in progress in the selected storage medium 100*t*. Specifically, the selected storage medium 100*t* is asserting the busy signal when the command dispatcher 28 receives the read request of the first read requested data. This allows the command dispatcher 28 to recognize that the first read requested data is in the first write data, which is being written in the selected storage medium 100*t*.

When the command dispatcher 28 recognizes the read request specifying the physical address in which the first write data is being written, it requests the write data restoration controller 29 to restore the first write data (step S4_1). Upon reception of the request, the write data restoration controller 29 instructs the NAND controller 26 coupled to the selected storage medium 110*t* (i.e., the selected NAND controller 26*t*) to suspend the write process of the first write data in the selected storage medium 110*t* (step S4_2). Upon reception of the instruction, the selected NAND controller 26*t* transmits, to the selected storage medium 110*t*, a suspend command, which instructs suspension of the process in progress in the selected storage medium 110*t* (step S4_3). Upon reception of the suspend command, the selected storage medium 110*t* suspends the process in progress, i.e., the write process of the first write data. The state of the write process at a suspension may be at various stages depending on a lapsed time from the beginning of the write process of the first write data to the reception of the suspend command. Depending on the stage, part of the first write data is lost in the selected storage medium 110*t*. Steps S4_1, S4_2, and S4_3 are part of step S4.

The write data restoration controller 29 instructs the selected NAND controller 26*t* to read data to be used for restoration (i.e., restoration material data) following transmission of the suspend instruction (step S5_1). The restoration material data is used in order to restore the first write data, which will result in restoring the first read requested data, and will be described in full detail later.

Upon reception of the instruction, the selected NAND controller 26*t* performs a series of processes for reading the restoration material data from the selected storage medium 110*t*. The series of processes include transmitting various one or more read commands to the selected storage medium 110*t* (step S5_2). The read process of the restoration material data will be described in full detail later.

Upon reception of the command, the selected storage medium 110*t* transmits the instructed data, i.e., restoration material data, to the selected NAND controller 26*t* (step S5_3). Upon reception of the restoration material data, the selected NAND controller 26*t* transmits the received restoration material data to the write data restoration controller 29 (step S5_4).

Upon reception of the restoration material data, the write data restoration controller 29 processes the restoration material data to restore the first write data (step S5_5). Details of the restoration will be described in full detail later. Steps S5_1, S5_2, S5_3, S5_4, and S5_5 are part of step S5.

The write data restoration controller 29 uses the ECC circuit 30 to detect errors in the first write data and correct the errors, if any, generates the first read requested data, and transmits the generated first read requested data to the buffer memory 25 (step S6).

Upon the completion of the data restoration, the write data restoration controller 29 instructs the selected NAND controller 26*t* to resume the write process in the selected storage medium 110*t* (step S7_1). Upon reception of the instruction, the selected NAND controller 26*t* transmits a write resume command to the selected storage medium 110*t* (step S7_2). Upon reception of the command, the selected storage medium 110*t* resumes the suspended write process of the first write data. Steps S7_1 and S7_2 are part of step S7.

Upon the completion of the restoration of the data, the write data restoration controller 29 also transmits notification of read completion to the command dispatcher (step S8_1). The read completion notification is transferred to the buffer memory 25 via the translation layer controller 27. Upon reception of the read completion notification, the buffer memory 25 instructs the host interface 21 to output the first read requested data in the buffer memory 25 (step S8_2), and transmits the first read requested data to the host interface 21 (step S8_3). Steps S8_1, S8_2, and S8_3 are part of step S8. The first read requested data is transmitted to the host device 2 via the host interface 21. Thus, the execution of the process requested in step S1 is completed.

Note that the process to transmit the restored data to the host device 2 (steps S5-5, S6, S8_1 to S8_3) and the process to resume the write process (steps S7_1 to S7_2) may be carried out in parallel, or in an order different from that illustrated in FIG. 9.

Referring to FIGS. 10 to 21, restoration of write data is described. As described above, the write data is restored from the restoration material data in the selected storage medium 110*t*. The restoration material data may be in any of various states depending on the stage of the write process. For this reason, prior to description of the write data restoration, an overview of a write process is described with reference to FIGS. 10 to 13.

Figure 10:
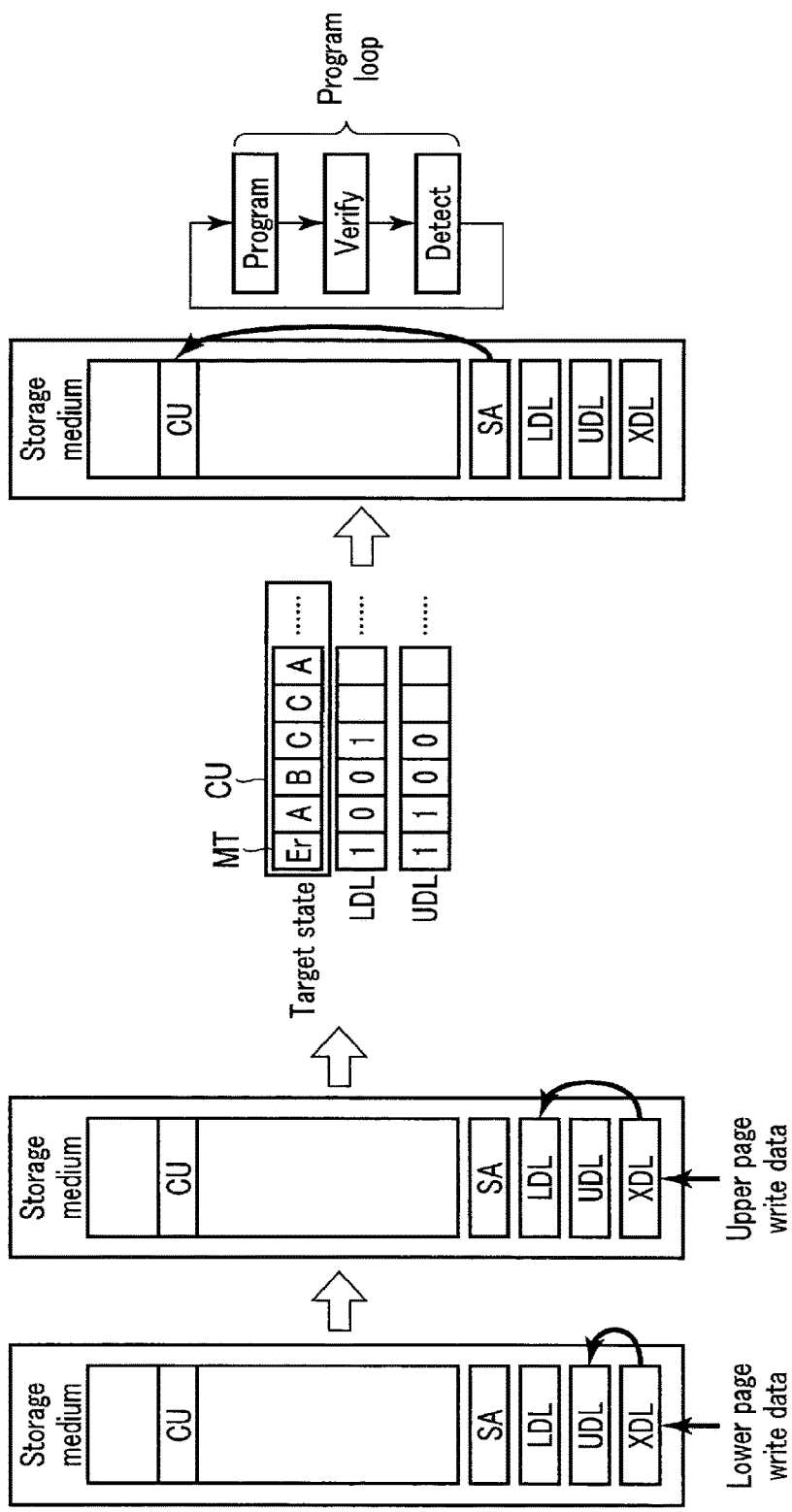
FIG. 10 illustrates a write process in the memory system of the first embodiment.

FIG. 10 illustrates a write process in the memory system 1 of the first embodiment. As illustrated in FIG. 10, a selected storage medium 110*t* as a write target receives data to be written in the lower page of a selected cell unit CU (i.e., lower page write data). The lower page write data is received in the data latch XDL, and then transferred to the data latch UDL.

The selected storage medium 110*t* also receives data to be written in the upper page of the selected cell unit CU (i.e., upper page write data). The upper page write data is received in the data latch XDL, and then transferred to the data latch LDL.

From the upper page write data and lower page write data, it is determined into which one of the states (target state) each selected cell transistor MT in the selected cell unit CU will be written. Each box lined up next to the notation "LDL" or "UDL" respectively indicates one data latch circuit DLC of the data latch LDL or UDL, and the value to be stored therein. The program loops are repeated to the selected transistors MT until each selected cell transistor MT reaches its target state. Each program loop includes a program phase, a verification phase, and a detection phase.

The program phase refers to an operation to apply a program voltage to a selected cell transistor MT to raise its threshold voltage. The verification phase refers to determination whether the selected cell transistor MT has reached the target state. The detection phase refers to counting the selected cell transistors MT which have reached respective target state, and determination whether the program to each state has been completed. Each sense amplifier circuit SAC allows for application of the program voltage until the corresponding cell transistor MT reaches the target state.

FIG. 11 illustrates transitions of voltages applied to word lines WL during a write process in the memory system 1 of the first embodiment over time, and associated signals. As illustrated in FIG. 11, in the first program loop, the sequencer 13 applies a voltage Vpgms to the word line coupled to selected cell unit CU (i.e., a selected word line). In a particular $x^{th}$ (x being a natural number) program loop, the sequencer 13 applies the selected word line WL with a program voltage higher than the program voltage in the $(x-1)^{th}$ program loop by an increment $\Delta$Vpgm.

During the program phase, a bit line BL coupled to a string STR including a selected cell transistor MT whose threshold voltage will be raised is applied with a low voltage (for example, voltage Vss) by the corresponding sense amplifier circuit SAC. This state is referred to as a programmable state. A string STR in a programmable state (i.e., a programmable string STR), is applied with a high voltage via the applied program voltage, and has electrons injected.

A bit line BL coupled to a string STR including a selected cell transistor MT whose threshold voltage will not be raised is applied with a high voltage (for example, voltage Vinh) (Vinh>Vss) by the corresponding sense amplifier circuit SAC. This state is referred to as a program inhibit state. A string STR in a program inhibit state (i.e., a program inhibit string STR), is not applied with a high voltage even via the applied program voltage, and has no or substantially no electrons injected.

In contrast, the sequencer 13 applies the voltage Vpass to unselected word lines WL during a program phase. The voltage Vpass has a magnitude which can suppress a rise of threshold voltage in both unselected cell transistors MT (cell transistors MT other than the selected cell transistors MT) in the programmable strings STR, and the selected transistors MT in the program inhibit strings STR.

In each verification phase, the sequencer 13 applies one or more of the verification voltages AV, BV, and CV to the selected word line WL. During the verification phase, word lines WL other than the selected word line WL (i.e., unselected word lines WL), have the voltage Vread applied, which keeps the unselected transistors MT ON. Thus, whether a current (cell current) flows through each string STR or not depends on ON or OFF of the selected cell transistor MT in that string STR.

In the detection phase in each program loop, the sequencer 13 determines whether selected cell transistors MT of a particular ratio have reached the β-state (β being A, B, or C) among all selected cell transistors MT targeted to a β-state. When this determination result is true, the write process to the β-state is completed and the verification for the β-state is no longer performed in subsequent program loops. The completion of the program to the β-state is indicated by the signal PROCOMP_β transitioning to high.

Sections (a) to (e) of FIG. 12 and sections (a) to (d) of FIG. 13 each illustrate one state of each of the data latches UDL and LDL and the sense amplifier SA during a write process in the memory system of the first embodiment. The boxes lined up next to the notation "UDL" represent data in respective data latch circuits UDLC. The boxes lined up next to the notation "LDL" represent data in respective data latch circuits LDLC. The boxes lined up next to the notation "SA" represent data in the respective sense amplifier circuits SAC. The set of data lined up vertically is included in one associated bit string BS.

For simplicity, among one-page size data in each of the data latches UDL and LDL and sense amplifier SA, only four bits respectively associated with target Er, A, B, and C-state selected cell transistors MT are illustrated.

FIG. 12(a) illustrates the state after lower page write data has been input into the data latch UDL. The lower page write data has data 1, 1, 0, and 0 in bits corresponding to the target Er, A, B, and C-state selected cell transistors MT, respectively.

FIG. 12(b) illustrates the state after upper page write data was input into the data latch LDL. The upper page write data has data 1, 0, 0, and 1 in bits corresponding to the target Er, A, B, and C-state selected cell transistors MT, respectively.

FIG. 12(c) illustrates the state during a particular program loop. Each sense amplifier circuit SAC applies a high voltage (for example, Vinh) to the bit line BL coupled to that sense amplifier circuit SAC to form the program inhibit state when its associated data latch circuits UDLC and LDLC both store data 1. A sense amplifier circuit SAC which forms the program inhibit state is illustrated with "1" therein in the figure. A sense amplifier circuit SAC which forms the programmable state is illustrated with "0" therein in the figure. In section (c) of FIG. 12, the program inhibit state is formed only for the target Er-state by way of example.

FIG. 12(d) illustrates a state during A-state verification being performed in a particular program loop.

Selected cell transistors MT with threshold voltages lower than or equal to the verification voltage βV turn on while they are receiving the verification voltage βV. A cell current flows through a string STR including a turned-on selected cell transistor MT, and the sense amplifier circuit SAC coupled to the turned-on selected cell transistor MT comes to store data 0 on the node which has the sense result (i.e., a sense-result storing node).

In contrast, selected cell transistors MT with threshold voltages higher than the verification voltage βV remain off even when they are receiving the verification voltage βV. A string STR including a turned-off selected cell transistor MT hardly conducts the cell current, and the sense amplifier circuit SAC coupled to the turned-off selected cell transistor MT comes to store data 1 on the sense-result storing node.

In the β-state verification, the sequencer 13 does not subject selected cell transistors MT with a target state lower than β-state to the verification.

The sequencer 13 performs a logical operation (SA&UDL)|LDL on each associated bit string BS. The operand SA is a value of the sense-result storing node of the sense amplifier circuit SAC, and the operands UDL and LDL are the values of the bits in the data latch circuits UDLC and LDLC, respectively. The operator "&" represents the bitwise logical product and the operator "|" represents the bit-wise logical sum. The result of the operation to each associated bit string BS is stored to the bits in the data latch LDL of that bit string BS. This operation affects only the values of the bits in the LDL corresponding to the selected cell transistors MT targeted to the A-state.

When a particular selected cell transistor MT passes the verification, the bit in the data latch LDL of the associated bit string BS corresponding to that selected cell transistor MT comes to have data 1. For this reason, during the write process, the upper page write data loses its original values in the bits corresponding to the selected cell transistors MT which are targeted to A-state and have passed the verification. During the write process, the upper page data contains the verification result, and is different from the original upper page write data. Such data including the verification result and differing from the upper page write data is hereinafter referred to as modified upper page write data.

As program loops repeated, the number of the bits which come to have data 1 in the modified upper page write data increases.

In contrast, in the A-state verification, the selected cell transistors MT targeted to the Er-state are not subject to the verification as described above. This allows the data in the sense amplifier circuits SAC to maintain data 1 in bits corresponding to the selected cell transistors MT targeted to the Er-state. Therefore, the upper page write data under write maintains the values in bits corresponding to the selected cell transistors MT targeted to the Er-state. The operands of the logical operations contain the bits corresponding to the selected cell transistors MT targeted to B or C-states; however the resultant modified upper page write data remains the same values in those bits.

FIG. 12(e) illustrates a state during calculation in a particular program loop including the A-state verification. The sequencer 13 repeatedly performs the A-state verification until the modified upper page write data comes to have data 1 in bits of a number larger than or equal to a first reference value among all the bits corresponding to the target A-state. The first reference value is determined based on the trade-off between the performance, the storage capacity, and/or a required life of the memory system 1, and the correction capability for bit errors after the program. With the condition satisfied, the sequencer 13 forcibly rewrites data 0 to data 1 in all target A-state bits of the modified upper page write data in the data latch LDL. It then determines that the A-state verification has completed. Thus, when the modified upper page write data comes to have data 1 in the bits of a number larger than or equal to the first reference value, the bits which have not passed the β-state verification come to have data 1. Such a bit has not actually reached the target β-state, and therefore it does not store the correct data. Such incorrect data is expected to be corrected by the ECC circuit 30.

FIG. 13(a) illustrates a state during B-state verification being performed in a particular program loop. The sequencer 13 performs logical operations of a first operation (SA&⁻LDL)|UDL, and second operation (SA&⁻UDL)|LDL to each associated bit string BS. The operator "⁻" represents the bit-wise logical negation. These operations affect only the bits in the UDL or the LDL corresponding to the selected cell transistors MT targeted to the B-state. The result of the first operation to each associated bit string BS is stored to the bits in the data latch UDL of that bit string BS, and the result of the second operation to each associated bit string BS is stored to the bits in data latch LDL of that bit string. Upon the pass of the target B-state verification, the modified upper page write data loses its original values in the bits corresponding to the selected cell transistors MT which are targeted to the B-state and have passed the verification.

Similarly, during the write process, the lower page data loses its original values in the bits corresponding to the selected cell transistors MT which are targeted to the B-state and have passed the verification. During the write process, the lower page data contains the verification result, and is different from the original lower page write data. Such data including the verification result and differing from the lower page write data is hereinafter referred to as modified lower page write data.

In contrast, in the B-state verification, the selected cell transistors MT targeted to Er or A-state are not subject to the verification as described above. This allows the data in the sense amplifier circuits SAC to maintain data 1 in bits corresponding to the target Er or A-state selected cell transistors MT. Therefore, the modified upper page write data maintains the values in bits corresponding to the target Er or A-state selected cell transistors MT. Similarly, the modified lower page write data maintains the values in bits corresponding to the target Er or A-state selected cell transistors MT. The operands of the logical operations contain the bits corresponding to the selected cell transistors MT targeted to C-state; however the resultant modified upper page write data remains the same values in those bits.

FIG. 13(b) illustrates a state during calculation in a particular program loop including the B-state verification.

The sequencer 13 repeatedly performs the B-state verification until the modified upper and/or lower page write data comes to have data 1 in bits of a number larger than or equal to a second reference value among all the bits corresponding to the target B-state. The second reference value is determined based on the trade-off between the performance, the storage capacity, and/or a required life of the memory system 1, and the correction capability for bit errors after the program. With the condition satisfied, the sequencer 13 forcibly rewrites data 0 to data 1 in all target B-state bits of the modified upper and lower page write data in the data latches LDL and UDL. It then determines that the B-state verification has completed.

FIG. 13(c) illustrates a state during C-state verification being performed in a particular program loop. The sequencer 13 performs a logical operation SA|UDL on each associated bit string BS. The result of the operation to each associated bit string BS is stored to the bits in the data latch UDL of that bit string BS. This operation affects only the values of the bits in the UDL corresponding to the selected cell transistors MT targeted to the C-state. Upon the pass of the target C-state verification, the modified lower page write data loses its original values in the bits corresponding to the selected cell transistors MT which are targeted to the C-state and have passed the verification.

In contrast, in the C-state verification, the target Er, A, or B-state selected cell transistors MT are not subject to the verification as described above. This allows the data in the sense amplifier circuits SAC to maintain data 1 in bits corresponding to the target Er, A, or B-state selected cell transistors MT. Therefore, the modified lower page write data maintains the values in bits corresponding to the target Er, A, or B-state selected cell transistors MT.

FIG. 13(d) illustrates a state during calculation in a particular program loop including the C-state verification. The sequencer 13 repeatedly performs the C-state verification until the modified lower page write data comes to have data 1 in bits of a number larger than or equal to a third reference value among all the bits corresponding to the target C-state. The third reference value is determined based on the trade-off between the performance, the storage capacity, and/or a required life of the memory system 1, and the correction capability for bit errors after the program. With the condition satisfied, the sequencer 13 forcibly rewrites data 0 to data 1 in all target C-state bits of the modified lower page write data in the data latch UDL. It then determines that the C-state verification has completed.

Figure 14:
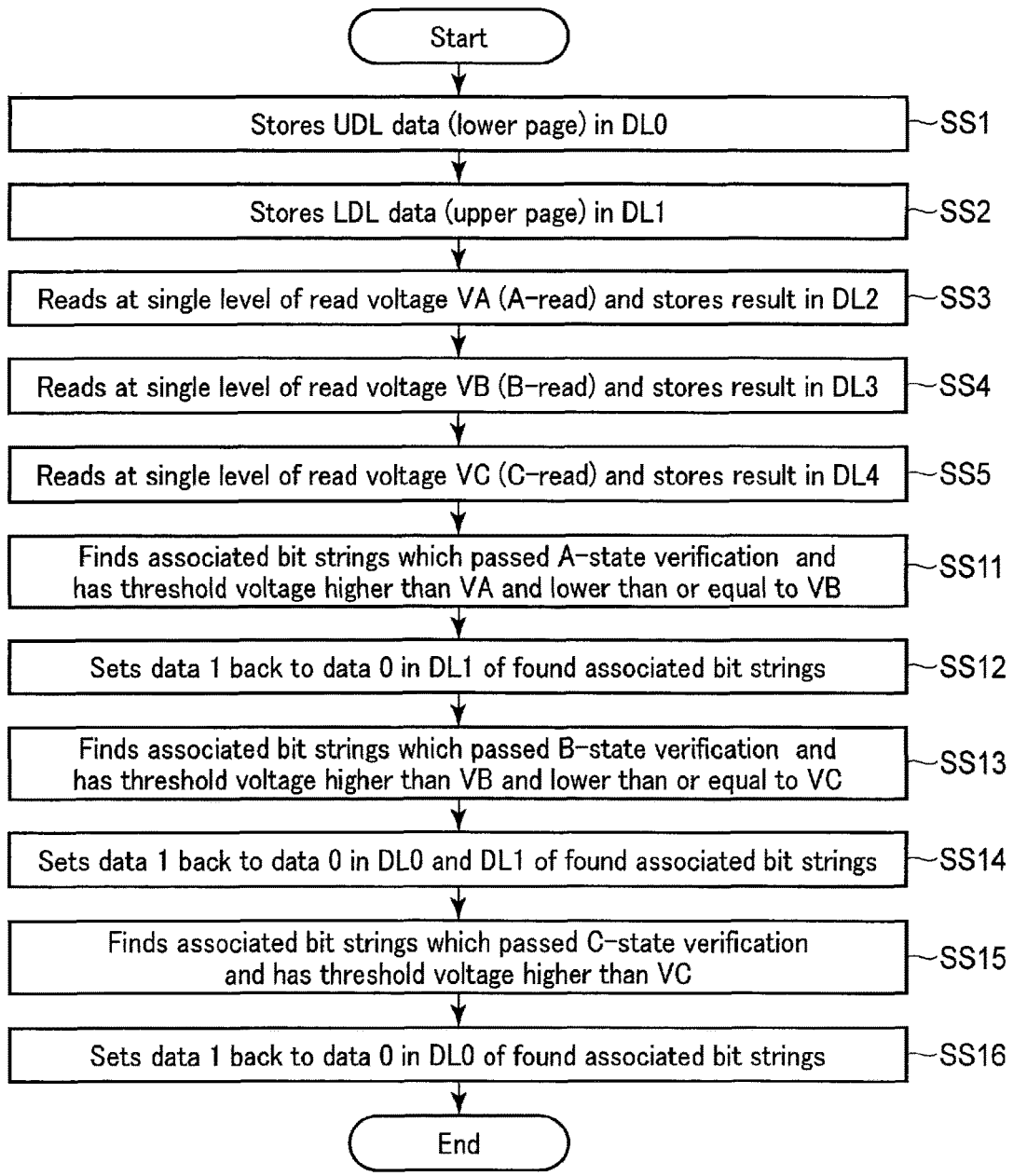
FIG. 14 illustrates a schematic flow of overall write data restoration in the memory system of the first embodiment.

FIG. 14 illustrates a flow of overall write data restoration in the memory system 1 of the first embodiment.

Substeps SS1, SS2, SS3, SS4, and SS5 correspond to details of steps S5_1 to S5_4 of FIG. 9. In substep SS1, the write data restoration controller 29 transmits a command instructing the output of the data in the data latch UDL (i.e., a UDL-read command), to the selected storage medium 110t via the command dispatcher 28 and the selected NAND controller 26t. Upon reception of the command, the selected storage medium 110t transmits to the memory controller 120 the data in the data latch UDL (i.e., UDL data). The UDL data is received by the memory controller 120, and then stored in the data storing area DL0 by the control of the write data restoration controller 29.

In substep SS2, the write data restoration controller 29 transmits a command instructing the output of the data in the data latch LDL (i.e., an LDL-read command), to the selected storage medium 110t via the command dispatcher 28 and the selected NAND controller 26t. Upon reception of the command, the selected storage medium 110t transmits to the memory controller 120 the data in the data latch LDL (i.e., LDL data). The LDL data is received by the memory controller 120, and then stored in the data storing area DL1 by the control of the write data restoration controller 29.

In substep SS3, the write data restoration controller 29 transmits to the selected storage medium 110t a command instructing a single-level read with the restoration read voltage VA specified (i.e., A-read process) from a selected cell unit CU (i.e., an A-read command), via the command dispatcher 28 and the selected NAND controller 26t.

A single-level read command with a read voltage Vβ specified instructs a read process from one selected cell unit CU with a single read voltage Vβ used. Upon reception of the single-level read command with the read voltage Vβ specified, the selected storage medium 110t reads data from the selected cell unit CU with the read voltage Vβ, and transmits the read data (i.e., single-level read data) to the memory controller 120. Single-level read data includes a set of bits which are based on respective threshold voltages of the selected cell transistors MT in the selected cell unit CU. The single-level read data has data 0 in each bit when the corresponding selected cell transistor MT has a threshold voltage lower than or equal to the read voltage V. The single-level read data has data in each bit when the corresponding selected cell transistor MT has a threshold voltage higher than the read voltage Vβ.

Upon reception of the A-read command in substep SS3, the selected storage medium 110t performs the single-level read with the restoration read voltage VA to the selected cell unit CU, and transmits to the memory controller 120 the read data (i.e., AR-data). The AR-data is received by the memory controller 120, and stored in the data storing area DL2 by the control of the write data restoration controller 29.

In substep SS4, the write data restoration controller 29 transmits to the selected storage medium 110t a command instructing the single-level read with the restoration read voltage VB specified (i.e., B-read process) from a selected cell unit CU (i.e., a B-read command), via the command dispatcher 28 and the selected NAND controller 26t.

Upon reception of the B-read command, the selected storage medium 110t performs the single-level read with the restoration read voltage VB to the selected cell unit CU, and transmits to the memory controller 120 the read data (i.e., BR-data). The BR-data is received by the memory controller 120, and stored in the data storing area DL3 by the control of the write data restoration controller 29.

In substep SS5, the write data restoration controller 29 transmits to the selected storage medium 110t a command instructing the single-level read with the restoration read voltage VC specified (i.e., C-read process) from a selected cell unit CU (i.e., a C-read command), via the command dispatcher 28 and the selected NAND controller 26t.

Upon reception of the C-read command, the selected storage medium 110t performs the single-level read with the restoration read voltage VC to the selected cell unit CU, and transmits to the memory controller 120 the read data (i.e., CR-data). The CR-data is received by the memory controller 120, and stored in the data storing area DL4 by the control of the write data restoration controller 29.

The described order of substeps SS1 to SS5 is an example, and substeps SS1 to SS5 can be performed in any order.

Substeps SS11, SS12, SS13, SS14, SS15, and SS16 correspond to details of step S5_5 of FIG. 9. In substeps SS11 to SS16, the write data restoration controller 29 performs various logical operations described in the following to each associated bit string BS. The result of the logical operation to each associated bit string BS is stored in a below-mentioned one bit in that associated bit string BS.

In substep SS11, the write data restoration controller finds associated • bit strings BS associated with the selected cell transistors MT which have passed the A-state verification and have threshold voltages higher than the restoration read voltage VA and lower than or equal to the restoration read voltage VB (i.e., the selected cell transistors MT which satisfy condition 1). To this end, the write data restoration controller 29 performs a logical operation 1a of formula DL0&DL1&DL2&⁻DL3&⁻DL4 on each associated bit string BS, for example. The result of the logical operation 1a on each associated bit string BS is stored in the bit in the data storing area DL5 of that associated bit string BS.

In substep SS12, the write data restoration controller sets data 1 back to data 0 in the bit in the data storing area DL1 in each associated bit string BS found in substep SS11. To this end, the write data restoration controller 29 performs a logical operation 1b of formula ⁻DL5&DL1 on each associated bit string BS, for example. The result of the logical operation 1b on each associated bit string BS is stored in the bit in the data storing area DL1 of that associated bit string BS.

In substep SS13, the write data restoration controller 29 finds associated bit strings BS associated with selected cell transistors MT which have passed the B-state verification and have threshold voltages higher than the restoration read voltage VB and lower than or equal to the restoration read voltage VC (i.e., the selected cell transistors MT which satisfy the condition 2). To this end, the write data restoration controller 29 performs a logical operation 2a of formula DL0&DL1&DL3&⁻DL4 on each associated bit string BS, for example. The result of the logical operation 2a on each associated bit string BS is stored in the bit, in the data storing area DL5 of that associated bit string BS.

In substep SS14, the write data restoration controller sets data 1 back to data 0 in the bit in the data storing area DL0 in each associated bit string BS found in substep SS13. To this end, the write data restoration controller 29 performs a logical operation 2b of formula ⁻DL5&DL0 on each associated bit string BS, for example. The result of the logical operation 2b on each associated bit string BS is stored in the bit in the data storing area DL0 of that associated bit string BS.

In substep SS14, the write data restoration controller 29 also sets data 1 back to data 0 in the bit in the data storing area DL1 in each associated bit string BS found by substep SS13. To this end, the write data restoration controller 29 performs a logical operation 2c of formula $^-$DL5&DL1 on each associated bit string BS, for example. The result of the logical operation 2c on each associated bit string BS is stored in the bit in the data storing area DL1 of that associated bit string BS.

In substep SS15, the write data restoration controller 29 finds associated bit strings BS associated with the selected cell transistors MT which have passed the C-state verification and have threshold voltages higher than the restoration read voltage VC (i.e., the selected cell transistors MT which satisfy the condition 3). To this end, the write data restoration controller 29 performs a logical operation 3a of formula DL0&DL1&DL4 on each associated bit string BS, for example. The result of the logical operation 3a on each associated bit string BS is stored in the bit in the data storing area DL5 of that associated bit string BS.

In substep SS16, the write data restoration controller sets data 1 back to data 0 in the bit in the data storing area DL0 in each associated bit string BS found in substep SS15. To this end, the write data restoration controller 29 performs a logical operation 3b of formula $^-$DL5&DL0 on each associated bit string BS, for example. The result of the logical operation 3b on each associated bit string BS is stored in the bit in the data storing area DL0 of that associated bit string BS.

The execution of substeps SS11 to SS16 restores the lower page write data in the data storing area DL0, and the upper page write data in the data storing area DL1.

FIG. 15 illustrates an example of the signals DQ (DQ0 to DQ7) flowing between the memory controller 120 and the selected storage medium 110$t$ of the first embodiment. Specifically, FIG. 15 illustrates the signals DQ flowing in steps S2, S4, S5, and S7 of FIG. 7. The memory controller 120 transmits first write data and a write command instructing a write process of the first write data to the selected storage medium 110$t$. Then, based on the determination of write suspension, the memory controller 120 transmits a suspend command to the selected storage medium 110$t$.

The memory controller 120 transmits the UDL-read command to the selected storage medium 110$t$. Upon reception of the UDL-read command, the selected storage medium 110$t$ transmits UDL data to the memory controller 120.

The memory controller 120 transmits the LDL-read command to the selected storage medium 110$t$. Upon reception of the LDL-read command, the storage medium 110$t$ transmits LDL data to the memory controller 120.

The memory controller 120 transmits the A-read command to the selected storage medium 110$t$. Upon reception of the A-read command, the selected storage medium 110$t$ transmits AR-data from the selected cell unit CU to the memory controller 120.

The memory controller 120 transmits the B-read command to the selected storage medium 110$t$. Upon reception of the B-read command, the selected storage medium 110$t$ transmits BR-data from the selected cell unit CU to the memory controller 120.

The memory controller 120 transmits the C-read command to the selected storage medium 110$t$. Upon reception of the C-read command, the selected storage medium 110$t$ transmits CR-data from the selected cell unit CU to the memory controller 120.

The memory controller 120 transmits the write resume command to the selected storage medium 110$t$.

Referring to FIGS. 16 to 21, transitions of states of associated bit strings BS during write data restoration will now be described. FIGS. 16 to 20 illustrate states of some associated bit strings BS during write data restoration in the memory system 1 of the first embodiment. Specifically, FIGS. 16 to 20 illustrate associated bit strings BS associated with the target Er, A, B, or C-state selected cell transistors MT. For the target A, B and C-states, associated bit strings BS associated with selected cell transistors MT which have passed and failed the verification are both illustrated.

Figure 16:
FIG. 16 illustrates states of some associated bit strings during the write data restoration in the memory system of the first embodiment.

FIG. 16($a$) illustrates states of associated bit strings BS reached in substeps SS1 and SS2. Depending on the progress of the write process in the selected storage medium 110$t$ upon the suspension, the UDL data has its part lost and hence is modified lower page write data. Specifically, bits corresponding to the target B-state selected cell transistors MT which have passed the verification have changed to 1. In contrast, bits corresponding to the target B-state selected cell transistors MT which have not passed the verification maintain 0. Similarly, bits corresponding to the target C-state selected cell transistors MT which have passed the verification have changed to 1. Bits corresponding to the target C-state selected cell transistors MT which have not passed the verification maintain 0. For the lost lower page write data in the data latch UDL to be restored, the target B or C-state bits with values changed to 1 need to be found in the modified lower page write data, and the found bits need to be set back to 0.

Similarly, depending on the progress of the write in the selected storage medium 110$t$ upon the suspension of the write process, part of the LDL data is lost, and hence the LDL data is modified upper page write data. Specifically, bits corresponding to the target A-state selected cell transistors MT which have passed the verification have changed to 1. In contrast, bits corresponding to the target A-state selected cell transistors MT which have not passed the verification maintain 0. Similarly, bits corresponding to the target B-state selected cell transistors MT which have passed the verification have changed to 1. Bits corresponding to the target B-state selected cell transistors MT which have not passed the verification maintain 0. For the lost upper page write data in the data latch LDL to be restored, the target A, B, or C-state bits with values changed to 1 need to be found in the modified upper page write data, and the found bits need to be set back to 0.

FIG. 16($b$) illustrates states of associated bit strings BS reached in substep SS3. The AR-data in the data storing area DL2 has values in respective bits based on the target states and the threshold voltages upon the read process of the selected cell transistors MT. The AR-data has data 0 in bits of the selected cell transistors MT with threshold voltages lower than or equal to the restoration read voltage VA. The AR-data has data 1 in bits of the selected cell transistors MT with threshold voltages higher than the restoration read voltage VA. The AR-data has data 0 in bits of the target Er-state selected cell transistors MT. The AR-data has data 0 or 1 in bits of the target A, B or C-state selected cell transistors MT.

FIG. 17($a$) illustrates states of associated bit strings BS reached in substep SS4. The BR-data in the data storing area DL3 has data 0 in bits of the target Er or A-state selected cell transistors MT. In contrast, the BR-data has data 0 or 1 in bits of the target B or C-state selected cell transistors MT.

FIG. 17(b) illustrates states of associated bit strings BS reached in substep SS5. The CR-data in the data storing area DL4 has data 0 in bits of the target Er, A, or B-state selected cell transistors MT. In contrast, the CR-data has data 0 or 1 in bits of the target C-state selected cell transistors MT.

FIG. 18(a) illustrates states of associated bit strings BS reached in substep SS11. As a result of the logical operation 1a, the data storing area DL5 has data 1 in bits corresponding to selected cell transistors MT which satisfy the condition 1 (i.e., which have passed the A-state verification and have threshold voltages higher than the restoration read voltage VA and lower than or equal to the restoration read voltage VB), and data 0 in bits corresponding to selected cell transistors MT which do not satisfy the condition 1.

FIG. 18(b) illustrates states of associated bit strings BS reached in substep SS12. As a result of the logical operation 1b, the data storing area DL1 has data 0 in bits corresponding to selected cell transistors MT which satisfy the condition 1. In contrast, the logical operation 1b does not affect data in the bits of the data storing area DL1 corresponding to the associated bit strings BS that have data 0 in the data storing area DL5. The data in the data storing area DL1 is what has been stored in the data latch LDL before the modification, i.e., the original upper page write data. Thus, the step of section (b) of FIG. 18 restores data of the target A-state bits in the upper page write data.

FIG. 19(a) illustrates states of associated bit strings BS reached in substep SS13. As a result of the logical operation 2a, the data storing area DL5 has data 1 in bits corresponding to selected cell transistors MT which satisfy the condition 2 (i.e., which have passed the B-state verification and have threshold voltages higher than the restoration read voltage VB and lower than or equal to the restoration read voltage VC), and data 0 in bits corresponding to selected cell transistors MT which do not satisfy the condition 2.

Figure 19:
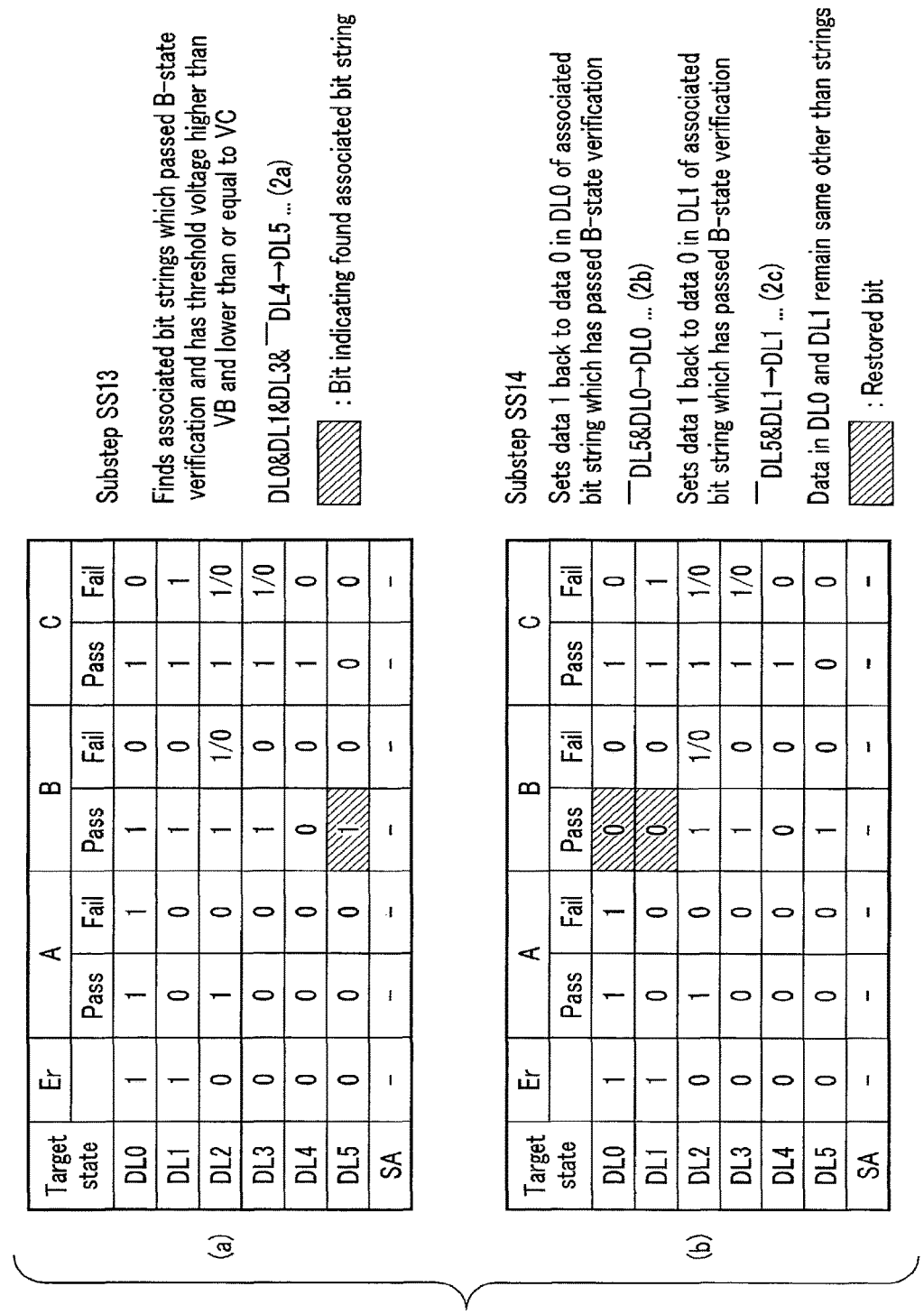
FIG. 19 illustrates states of some associated bit strings during the write data restoration in the memory system of the first embodiment.

FIG. 19(b) illustrates states of associated bit strings BS reached in substep SS14. As a result of the logical operation 2b, the data storing area DL0 has data 0 in bits corresponding to selected cell transistors MT which satisfy the condition 2. In contrast, the logical operation 2b does not affect data in the bits of the data storing area DL0 corresponding to the associated bit strings BS that have data 0 in the data storing area DL5. The data in the data storing area DL0 is what has been stored in the data latch UDL before the modification, i.e., the original lower page write data. Thus, the step of section (b) of FIG. 19 restores data of the target B-state bits in the lower page write data.

Moreover, as a result of the logical operation 2c, the data storing area DL1 has data 0 in bits corresponding to selected cell transistors MT which satisfy the condition 2. In contrast, the logical operation 2c does not affect data in the bits of the data storing area DL1 corresponding to the associated bit strings BS that have data 0 in the data storing area DL5. The step of section (b) of FIG. 19 restores data of the target B-state bits in the upper page write data.

FIG. 20(a) illustrates states of associated bit string BS reached in substep SS15. As a result of the logical operation 3a, the data storing area DL5 has data 1 in bits corresponding to selected cell transistors MT which satisfy the condition 3 (i.e., which have passed the C-state verification and have threshold voltages higher than the restoration read voltage VC), and data 0 in bits corresponding to selected cell transistors MT which do not satisfy the condition 3.

Figure 20:
FIG. 20 illustrates states of some associated bit strings during the write data restoration in the memory system of the first embodiment.

FIG. 20(b) illustrates states of associated bit strings BS reached in substep SS16. As a result of the logical operation 3b, the data storing area DL0 has data 0 in bits corresponding to selected cell transistors MT which satisfy the condition 3. In contrast, the logical operation 3b does not affect data in the bits of the data storing area DL0 corresponding to the associated bit strings BS that have data 0 in the data storing area DL5. The step of section (b) of FIG. 20 restores data of the target C-state bits in the lower page write data.

Figure 21:
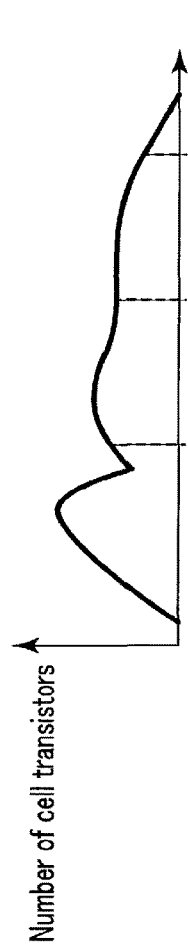
FIG. 21 illustrates states of some associated bit strings during the write data restoration in the memory system of the first embodiment.

FIG. 21 illustrates states of some associated bit strings BS during the write data restoration in the memory system 1 of the first embodiment, in a different form from FIGS. 16 to 20. Bits lined up vertically are those included in one associated bit string BS.

The first row indicates the state reached in substep SS1. The data storing area DL0 stores data in the data latch UDL upon the write suspension. This data is the modified lower page write data which has data 1 in bits which have passed the verification. The modified lower page write data has data 1 instead of data 0 as shaded with top-left to bottom-right diagonals in bits of selected cell transistors MT that are targeted to and actually in the B-state upon the write suspension, and in bits of selected cell transistors MT that are targeted to and actually in the C-state upon the write suspension.

The second row indicates the state reached in substep SS2. The data storing area DL1 stores data in the data latch LDL upon the write suspension. This data is the modified upper page write data which has data 1 in bits which have passed the verification. The modified upper page write data has data 1 instead of data 0 as shaded with top-left to bottom-right diagonals in bits of selected cell transistors MT that are targeted to and actually in the A-state, and in bits of selected cell transistors MT that are targeted to and actually in the B-state.

As illustrated in the third row, associated bit strings BS which includes data 1 in bits in both data storing areas DL0 and DL1 are found. In the found bits included in the found associated bit strings BS (except for those corresponding to the Er-state), values have been changed from those of the write data. A bit in which the current state matches with the target state has data 1.

The fourth row illustrates AR-data. The AR-data has a data 1 in bits of selected cell transistors MT in the A, B, or C-state, and data 0 in bits of selected cell transistors MT in the Er-state.

The fifth row illustrates BR-data. The BR-data has data 1 in bits of selected cell transistors MT in the B or C-state, and data 0 in bits of selected cell transistors MT in the Er or A-state.

The sixth row illustrates CR-data. The CR-data has data 1 in bits of selected cell transistors MT in the C-state, and data 0 in bits of selected cell transistors MT in the Er, A, or B-state.

The seventh row illustrates the result of the logical operation 1a. The result of the logical operation 1a has data 1 in bits of selected cell transistors MT that are targeted to and actually in the A-state as shaded with top-right to bottom-left diagonals, and data 0 in the other bits.

The eighth and ninth rows illustrate the result of the logical operation 1b. The logical operation 1b restores data 0 in bits of selected cell transistors MT that are targeted to and actually in the A-state in the data storing area DL1 as shaded with top-right to bottom-left diagonals, and maintains the values in the other bits.

The tenth row illustrates the result of the logical operation 2a. The result of the logical operation 2a has data 1 in bits of selected cell transistors MT that are targeted to and actually in the B-state as shaded with top-right to bottom-left diagonals, and data 0 in the other bits.

The eleventh and twelfth rows illustrate the results of the logical operations 2b and 2c, respectively. The logical operation 2b restores data 0 in bits of selected cell transistors MT that are targeted to and actually in the B-state in the data storing area DL0 as shaded with top-right to bottom-left diagonals, and maintains the values in the other bits.

The logical operation 2c restores data 0 in bits of selected cell transistors MT that are targeted to and actually in the B-state in the data storing area DL1 as shaded with top-right to bottom-left diagonals, and maintains the values in the other bits.

The thirteenth row illustrates the result of the logical operation 3a. The result of the logical operation 3a has data 1 in bits of selected cell transistors MT that are targeted to and actually in the C-state, and data 0 in the other bits as shaded with top-right to bottom-left diagonals.

The fourteenth and fifteenth rows illustrate the result of the logical operation 3b. The logical operation 3b restores data 0 in bits of selected cell transistors MT that are targeted to and actually in the C-state in the data storing area DL0 as shaded with top-right to bottom-left diagonals, and maintains the values in the other bits. By the operations described above, the lower page write data and the upper page write data have been restored in the data storing area DL0 and DL1, respectively.

<1-3. Advantages>

The memory system 1 of the first embodiment can restore the write data lost from the memory controller 120 and being written in the storage medium 110. Details are as follows.

The host device 2 may request the memory system 1 to write particular data, and immediately thereafter to read that data. Moreover, a read request may be received by the memory controller 120 after write requested data starts to be written and before the write thereof is completed. In such a case, the data requested to be written from the host device 2 is lost from the memory controller 120 as described above. In addition, the data requested to be written is lost also from the storage medium 110. This is because the write data is partially overwritten by data indicating the progress of the write in the data latch set 18 as described above. In addition, the storage medium 110 cannot read data which has not been completed to be written from the selected cell transistors MT.

When the memory system 1 of comparative example receives such a request to read the write requested data before the write is completed, it cannot output the requested read requested data before the write is completed. Such a read process, however, may be unable to satisfy performance requirements for read commands imposed on the memory system 1. This is because only a short time is acceptable from the reception of the read request to output of the read requested data by the memory system 1, whereas the storage medium 110 takes significantly more time, to complete a write process, than the acceptable time.

In order to address such a problem to satisfy the performance request, the storage medium 110 may hold the write data until the write completion. This, however, requires the storage medium 110 to have an additional data latch DL like the data latch LDL or UDL as well as those in FIG. 6. This in turn requires an increased area of the chip of the storage medium 110; however such an increased chip area may be undesirable.

Alternatively, write data may be stored in the buffer memory 25 until the write completion. This, however, requires an increased capacity of the buffer memory 25. An increased capacity of the buffer memory 25 leads to an increment in price of the memory controller 120, the chip area of the memory controller 120, and/or power consumption, which may also be undesirable.

The memory controller 120 of the first embodiment reads material data (the modified write data, from the data latches UDL and LDL, from which some bits of original write data have been lost (i.e., modified lower or upper page write data), and the AR-data, the BR-data, and the CR-data from a selected cell unit CU), and restores the write data using the modified write data, AR-data, BR-data, and CR-data. Thus, the write data can be restored using material data available in the storage medium 110 upon start of the restoration. Therefore, the memory controller 120 does not need to wait for the write process to be completed, in order to obtain the data being written. This makes it easier for the memory system 1 to satisfy the performance requirements for read time imposed on the memory system 1.

Moreover, the restoration of the write data from material data available in the storage medium 110 does not require the memory controller 120 to have a capability to hold the write data until the completion of write process of the write data. This obviates the need for the buffer memory 25 to have the capacity for storing the write data after transmitting to the storage medium 110.

Furthermore, the restoration of the write data with data available in the storage medium 110 does not require the storage medium 110 to have a capability to hold the write data until the completion of write process of the write data. This requires no additional data latch for storing the write data.

<1-4. Others>

The logical formulae for finding and restoring bits modified due to having passed verification are based on the example for correspondence between the states and the data storing states illustrated in FIG. 5. With another correspondence, other logical formulae may be used. The first embodiment is not limited by details of the logical formula so long as bits modified due to pass of verification of corresponding selected cell transistors MT can be found and data can be restored in the found bits in the write data based on the state encoding rule, which defines correspondences between the threshold voltages (the states) and the assigned bit values to the pages.

The descriptions above are based on the example of storing two-bit data per one cell transistor MT by way of example. The first embodiment, however, is not limited to this example, but is applicable to storing of data of three bits or more per one cell transistor MT. In that case, any logical formulae can be used which allow bits modified due to pass of verification of corresponding selected cell transistors MT to be found in the modified write data and allow the found bits to be restored as described above based on the state encoding rule, which defines correspondences between the threshold voltages (the states) and the assigned bit values to the pages.

Second Embodiment

The second embodiment differs from the first embodiment in the details of restoration material data. Aspects different from those of the first embodiment are mainly described in the following.

<2-1. Structure (Configuration)>

The memory system 1 of the second embodiment has the same components and connections as the memory system 1 of the first embodiment. In contrast, the memory controller 120 of the second embodiment is configured to perform operations described in the following, and specifically, the firmware in the ROM 24 is configured to cause the memory controller 120 to perform the operations described in the following.

<2-2. Operations>

Figure 22:
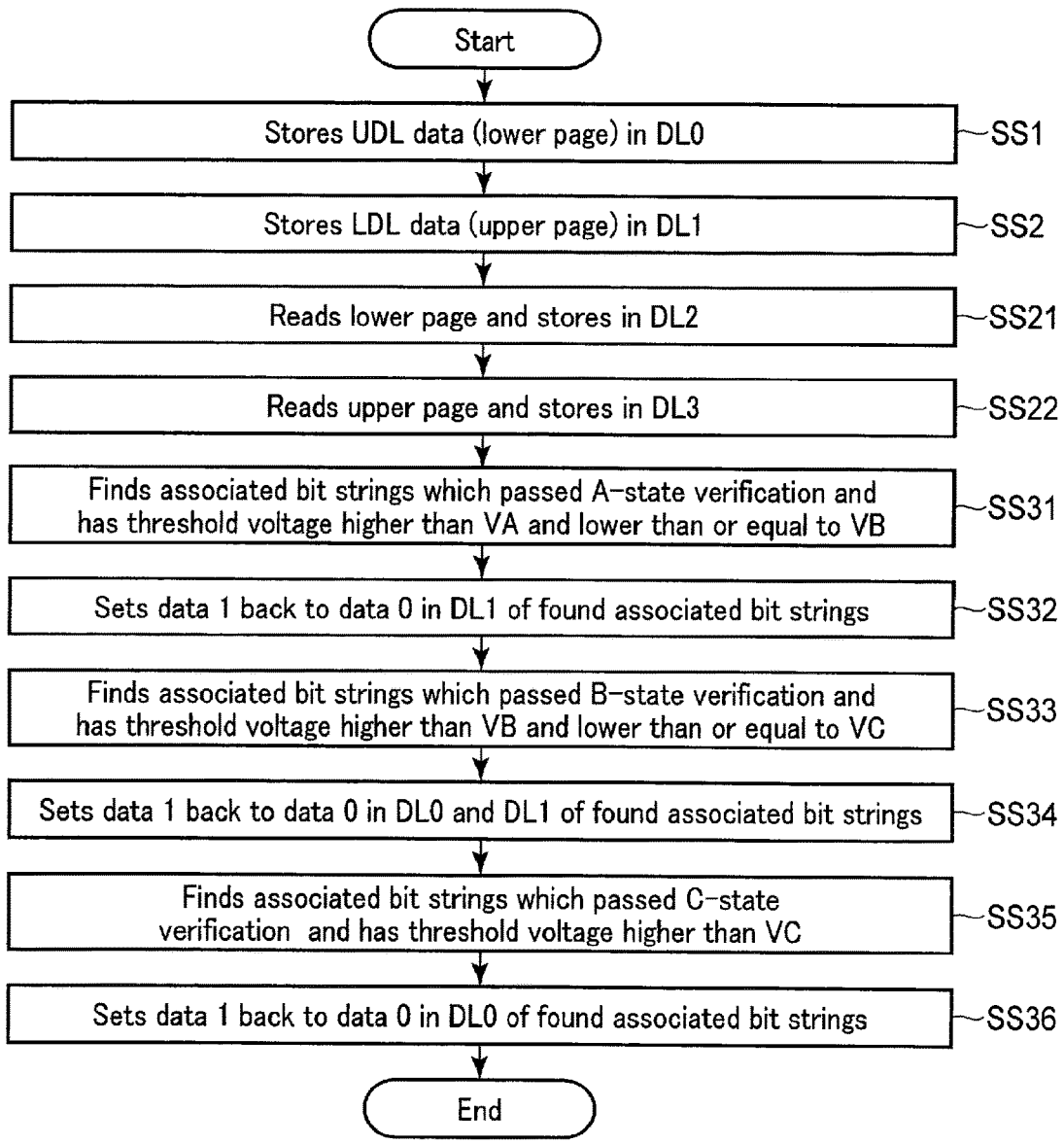
FIG. 22 illustrates a schematic flow of overall write data restoration in a memory system of a second embodiment.

FIG. 22 illustrates a flow of overall write data restoration in the memory system 1 of the second embodiment.

Substeps SS1, SS2, SS21, and SS22 correspond to details of steps S5_1 to S5_4 of FIG. 9. Substep SS2 proceeds to substep SS21.

In substep S21, the write data restoration controller 29 transmits to a selected storage medium 110$t$ a command instructing a read process of data from the lower page (i.e., lower page read process) of a selected cell unit CU (i.e., a lower page read command), via the command dispatcher 28 and a selected NAND controller 26$t$.

Upon reception of the lower page read command, the selected storage medium 110$t$ performs the lower page read process on the selected cell unit CU, and transmits the read data (i.e., lower page data), to the memory controller 120. The lower page data includes a set of bits based on respective threshold voltages of selected cell transistors MT in the selected cell unit CU. The lower page data has data 0 in each bit when the corresponding selected cell transistor MT is in the B or C-state, and data 1 in each bit when the corresponding selected cell transistor MT is in the Er or A-state. The lower page data is received by the memory controller 120, and stored in the data storing area DL2 by the control of the write data restoration controller 29.

In the lower page read process in substep SS21, the restoration read voltage VB may be specified and used instead of read voltage VB'.

In substep S22, the write data restoration controller 29 transmits, to the selected storage medium 110$t$ a command instructing a read process of data from the upper page (i.e., upper page read process) of a selected cell unit CU (i.e., an upper page read command), via the command dispatcher 28 and the selected NAND controller 26$t$.

Upon reception of the upper page read command, the selected storage medium 110$t$ performs the upper page read process on the selected cell unit CU, and transmits the read data (i.e., upper page data), to the memory controller 120. The upper page data includes a set of bits based on respective threshold voltages of selected cell transistors MT in the selected cell unit CU. The upper page data has data 0 in each bit when the corresponding selected cell transistor MT is in the A or B-state, and data 1 in each bit when the corresponding selected cell transistor MT is in the Er or C-state. The upper page data is received by the memory controller 120, and stored in the data storing area DL3 by the control of the write data restoration controller 29.

In the upper page read process in substep SS22, the restoration read voltages VA and VC may be specified and used instead of read voltages VA' and VC'.

Substeps SS31, SS32, SS33, SS34, SS35, and SS36 correspond to details of step S5_5 of FIG. 9. Substeps SS31 to SS36 are respectively similar to substeps SS11 to SS16 of the first embodiment, but differ in the formula of logical operations.

In substep SS31, the write data restoration controller 29 finds associated bit strings BS associated with selected cell transistors MT which have passed the A-state verification and have threshold voltages higher than the restoration read voltage VA and lower than or equal to the restoration read voltage VB (i.e., selected cell transistors MT which satisfy the condition 1). To this end, the write data restoration controller 29 performs a logical operation 11a of formula DL0&DL1&DL2&¯DL3 on each associated bit string BS, for example. The result of the logical operation 11a on each associated bit string BS is stored in the bit in the data storing area DL4 of that associated bit string BS.

In substep SS32, the write data restoration controller 29 sets data 1 back to data 0 in the data storing area DL1 in the bit included in each associated bit string BS found in substep SS31. To this end, the write data restoration controller 29 performs a logical operation 11b of formula ¯DL4&DL1 on each associated bit string BS, for example. The result of the logical operation 11b on each associated bit string BS is stored in the bit in the data storing area DL1 of that associated bit string BS.

In substep SS33, the write data restoration controller 29 finds associated bit strings BS associated with selected cell transistors MT which have passed the B-state verification and have threshold voltages higher than the restoration read voltage VB and lower than or equal to the restoration read voltage VC (i.e., selected cell transistors MT which satisfy the condition 2). To this end, the write data restoration controller 29 performs a logical operation 12a of formula DL0&DL1&¯DL2&¯DL3 on each associated bit string BS, for example. The result of the logical operation 12a on each associated bit string BS is stored in the bit in the data storing area DL4 of that associated bit string BS.

In substep SS34, the write data restoration controller 29 sets data 1 back to data 0 in the data storing area DL0 in the bit included in each associated bit string BS found in substep SS33. To this end, the write data restoration controller 29 performs a logical operation 12b of formula ¯DL4&DL0 on each associated bit string BS, for example. The result of the logical operation 12b on each associated bit string BS is stored in the bit in the data storing area DL0 of that associated bit string BS.

In substep SS34, the write data restoration controller 29 also sets data 1 back to data 0 in the data storing area DL1 in the bit included in each associated bit string BS found in substep SS33. To this end, the write data restoration controller 29 performs a logical operation 12c of formula ¯DL4&DL1 on each associated bit string BS, for example. The result of the logical operation 12c on each associated bit string BS is stored in the bit in the data storing area DL1 of that associated bit string BS.

In substep SS35, the write data restoration controller 29 finds associated bit strings BS associated with selected cell transistors MT which have passed the C-state verification and have threshold voltages higher than the restoration read voltage VC (i.e., selected cell transistors MT which satisfy the condition 3). To this end, the write data restoration controller 29 performs a logical operation 13a of formula DL0&DL1&¯DL2&DL3 on each associated bit string BS, for example. The result of the logical operation 13a on each associated bit string BS is stored in the bit in the data storing area DL4 of that associated bit string BS.

In substep SS36, the write data restoration controller 29 sets data 1 back to data 0 in the data storing area DL0 in the bit included in each associated bit string BS found in substep SS35. To this end, the write data restoration controller 29 performs a logical operation 13b of formula ¯DL4&DL0 on each associated bit string BS, for example. The result of the logical operation 13b on each associated bit string BS is stored in the bit in the data storing area DL0 of that associated bit string BS.

The execution of substeps SS31 to SS36 restores the lower page write data in the data storing area DL0, and the upper page write data in the data storing area DL1.

FIG. 23 illustrates an example of the signals DQ (DQ0 to DQ7) flowing between the memory controller 120 and the selected storage medium 110t of the second embodiment. Specifically, FIG. 23 illustrates the signals DQ flowing in steps S1, S4, S5, and S7 of FIG. 7. As in the first embodiment, at first, the first write data, the write command, the suspend command, the UDL-read command, the UDL data, the LDL-read command, and the LDL data flow.

The memory controller 120 transmits the lower page read command to the selected storage medium 110t. Upon reception of the lower page read command, the selected storage medium 110t transmits the lower page data from the selected cell unit CU to the memory controller 120.

The memory controller 120 transmits the upper page read command to the selected storage medium 110t. Upon reception of the upper page read command, the selected storage medium 110t transmits the upper page data from the selected cell unit CU to the memory controller 120.

The memory controller 120 transmits the write resume command to the selected storage medium 110t.

Referring to FIGS. 24 to 27, transitions of states of associated bit strings BS during write data restoration will now be described. FIGS. 24 to 27 illustrate states of some associated bit strings BS during write data restoration in the memory system 1 of the second embodiment.

FIG. 24(a) illustrates states of associated bit strings BS reached in substep SS21. Prior to substep SS21, the UDL data and LDL data are stored in the data storing areas DL0 and DL1 in substeps SS1 and SS2, respectively.

In the lower page read process, sense amplifier circuits SAC for selected cell transistors MT with threshold voltages equal to or lower than the restoration read voltage VB have data 0 as a result of sensing. In contrast, sense amplifier circuits SAC for selected cell transistors MT with threshold voltages higher than the restoration read voltage VB have data 1 as a result of sensing. Based on the above results, the lower page data in the data storing area DL2 has data 0 in bits of target B or C-state selected cell transistors MT which have passed the verification. The lower page data has data 1 in bits of target Er or A-state selected cell transistors MT and target B-state selected cell transistors MT which have not passed the verification. The lower page data has data 0 or 1 in bits of target C-state selected cell transistors MT which have not passed the verification.

FIG. 24(b) illustrates states of associated bit strings BS reached in substep SS22. In the upper page read process, sense amplifier circuits SAC for selected cell transistors MT with threshold voltages equal to or lower than the restoration read voltage VA have data 0 as a result of sensing. In contrast, sense amplifier circuits SAC for selected cell transistors MT with threshold voltages higher than the restoration read voltage VA have data 1 as a result of sensing. Furthermore, sense amplifier circuits SAC for selected cell transistors MT with threshold voltages lower than or equal to the restoration read voltage VC have data 0 as a result of sensing. In contrast, sense amplifier circuits SAC for selected cell transistors MT with threshold voltages higher than the restoration read voltage VC have data 1 as a result of sensing. Based on the above results, the upper page data has data 0 in bits of target A or B-state selected cell transistors MT which have passed the verification. The upper page data has data 1 in bits of target Er-state selected cell transistor MT, target A-state selected cell transistor MT which have not passed the verification, and target C-state selected cell transistors MT which have passed the verification. The upper page data has data 0 or 1 in bits of target B or C-state selected cell transistors MT which have not passed the verification.

FIG. 25(a) illustrates states of associated bit strings BS reached in substep SS31. As a result of the logical operation 11a, the data storing area DL4 has data 1 in bits corresponding to selected cell transistors MT which satisfy the condition 1 (i.e., which have passed the A-state verification and have threshold voltages higher than the restoration read voltage VA and lower than or equal to the restoration read voltage VB), and has data 0 in bits corresponding to selected cell transistors MT which do not satisfy the condition 1.

Figure 25:
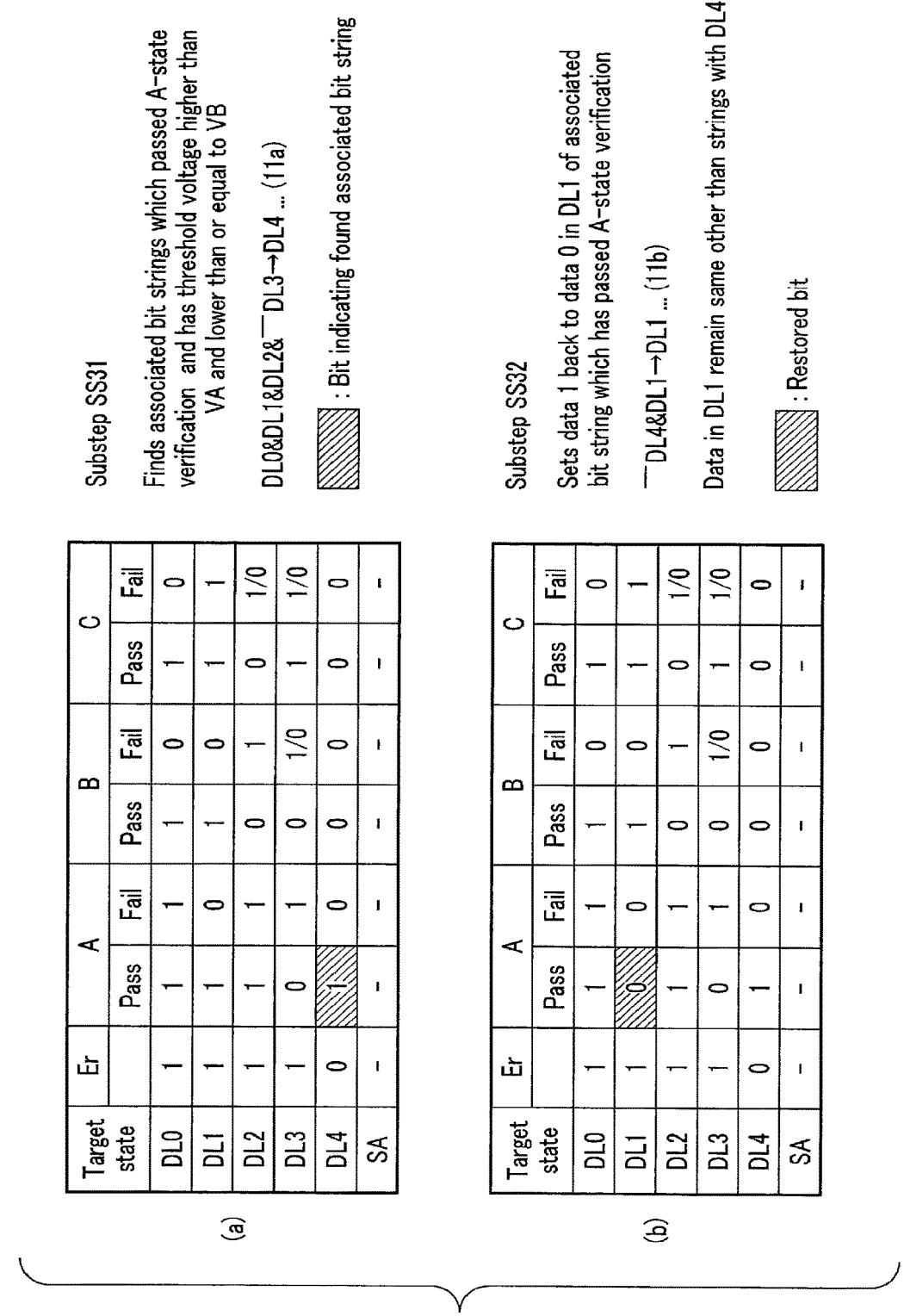
FIG. 25 illustrates states of some associated bit strings during the write data restoration in the memory system of the second embodiment.

FIG. 25(b) illustrates states of associated bit strings BS reached in substep SS32. As a result of the logical operation 11b, the data storing area DL1 has data 0 in bits corresponding to selected cell transistors MT which satisfy the condition 1. In contrast, the logical operation 11b does not affect data in the bits of the data storing area DL1 corresponding to the associated bit strings BS which have data 0 in the data storing area DL4. The step of section (b) of FIG. 25 restores data of the target A-state bits in the upper page write data.

FIG. 26(a) illustrates states of associated bit strings BS reached in substep SS33. As a result of the logical operation 12a, the data storing area DL4 has data 1 in bits corresponding to selected cell transistors MT which satisfy the condition 2, and data 0 in bits corresponding to selected cell transistors MT which do not satisfy the condition 2.

Figure 26:
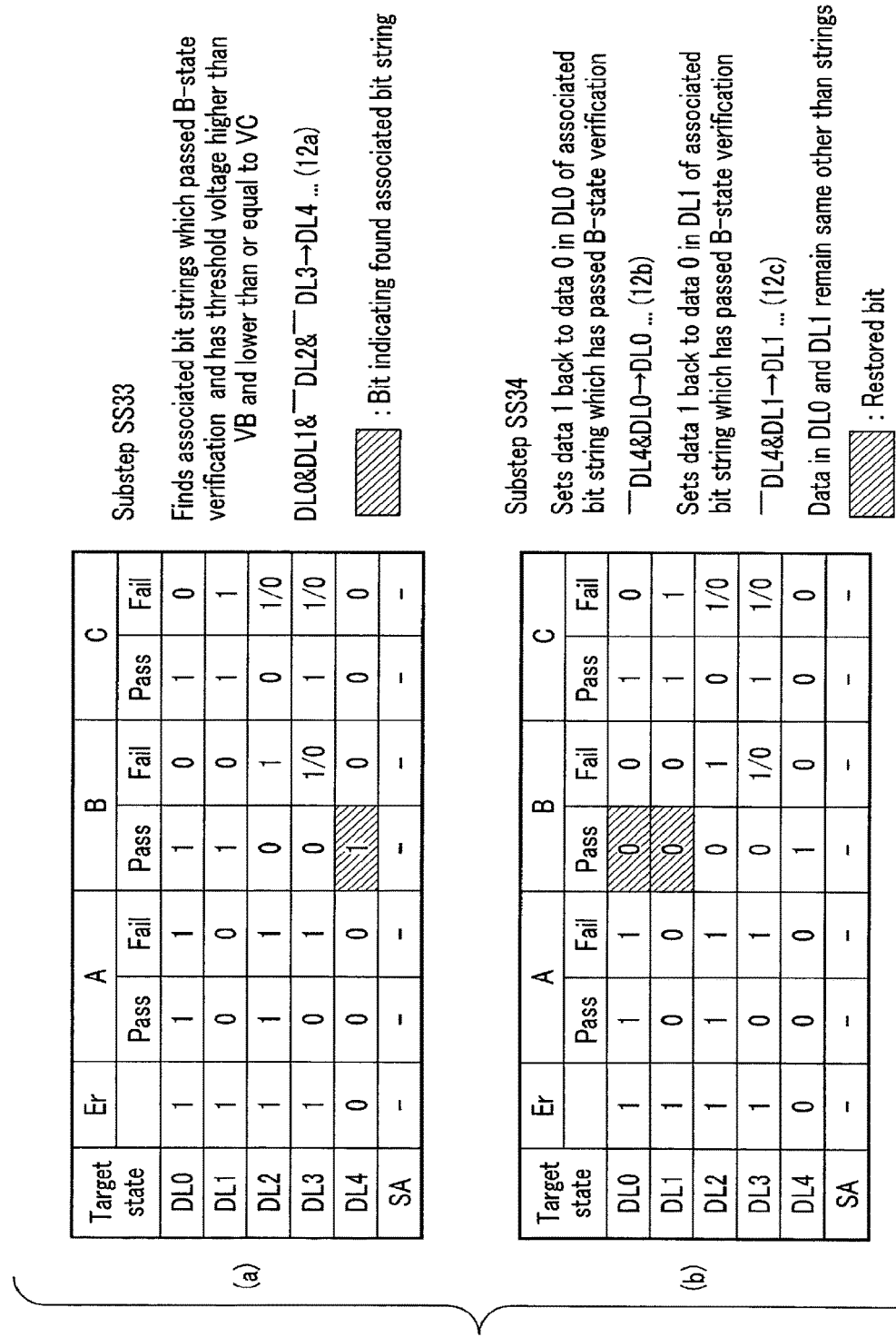
FIG. 26 illustrates states of some associated bit strings during the write data restoration in the memory system of the second embodiment.

FIG. 26(b) illustrates states of associated bit strings BS reached in substep SS34. As a result of the logical operation 12b, the data storing area DL0 has data 0 in bits corresponding to selected cell transistors MT which satisfy the condition 2. In contrast, the logical operation 12b does not affect data in the bits of the data storing area DL0 corresponding to the associated bit strings BS which have data 0 in the data storing area DL4. The step of section (b) of FIG. 26 restores data of the target B-state bits in the lower page write data.

Moreover, as a result of the logical operation 12c, the data storing area DL1 has data 0 in bits corresponding to selected cell transistors MT which satisfy the condition 2. In contrast, the logical operation 12c does not affect data in the bits of the data storing area DL1 corresponding to the associated bit strings BS which have data 0 in the data storing area DL4. The step of section (b) of FIG. 26 restores data of the target B-state bits in the upper page write data.

FIG. 27(a) illustrates states of associated bit strings BS reached in substep SS35. As a result of the logical operation 13a, the data storing area DL4 has data 1 in bits corresponding to selected cell transistors MT which satisfy the condition 3, and data 0 in bits corresponding to selected cell transistors MT which do not satisfy the condition 3.

FIG. 27(b) illustrates states of associated bit strings BS reached in substep SS36. As a result of the logical operation 13b, the data storing area DL0 has data 0 in bits corresponding to selected cell transistors MT which satisfy the condition 3. In contrast, the logical operation 13b does not affect data in the bits of the data storing area DL0 corresponding to the associated bit strings BS which have data 0 in the data storing area DL4. The step of section (b) of FIG. 27 restores data of the target C-state bits in the lower page write data.

Figure 28:
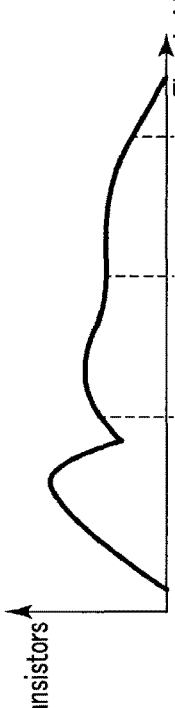
FIG. 28 illustrates states of some associated bit strings during the write data restoration in the memory system of the second embodiment.

FIG. 28 illustrates states of some associated bit strings BS during the write data restoration in the memory system 1 of the second embodiment, in a different form from FIGS. 24 to 27. Bits lined up vertically are those included in one associated bit string BS. The first to fifth and seventh to fifteenth rows of FIG. 28 are similar to the first to fifth and seventh to fifteenth rows of FIG. 21, respectively. FIG. 28 differs from FIG. 21 in the fourth, fifth, seventh, tenth, and thirteenth rows, and in the labels of the substeps.

The fourth row illustrates lower page data. The lower page data has data 1 in bits of selected cell transistors MT in the Er or A-state, and data 0 in bits of selected cell transistors MT in the B or C-state, regardless of target states.

The fifth row illustrates upper page data. The upper page data has data 1 in bits of selected cell transistors MT in the Er or C-state, and data 0 in bits of selected cell transistors MT in the A or B-state, regardless of target states.

The seventh row illustrates the result of the logical operation 11a. The result of the logical operation 11a has data 1 in bits of selected cell transistors MT that are targeted to and actually in the A-state as shaded with top-right to bottom-left diagonals, and data 0 in the other bits.

The eighth and ninth rows illustrate the result of the logical operation 11b. The logical operation 11b restores data 0 in bits of selected cell transistors MT that are targeted to and actually in the A-state in the data storing area DL1 as shaded with top-right to bottom-left diagonals, and maintains the values in the other bits.

The tenth row illustrates the result of the logical operation 12a. The result of the logical operation 12a has data 1 in bits of selected cell transistors MT that are targeted to and actually in the B-state as shaded with top-right to bottom-left diagonals, and data 0 in the other bits.

The eleventh and twelfth rows illustrate the results of the logical operations 12b and 12c, respectively. The logical operation 12b restores data 0 in bits of selected cell transistors MT that are targeted to and actually in the B-state in the data storing area DL0 as shaded with top-right to bottom-left diagonals, and maintains the values in the other bits. The logical operation 12c restores data 0 in bits of selected cell transistors MT that are targeted to and actually in the B-state in the data storing area DL1 as shaded with top-right to bottom-left diagonals, and maintains the values in the other bits.

The thirteenth row illustrates the result of the logical operation 13a. The result of the logical operation 13a has data 1 in bits of selected cell transistors MT that are targeted to and actually in the C-state, and data 0 in the other bits as shaded with top-right to bottom-left diagonals.

The fourteenth and fifteenth rows illustrate the result of the logical operation 13b. The logical operation 13b restores data 0 in bits of selected cell transistors MT that are targeted to and actually in the C-state in the data storing area DL0 as shaded with top-right to bottom-left diagonals, and maintains the values in the other bits. By the operations described above, the lower page write data and the upper page write data have been restored in the data storing area DL0 and DL1, respectively.

>2-3. Advantages>

The memory controller 120 of the second embodiment reads from the data latches UDL and LDL the modified write data which has lost the original write data in some bits, reads the lower and upper page data from the selected cell unit CU, and uses the modified write data and the lower and upper page data to restore the write data. The memory system 1 of the second embodiment can also produce the same advantages as the memory system 1 of the first embodiment.

Third Embodiment

The third embodiment differs from the first and second embodiments in the component in which a write data restoration controller 29 is provided. Aspects different from those of the first embodiment are mainly described in the following.

<3-1. Structure (Configuration)>

FIG. 29 illustrates functional blocks of a memory system 1 of the third embodiment. As illustrated in FIG. 29, the memory controller 120 does not have the functions of the write data restoration controller 29.

The memory system 1 has plural memory interface circuits 31. Each memory interface circuit 31 can be in a form of a chip separate from the memory controller 120, for example. Each memory interface circuit 31 includes a ROM, a RAM, and a CPU, and performs various functions when the firmware on the ROM is loaded onto the RAM and executed by the CPU, for example.

Each memory interface circuit 31 includes a dedicated write data restoration controller 29. The write data restoration controller 29 may be implemented by the firmware executed by the CPU on the RAM as in the first embodiment, for example. Each memory interface circuit 31 is coupled to plural storage media 110 (e.g. plural NAND flash memory chips) via the NAND buses. Each memory interface circuit 31 accesses one storage medium 110 selected in accordance with instructions from a NAND controller 26.

Each memory interface circuit 31 and the storage media 110 coupled to that memory interface circuit 31 may be provided in one package 140.

The host device 2 requests to the memory system 1 to perform write, read, erase processes, etc. designating a target logical address. A physical address including the data to be accessed is obtained by the translation layer controller 27 from the logical address. The command dispatcher 28 instructs a selected NAND controller 26t including the obtained physical address to perform operations based on the request from the host device 2. Upon reception of the instruction, the selected NAND controller 26t instructs a memory interface circuit 31 coupled thereto (selected memory interface circuit 31t) to transmit command, which includes the physical address to be accessed, to a selected storage medium 110t. The write data restoration controller 29 operates as in the first or second embodiment.

<3-2. Operations>

Assume that while the first write data originating from the first write requested data is being written in a particular cell unit CU of a particular selected storage medium 110t, the memory controller 120 receives a read request of the first read requested data which leads to a read process from that cell unit CU. Based on such reception of request, the write data restoration controller 29 of the selected memory interface circuit 31t transmits to the selected storage medium 110t a command instructing suspension of the process in progress, i.e., the write process of the first write data. The selected memory interface circuit 31t then performs the write data restoration described in the first or second embodiment. Similar signals as those illustrated in FIG. 15 or 23 flow between the selected memory interface circuit 31t and the selected storage medium 110t from the timing of the transmission of the write command for the first write data through the restoration of the first write data to the timing of the transmission of the command for resuming the write process of first write data.

<3-3. Advantages>

According to the memory system 1 of the third embodiment, the write data restoration controllers 29 are respectively provided in the memory interface circuits 31 separate from the memory controller 120, and the write data restoration controllers 29 restore write data as in the first or second embodiment. This can produce the same advantages as the first or second embodiment also in the configuration of the write data restoration controllers 29 separate from the memory controller 120. Moreover, the third embodiment does not require data to be transmitted to the memory controller 120 from the storage media 110 for the write data restoration. This can reduce communications occurring between the storage media 110 and the memory controller 120 for the write data restoration.

Fourth Embodiment

The fourth embodiment differs from the first and second embodiments in the component in which a write data restoration controller 29 is provided. Aspects different from those of the first embodiment are mainly described in the following.

<4-1. Structure (Configuration)>

FIG. 30 illustrates functional blocks of a memory system 1 of the fourth embodiment. As illustrated in FIG. 30, the memory controller 120 does not have the functions of the write data restoration controller 29. Instead, one or more storage media 110 include the functions of the write data restoration controller 29. Specifically, as illustrated in FIG. 31, the sequencer 13 in the storage medium 110 includes the functions of the write data restoration controller 29b. The write data restoration controller 29b basically operates similarly to the write data restoration controller 29, but differs from the write data restoration controller 29 in some respects based on being provided in the storage medium 110.

The sense amplifier 16 and the data latch set 18 of the fourth embodiment have components and connections as illustrated in FIG. 32. As illustrated in FIG. 32, the data latch set 18 includes data latches ADL, BDL, CDL, DDL, and EDL as well as the data latches XDL, UDL, and LDL.

Each of the data latches ADL, BDL, CDL, DDL, and EDL includes as many data latch circuits DLC as the bits in one page, and hence can store data of the size of one page. For each cases of γ=A, B, C, D, and E, a data latch circuit DLC of data latch γDL may be referred to as a data latch circuit γDLC.

The data latches ADL, BDL, CDL, and DDL store data similar to data stored in the data storing areas DL0, DL1, DL2, and DL3 in the first or second embodiment upon the logical operations for the write data restoration, respectively. The data latch EDL stores data similar to the data stored in the data storing area DL4 or DL5 in the first or second embodiment upon the logical operations for the write data restoration.

The data latch circuits XDLC, LDLC, UDLC, ADLC, BDLC, CDLC, DDLC and EDLC and a sense amplifier circuit SAC which handle a bit of the same position in one-page size data are associated with each other. An associated bit string BS includes a set of bits in the data latch circuits XDLC, LDLC, UDLC, ADLC, BDLC, CDLC, DDLC, EDLC and the sense amplifier circuit SAC which are associated with each other.

4-2. Operations>

Assume that while the first write data is being written in a particular cell unit CU of a particular selected storage medium 110t, the memory controller 120 receives a read command which specifies the lower or upper page which has a memory space provided by the particular cell unit CU. Based on the reception of such a command, the write data restoration controller 29b of the selected storage medium 110t suspends the write process of the first write data in progress. The write data restoration controller 29b then restores the first write data as in the first or second embodiment.

The restoration of the write data is carried out in the same way as the first or second embodiment except for being performed in the selected storage medium 110t. Specifically, the data, which are stored in the data storing areas DL0, DL1, DL2, DL3, and DL5 in the first embodiment, are stored in the data latches ADL, BDL, CDL, DDL, and EDL respectively by the control of the write data restoration controller 29b, in the fourth embodiment. The write data restoration controller 29b then uses the data in the data latches ADL, BDL, CDL, DDL, and EDL to perform the logical operations 1a, 1b, 2a, 2b, 2c, 3a, and 3b. This results in the lower and upper page write data being obtained in the data latches UDL and LDL, respectively.

The selected storage medium 110t transmits to the memory controller 120 either one of the lower and upper page write data specified by the read command.

No data latch for storing intermediate data is provided, which is provided as the data storing area DL4 in the first embodiment. Without any intermediate data having to be stored in the data storing area DL4, the logical operations 1a and 1b are performed to each associated bit string BS, and the result is stored in the data latch BDL. This is also true for the set of the logical operations 2a, 2b, and 2c, and the set of the logical operations 3a and 3b. This can reduce the number of data latches in the storage medium 110. Instead, a data latch corresponding to the data storing area DL4 may be provided in a storage medium 110.

Similarly, the data, which are stored in the data storing areas DL0, DL1, DL2, DL3, and DL4 in the second embodiment, are stored in the data latches ADL, BDL, CDL, DDL, and EDL respectively by the control of the write data restoration controller 29b in the fourth embodiment. The write data restoration controller 29b uses the data in the data latches ADL, BDL, CDL, DDL, and EDL to perform the logical operations 11a, 11b, 12a, 12b, 12c, 13a, and 13b. This results in the lower and upper page write data being obtained in the data latches UDL and LDL, respectively.

<4-3. Advantages>

According to the memory system 1 of the fourth embodiment, the write data restoration controllers 29b are respectively provided in one or more storage media 110, and the write data restoration controllers 29b restore write data as in the first or second embodiment. This allows the fourth embodiment to produce the same advantages as the first or second embodiment, when it is acceptable that one or more data latches for write data restoration are provided in a storage medium 110. Moreover, the fourth embodiment does not require data to be transmitted to the memory controller 120 from the storage media 110 for the write data restoration. This can reduce communications occurring between the storage medium 110 and the memory controller 120 for the write data restoration.

Fifth Embodiment

The fifth embodiment also relates to an example of the write data restoration controllers 29 provided in the storage media 110 as in the fourth embodiment.

<5-1. Structure (Configuration)>

The memory system 1 of the fifth embodiment has the same components and connections as the memory system 1 of the fourth embodiment. But, in contrast, in the fifth embodiment, the data latch set 18 has the same components and connections as the first embodiment as opposed to the fourth embodiment. Specifically, the data latch set 18 includes the data latches XDL, LDL, and UDL, and does not include the data latch ADL, BDL, CDL, DDL, or EDL.

<5-2. Operations>

Assume that while the first write data is being written in a particular cell unit CU of a particular selected storage medium 110*t*, the memory controller 120 receives a read command which specifies the lower or upper page which has a memory space provided by the particular cell unit CU. Based on the reception of such a command, the write data restoration controller 29*b* of the selected storage medium 110*t* (i.e., a selected write data restoration controller 29*bt*), suspends the write process of the first write data in progress. The selected write data restoration controller 29*bt* then restores the first write data as in the first or second embodiment. Each write data restoration controller 29*b* restores only one page of write data being written in the selected cell unit CU.

FIGS. 33 to 36 illustrate states of some associated bit strings BS during the write data restoration in the memory system 1 of the fifth embodiment. FIGS. 33 and 34 illustrate restoration of lower page write data, and FIGS. 35 and 36 illustrate restoration of upper page write data.

As illustrated in section (a) of FIG. 33, the selected write data restoration controller 29*bt* performs a logical operation UDL&LDL on each associated bit string BS, and stores the result in the bit in the data latch XDL of that associated bit string BS. The data in the data latch XDL has data 1 in bits corresponding to selected cell transistors MT which have passed the verification, and data in the other bits. As illustrated in section (b) of FIG. 33, the selected write data restoration controller 29*bt* performs the B-read process. By the B-read process, each sense amplifier circuit SAC comes to store data 0 or 1 according to the threshold voltage of the corresponding selected cell transistor MT.

As illustrated in section (a) of FIG. 34, the selected write data restoration controller 29*bt* performs a logical operation SA&XDL on each associated bit string BS, and stores the result in the bit in the data latch XDL of that associated bit string BS. The data in the data latch XDL has data 1 only in bits corresponding to target B or C-state selected cell transistors MT which have passed the verification. A bit with data 1 indicates an associated bit string BS including the bit in the data in the data latch UDL which should be set back to data 0.

As illustrated in section (b) of FIG. 34, the selected write data restoration controller 29*bt* performs a logical operation ⁻XDL&UDL on each associated bit string BS, and stores the result in the bit in the data latch XDL of that associated bit string BS. Only in associated bit BS strings including the bit with data 1 in the data latch XDL upon the start of the operation, data 1 of the bit in the data latch XDL is set back to data 0. The data in the data latch XDL obtained in this way is the lower page write data. The lower page write data is transmitted to the memory controller 120 from the data latch XDL.

Section (a) of FIG. 35 is the same as section (a) of FIG. 33. The selected write data restoration controller 29*bt* performs a logical operation UDL&LDL on each associated bit string BS, and stores the result in the bit in the data latch XDL of that bit string BS. As illustrated in section (b) of FIG. 35, the selected write data restoration controller 29*bt* performs the A-read process. By the A-read process, each sense amplifier circuit SAC comes to store data 0 or 1 according to the threshold voltage of the corresponding selected cell transistor MT.

As illustrated in section (c) of FIG. 35, the selected write data restoration controller 29*bt* performs a logical operation SA&XDL on each associated bit string BS, and stores the result in the bit in the data latch XDL of that associated bit string BS. The data in the data latch XDL has data 1 only in bits corresponding to target A, B, or C-state selected cell transistors MT which have passed the verification.

As illustrated in section (a) of FIG. 36, the selected write data restoration controller 29*bt* performs the C-read process. By the C-read process, each sense amplifier circuit SAC comes to store data 0 or 1 according to the threshold voltage of the corresponding selected cell transistor MT.

As illustrated in section (b) of FIG. 36, the selected write data restoration controller 29*bt* performs a logical operation ⁻SA&XDL on each associated bit string BS, and stores the result in the bit in the data latch XDL of that associated bit string BS. The data in the data latch XDL has data 1 only in bits corresponding to target A or B-state selected cell transistors MT which have passed the verification. A bit with data 1 indicates an associated bit string BS including the bit in the data in the data latch LDL which should be set back to data 0.

As illustrated in section (c) of FIG. 36, the selected write data restoration controller 29*bt* performs a logical operation ⁻XDL&LDL on each associated bit string BS, and stores the result in the bit in the data latch XDL of that associated bit string BS. Only in associated bit strings BS including the bit with data 1 in the data latch XDL upon the start of the operation, data 1 of the bit in the data latch XDL is set back to data 0. The data in the data latch XDL obtained in this way is the upper page write data. The upper page write data is transmitted to the memory controller 120 from the data latch XDL.

<5-3. Advantages>

According to the memory system 1 of the fifth embodiment, the write data restoration controllers 29 are respectively provided in one or more storage media 110, and the write data restoration controller 29 restores write data as in the first or second embodiment. This can produce the same advantages as the first or second embodiment. Moreover, the fifth embodiment restores, in response to a read command to one of pages of a selected cell unit CU being written in, only write data in the read-target page. This allows the fifth embodiment to require no extra data latches to be provided for the write data restoration in the storage media 110.

Sixth Embodiment

The sixth embodiment relates to restoration of state upon recovery of power voltage supply after sudden interruption of the power voltage supply to the memory system 1. Aspects different from those of the first embodiment are mainly described in the following.

<6-1. Structure (Configuration)>

Figure 37:
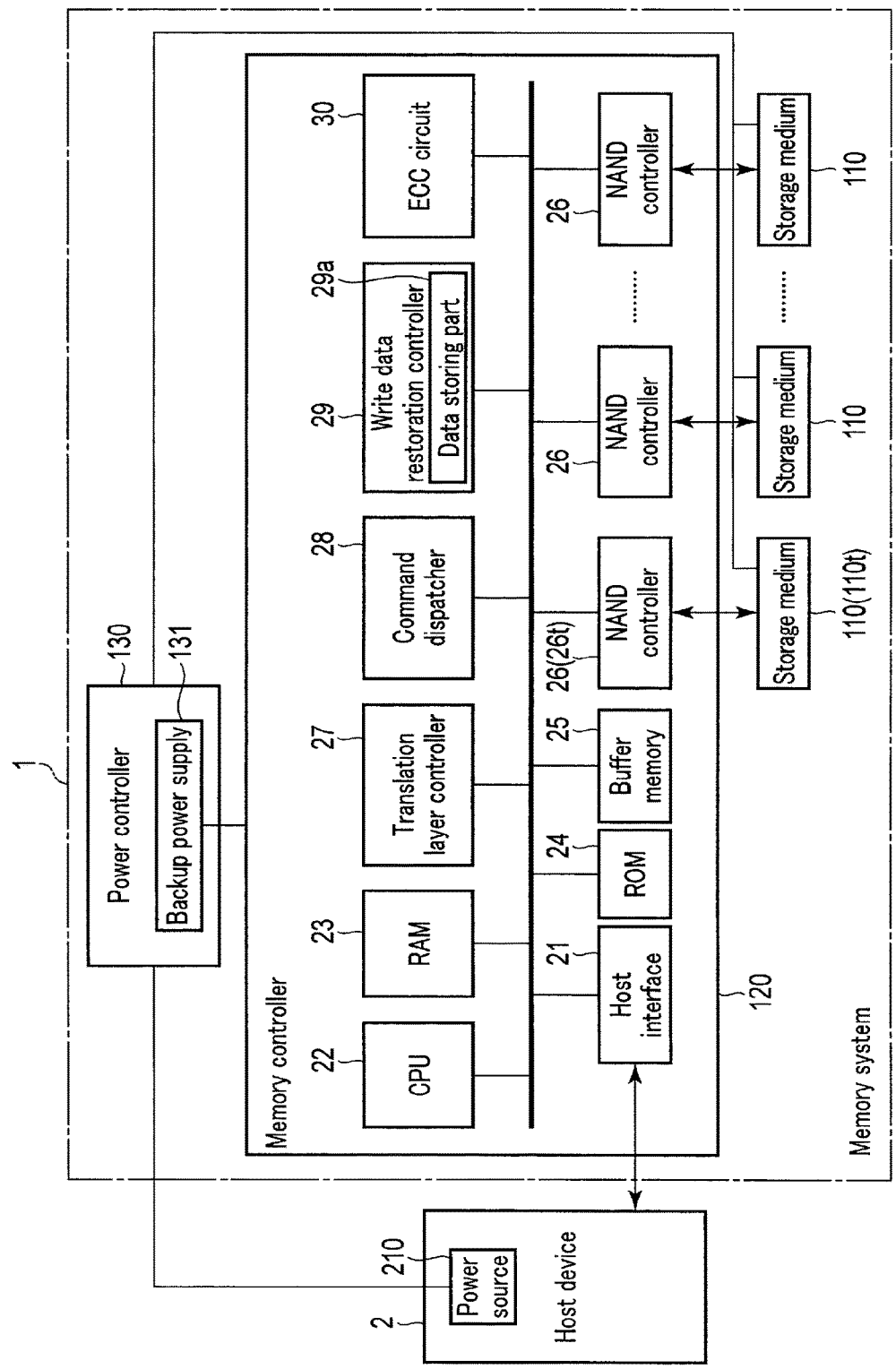
FIG. 37 illustrates functional blocks of a memory system of a sixth embodiment.

FIG. 37 illustrates functional blocks of a memory system 1 of the sixth embodiment. The memory system 1 further includes a power controller 130. The power controller 130 receives a power voltage from the power source 210, includes a backup power supply 131, and supplies the power voltage from the power source 210 or the backup power supply 131 to the memory controller 120 and the storage media 110. The backup power supply 131 includes a battery and/or a capacitor.

The memory controller 120 of the sixth embodiment is configured to perform operations described in the following, and specifically, the firmware in the ROM 24 is configured to cause the memory controller 120 to perform the operations described in the following.

<6-2. Operations>

Figure 38:
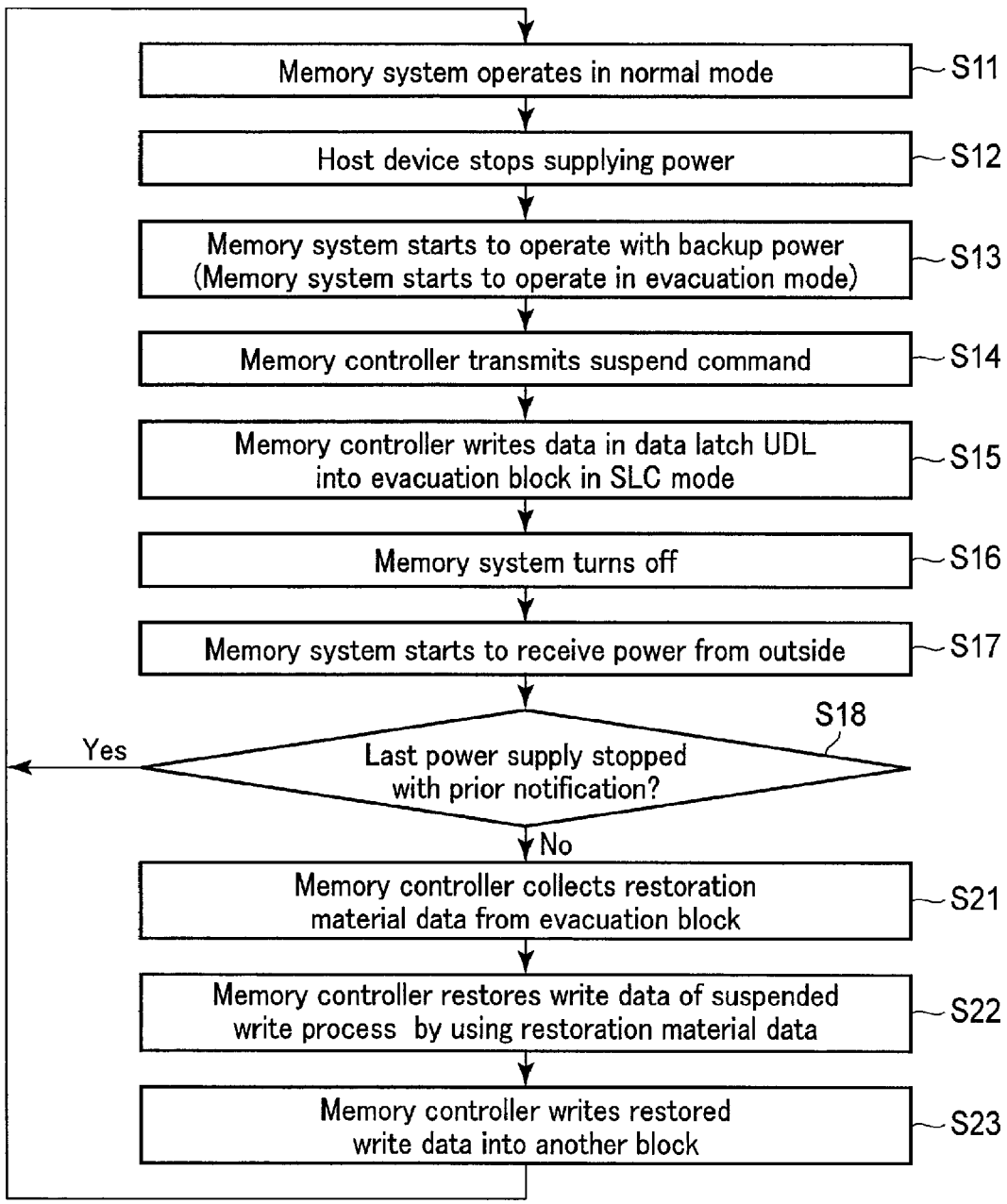
FIG. 38 illustrates the flow of an overall operation of the memory system of the sixth embodiment.

FIG. 38 illustrates a flow of overall operation of the memory system of the sixth embodiment. Some steps in the flow will be described in full detail later. As illustrated in FIG. 38, the memory system 1 operates in a normal mode (step S11). In the normal mode, the memory system 1 is in a normal state. A "normal" state as used herein refers to a state in which the memory system 1 receives a power voltage from outside of the memory system 1 (for example, from the host device 2). In the normal mode, the memory system 1 performs various operations in accordance with instructions from the host device 2.

The host device 2 stops the power voltage supply to the memory system 1 (step S12). The stop of the power voltage supply may be performed, for example, by a user of the host device 2 as described above, and may be performed without particular notification.

The power controller 130 monitors whether the power voltage is being supplied from the host device 2, and detects the stop of the power voltage supply when it happens. Upon detecting of the stop of the power voltage supply from the host device 2, the power controller 130 starts to supply a power voltage to the memory controller 120 and the storage media 110 from the backup power supply 131 instead from the outside (step S13). This allows the memory system 1 to start to operate with the power voltage from the backup power supply 131. The memory controller 120 operates in an evacuation mode while operating with the power voltage from the backup power supply 131.

The memory controller 120 transmits a suspend command to one or more selected storage media 110t which are writing data (step S14). Upon reception of the suspend command, the selected storage medium 110t suspends the write process in progress. The memory controller 120 writes (backs up) the data stored in data latches UDL and LDL (respectively, modified lower write data and modified upper write data) of each selected storage medium 110t into two different cell units CU of that selected storage medium 110t, respectively (Step S15). The modified lower and upper write data are written with a write method that stores one bit per cell transistor MT (an SLC mode) instead of two or more bits per cell transistor MT (an MLC mode), which is the case of FIG. 5. A cell unit CU which has the SLC write process performed stores data of one-page size.

The SLC write process brings a write-target cell transistor MT to a P-state, which is the only one state aside from the Er-state as illustrated in FIG. 5. The Er and P-states are treated as states of storing data 1 and data 0, respectively, for example.

The memory controller 120 allocates as many as or more than a particular number of erased-state blocks BLK, in order to prepare for write processes in the evacuation mode. Specifically, in the normal mode, the memory controller 120 does not consume an erased-state block BLK until equal to or more than the particular number of erased-state blocks BLK are provided.

In the evacuation mode, the memory controller 120 writes write data stored in the buffer memory 25 in the memory controller 120 for which the memory controller 120 has already notified the host device 2 that write process in storage media 110 has completed, as well as the modified write data, for example.

When a time for which the backup power supply 131 can supply the power voltage ends, the memory system 1 turns off (step S16). The write in cell units CU which had the write suspended (i.e., write suspended cell units), remain in states at the write suspension.

The memory system 1 starts to receive a power voltage from outside, such as the power source 210, and boots up (step S17). The memory controller 120 then determines whether the last stop of the power voltage supply from outside the memory system 1 occurred without prior notification from the host device 2 (step S18). The stop of the power voltage supply occurs, for example, by a user of the host device 2, and may be performed without a particular prior notification. Therefore, the stop of the power voltage supply to the memory system 1 from the host device 2 may also not be notified. The memory controller 120 stores information indicative of whether prior notification was received in a block BLK of one of the storage media 110 upon the stop of the power voltage supply from outside. The memory controller 120 acquires the information about the presence or absence of this prior notification in step S18.

When the last power voltage supply was stopped after the prior notification (Yes branch of step S18), the flow goes to step S11. Without prior notification (No branch of step S18), the flow goes to step S21. In step S21, the memory controller 120 reads modified lower and upper page write data. These modified write data are restoration material data.

In step S22, the memory controller 120 uses the restoration material data to restore the lower and upper page write data.

In step S23, the memory controller 120 writes the restored lower and upper page write data into the lower and upper pages of one erased-state cell unit CU of a selected storage medium 110t in the MLC mode, for example. Instead, the restored lower and upper page write data may be written into two different cell units CU in the SLC mode.

When step S11 is reached via steps S21 to S23, after step S17, the memory controller 120 does not perform normal operations based on instructions from the host device 2 until step S11 is reached.

Referring to FIGS. 39 to 41, writing modified write data to a block BLK and restoring write data will now be further described. FIGS. 39 and 40 illustrate transferring data during writing modified write data and restoring write data in the memory system 1 of the sixth embodiment. FIG. 40 illustrates the state subsequent to FIG. 39. Instead, the operation of FIG. 40 may be performed after the operation of FIG. 39.

As illustrated in FIG. 39, the memory controller 120 transmits to a selected storage medium 110t a command to instruct writing data in the data latch UDL into a particular selected cell unit CU1 in the SLC mode. The selected cell unit CU1 is included in an erased-state block BLK reserved for the write in the evacuation mode. Upon reception of the command, the selected storage medium 110t transfers the data in the data latch UDL (i.e., modified lower page write data) to the data latch XDL, and writes the data in the data latch XDL into the selected cell unit CU1 via the sense amplifier SA. As described above, this write process is performed in the SLC mode. As a result, each written selected cell transistor MT in the selected cell unit CU1 stores corresponding one-bit data of the modified lower page write data.

In the SLC write process, when each selected cell transistor MT passes the verification, the corresponding bit in the data latch XDL results in storing data 1. In the SLC write process in the evacuation mode, the verification may be omitted, and instead a high program voltage Vpgm may be applied, and only one program loop may be performed for the write process, in order to complete the write process in a short time. The data in the data latch UDL is not lost in the single level write.

As illustrated in FIG. 40, the memory controller 120 transmits to the selected storage medium 110t a command to instruct to write data stored in the data latch LDL into a particular selected cell unit CU2 in the SLC mode. The selected cell unit CU2 is included in an erased-state block BLK reserved for the write in the evacuation mode. Upon reception of the command, the selected storage medium 110t transfers the data in the data latch LDL (i.e., modified upper page write data) to the data latch XDL, and writes the data in the data latch XDL into the selected cell unit CU2 via the sense amplifier SA. As described above, this write process is performed in the SLC mode. As a result, each written selected cell transistor MT in the selected cell unit CU2 stores corresponding one-bit data of the modified upper page write data.

FIGS. 41 and 42 illustrate states of the data storing part 29a during the write data restoration in the memory system 1 of the sixth embodiment. FIGS. 41 and 42 illustrate cases where the sixth embodiment is applied to the first and second embodiments, respectively. As illustrated in FIGS. 41 and 42, the memory controller 120 respectively reads modified lower and upper page write data from the data latches UDL and LDL of the selected storage medium 110t for restoring write data. The memory controller 120 then stores the modified lower and upper page write data into the data storing areas DL0 and DL1, respectively. The data input and logical operations thereafter are the same as those in the first or second embodiment.

<6-3. Advantages>

The backup power supply 131 has a finite capacity, and can supply a power voltage to the memory controller 120 and the storage media 110 only for a finite time. This requires the evacuation write process to be completed in the finite time. The write process in progress upon the transition to the evacuation mode may be continued until it is completed by using the backup power supply 131; however, the operation in the evacuation mode is desired to be completed as quickly as possible in order to reduce the capacity of the backup power supply 131. To this end, there is room for improving the write process in the evacuation mode.

The memory controller 120 of the sixth embodiment writes modified write data in a cell unit CU in the SLC mode during the evacuation mode. Upon start of receiving a power from the outside, the memory controller 120 reads the modified write data, reads premature data from a write-suspended cell unit CU, restores original write data using the read premature data and the modified write data, and writes the restored the original write data in another cell unit CU. This eliminates the necessity for the write process in progress to be completed upon the transition to the evacuation mode. Instead, the modified write data needs to be written into a cell unit CU; however, the SLC write process is completed shorter than the MLC write process. The write process of the modified write data in the SLC mode may be completed in a time shorter than a time to complete the write process of the write data in progress. Therefore, a time to complete the write process in the evacuation mode can be reduced.

<6-4. Modifications>

Figure 43:
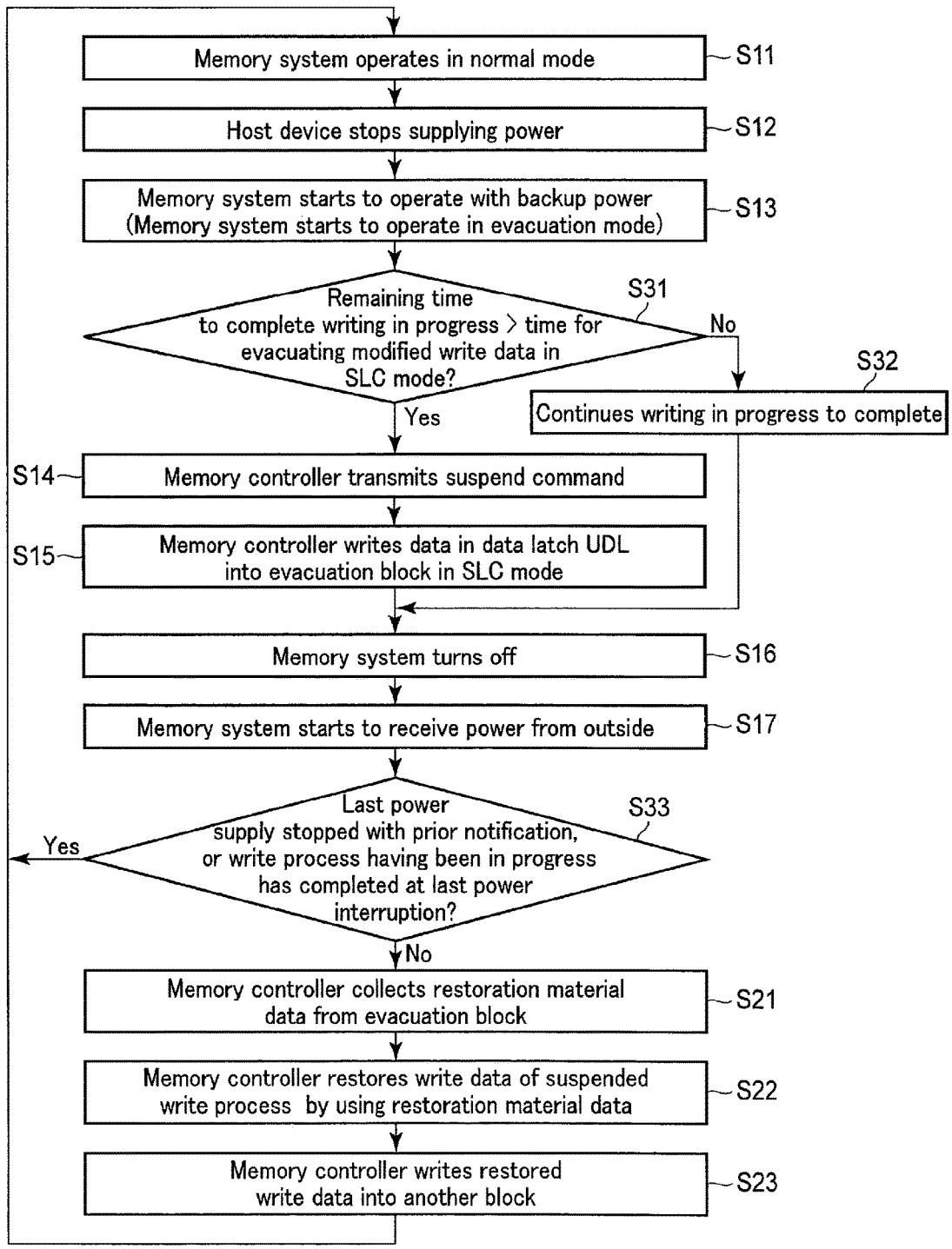
FIG. 43 illustrates the flow of an overall operation of a memory system of a modified sixth embodiment.

FIG. 43 illustrates the flow of an overall operation of a memory system 1 of a modified sixth embodiment. Step S13 proceeds to step S31. In step S31, the memory controller 120 determines whether a time expected to complete the write process in progress is longer than a time expected to perform step S15 (i.e., writing the modified write data to the cell unit CU in the SLC mode). The number of program loops to complete a write process to a particular cell unit CU can be estimated in advance based on the performance of the storage medium 110. The memory controller 120 may keep track of an elapsed time from the beginning of the current busy state of the selected storage medium 110t. The memory controller 120 can then calculate a time to complete the current write process from the time necessary for the write process and the elapsed time. Similarly, a time for the SLC write process of modified write data to a cell unit CU can also be estimated in advance based on the performance of the storage medium 110.

When the time to complete the write process in progress is longer than the time for the write process of the modified write data to the cell unit CU in the SLC mode (Yes branch of step S31), the flow goes to step S14, and otherwise (No branch), the flow goes to step S32. In step S32, the memory controller 120 waits until the write process in progress is completed. Step S32 proceeds to step S16.

Step S17 proceeds to step S33. In Step S33, the memory controller 120 determines whether at least one of a first condition that the last stop of the power voltage supply from outside the memory system 1 occurred without prior notification from the host device 2 and a second condition that the write process having been in progress has completed at last power interruption is satisfied (step S33). When at least one of the first and second conditions is satisfied, the flow goes back to step S11. In contrast, neither the first condition nor the second condition is satisfied, the flow goes to step S21.

According to the modification, the write in progress is continued until completed when a time to complete the write process in progress is shorter, because most part of the write process in progress is completed, than a time for an SLC write process of modified data to a cell unit CU. This allows the write process in the evacuation mode to be completed in a reduced time by selecting writing modes in accordance with cases.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A memory system comprising:
a storage medium including a first cell transistor, a first data latch, and a second data latch; and
a first controller configured to instruct to the storage medium to, after instructing the storage medium to write data into the first cell transistor and before completion of the writing of the data into the first cell transistor,
suspend a process being performed to the first cell transistor,
read data from the first data latch to the first controller based on the process being suspended,
read data from the second data latch to the first controller based on the process being suspended, and
read data from the first cell transistor.

2. The system according to claim 1, wherein:
the reading of the data from the first cell transistor includes:
reading data from the first cell transistor with a first voltage,
reading data from the first cell transistor with a second voltage, and
reading data from the first cell transistor with a third voltage,
the first to third voltages being different from each other.

3. The system according to claim 2, wherein:
the first controller is further configured to:
determine that the first cell transistor has been written into a first state when the first cell transistor has a threshold voltage higher than a first verification voltage,
determine that the first cell transistor has been written into a second state when the first cell transistor has a threshold voltage higher than a second verification voltage,
determine that the first cell transistor has been written into a third state when the first cell transistor has a threshold voltage higher than a third verification voltage, and
use a first read voltage, a second read voltage, and a third read voltage for reading data from the first cell transistor, wherein,
the first voltage is higher than the first read voltage and lower than the first verification voltage,
the second voltage is higher than the second read voltage and lower than the second verification voltage, and
the third voltage is higher than the third read voltage and lower than the third verification voltage.

4. The system according to claim 1, wherein:
the storage medium is configured to store data of a first bit and data of a second bit in the first cell transistor.

5. The system of according to claim 4, wherein:
the reading of the data from the first cell transistor includes reading the data of the first bit from the first cell transistor, and reading the data of the second bit from the first cell transistor.

6. The system according to claim 5, wherein:
the storage medium is further configured to store first write data in the first data latch and second write data in the second data latch,
the data read from the first data latch differs from the first data, and
the data read from the second data latch differs from the second data.

7. The system according to claim 1, wherein:
the first controller includes a memory, and
the first controller is further configured to:
receive, from outside of the first controller, first data and a first request to store the first data, and
release, after the first request is received and before completion of the storing of the first data in the storage medium, an area of the memory storing the first data.

8. The system according to claim 1, wherein:
the first controller is further configured to instruct the storage medium to resume the suspended process after the instructing of the writing of the data into the first cell transistor before completion of the writing of the data into the first cell transistor.

9. The system according to claim 1, wherein:
the first controller is further configured to be coupled to a host device and the storage medium.

10. The system according to claim 1, further comprising:
a second controller configured to be coupled to a host device and the first controller, wherein,
the first controller is coupled to the storage medium.

11. The system according to claim 10, further comprising:
a package including the first controller and the storage medium.

12. The system according to claim 1, wherein:
the first controller is further configured to perform a logical operation on the data in the first data latch and the data in the second data latch to generate data to be written into the first cell transistor, and transmit the generated data to outside of the first controller.

13. A memory system comprising:
a storage medium including a first cell transistor, a first data latch, a second data latch, and a first controller; and
a second controller, wherein
the first controller is configured to:
receive from the second controller an instruction of writing first data into the first cell transistor,
receive from the second controller an instruction of reading the first data from the first cell transistor before completion of the writing of the first data,
transmit data to be written into the first cell transistor to the second controller.

14. The system according to claim 13, wherein:
the first controller is further configured to perform a logical operation on data in the first data latch and data in the second data latch to generate the data to be written into the first cell transistor, and transmit the generated data to the second controller.

15. A memory system comprising:
a storage medium including a first cell transistor, a second cell transistor, a third cell transistor, a first data latch, and a second data latch;
a backup power source; and
a controller configured to instruct the storage medium to write first write data into the first cell transistor, wherein the backup power source is configured to supply a backup power voltage to the storage medium and the controller upon detecting a stop of a power supply voltage from outside,
the controller is further configured to
suspend a process of accessing the storage medium in progress after the instruction of the writing of the first write data,
write second data in the first data latch into the second cell transistor in response to the suspension of the process,
write third data in the second data latch into the third cell transistor in response to the suspension of the process.

16. The system according to claim 15, wherein:
the storage medium further includes a fourth cell transistor, and
the controller is further configured to instruct to the storage medium to:
read the second data and the third data from the second cell transistor and the third cell transistor respectively after start of supply of the power supply voltage to the memory system from the outside of the memory system, and
write the first write data into the fourth cell transistor.

17. The system of claim 15, wherein:
the controller is further configured not to resume the suspended process before a stopping of the supply of the backup power voltage from the backup power source.

* * * * *